United States Patent
Tran et al.

(10) Patent No.: US 11,978,491 B2
(45) Date of Patent: *May 7, 2024

(54) MIXED CURRENT-FORCED READ SCHEME FOR MRAM ARRAY WITH SELECTOR

(71) Applicant: SanDisk Technologies LLC, Addison, TX (US)

(72) Inventors: Michael Nicolas Albert Tran, San Jose, CA (US); Ward Parkinson, Boise, ID (US); Michael Grobis, Campbell, CA (US); Nathan Franklin, Belmont, CA (US); Raj Ramanujan, Federal Way, WA (US)

(73) Assignee: SanDisk Technologies LLC, Austin, TX (US)

( * ) Notice: Subject to any disclaimer, the term of this patent is extended or adjusted under 35 U.S.C. 154(b) by 294 days.

This patent is subject to a terminal disclaimer.

(21) Appl. No.: 17/485,129

(22) Filed: Sep. 24, 2021

(65) Prior Publication Data

US 2023/0100600 A1 Mar. 30, 2023

(51) Int. Cl.
*G11C 11/16* (2006.01)
*G06F 11/10* (2006.01)
*H01L 25/065* (2023.01)
*H10B 61/00* (2023.01)

(52) U.S. Cl.
CPC ...... *G11C 11/1673* (2013.01); *G06F 11/1068* (2013.01); *G11C 11/161* (2013.01); *G11C 11/1659* (2013.01); *H10B 61/10* (2023.02); *H01L 25/0657* (2013.01); *H01L 2225/06562* (2013.01)

(58) Field of Classification Search
None
See application file for complete search history.

(56) References Cited

U.S. PATENT DOCUMENTS

| 6,269,018 B1 | 7/2001 | Monsma et al. |
| 6,885,577 B2 | 4/2005 | Tang et al. |
| 7,272,034 B1 | 9/2007 | Chen et al. |

(Continued)

FOREIGN PATENT DOCUMENTS

| EP | 1841074 A2 | 10/2007 |
| KR | 20150115901 A | 10/2015 |

(Continued)

OTHER PUBLICATIONS

U.S. Appl. No. 17/552,143, filed Dec. 15, 2021.

(Continued)

*Primary Examiner* — Daniel F. McMahon
(74) *Attorney, Agent, or Firm* — Vierra Magen Marcus LLP

(57) ABSTRACT

Technology for reading reversible resistivity cells in a memory array when using a current-force read is disclosed. The memory cells are first read using a current-force referenced read. If the current-force referenced read is successful, then results of the current-force referenced read are returned. If the current-force referenced read is unsuccessful, then a current-force self-referenced read (SRR) is performed and results of the current-force SRR are returned. In an aspect this mixed current-force read is used for MRAM cells, which are especially challenging to read.

18 Claims, 28 Drawing Sheets

(56) References Cited

U.S. PATENT DOCUMENTS

| | | |
|---|---|---|
| 7,286,395 B2 | 10/2007 | Chen et al. |
| 8,750,033 B2 | 6/2014 | Worledge |
| 9,025,364 B2 | 5/2015 | Kinney et al. |
| 9,299,411 B2 | 3/2016 | Alam et al. |
| 9,666,259 B1 | 5/2017 | Jung et al. |
| 9,697,880 B2 | 7/2017 | Andre et al. |
| 10,157,965 B2 | 12/2018 | Sciarrillo |
| 10,250,281 B2* | 4/2019 | Achtenberg ...... H03M 13/6325 |
| 10,256,402 B1* | 4/2019 | Rajamohanan ...... G11C 29/021 |
| 10,373,682 B2 | 8/2019 | Parkinson et al. |
| 10,530,393 B2* | 1/2020 | Ryabinin ............ H03M 13/1111 |
| 10,545,692 B2 | 1/2020 | Franklin et al. |
| 10,585,735 B2 | 3/2020 | Kinney et al. |
| 10,734,073 B1* | 8/2020 | Bandyopadhyay ........................ G11C 13/0026 |
| 10,885,991 B2 | 1/2021 | Parkinson et al. |
| 11,120,872 B2 | 9/2021 | Lee et al. |
| 2014/0269029 A1* | 9/2014 | Kinney ................ G11C 29/021 365/158 |
| 2014/0372792 A1 | 12/2014 | Slaughter et al. |
| 2016/0103735 A1* | 4/2016 | Lee ................... H03M 13/1545 714/764 |
| 2018/0277187 A1* | 9/2018 | Ikegami ............. G11C 11/1675 |
| 2019/0221273 A1* | 7/2019 | Parkinson ........... G06F 12/0246 |
| 2020/0006432 A1* | 1/2020 | Grobis .................. H10N 50/01 |
| 2020/0203361 A1* | 6/2020 | Kang ..................... H10B 43/20 |
| 2021/0098064 A1* | 4/2021 | Lee .................... G11C 13/0038 |
| 2021/0193247 A1 | 6/2021 | Chiang |

FOREIGN PATENT DOCUMENTS

| | | |
|---|---|---|
| KR | 20160043578 A | 4/2016 |
| KR | 20200102336 A | 8/2020 |
| KR | 20210039047 A | 4/2021 |

OTHER PUBLICATIONS

Saitoh, Shuhei, et al., "Oxide-based selector with trap-filling-controlled threshold switching," Applied Physics Letters, Dec. 26, 2019, 6 pages.

Hu, G., et al., "Spin-transfer torque MRAM with reliable 2 ns writing for last level cache applications," IEDM19-40, downloaded on Jul. 26, 2021, 4 pages.

U.S. Appl. No. 17/099,030, filed Nov. 16, 2020.

U.S. Appl. No. 17/232,924, filed Apr. 16, 2021.

Non-final Office Action dated May 15, 2023, U.S. Appl. No. 17/552,143, filed Dec. 15, 2021.

Response to Office Action dated Sep. 13, 2023, U.S. Appl. No. 17/552,143, filed Dec. 15, 2021.

Notice of Allowance dated Jan. 3, 2024, U.S. Appl. No. 17/552,143 filed Dec. 15, 2021.

* cited by examiner

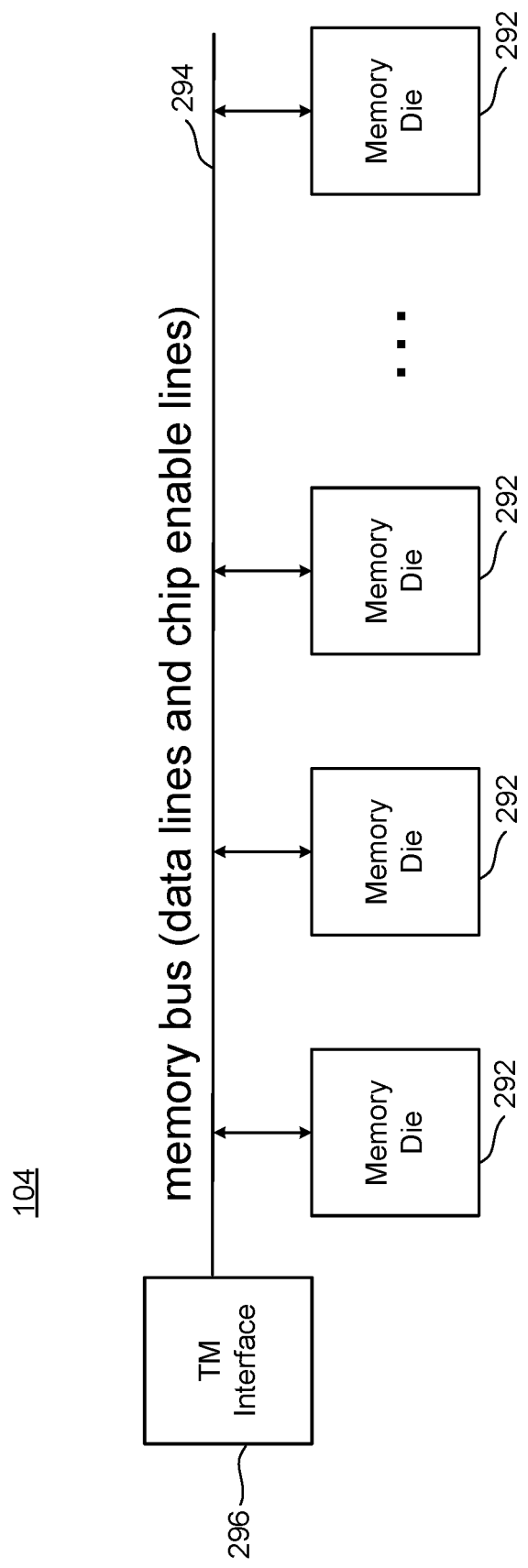

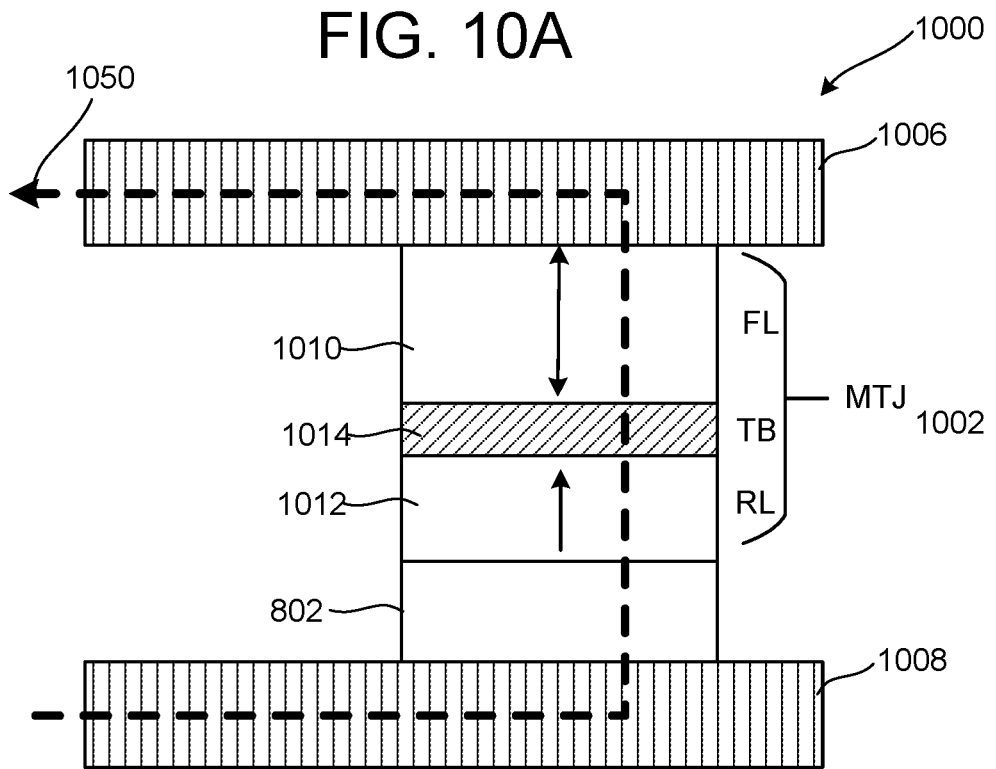
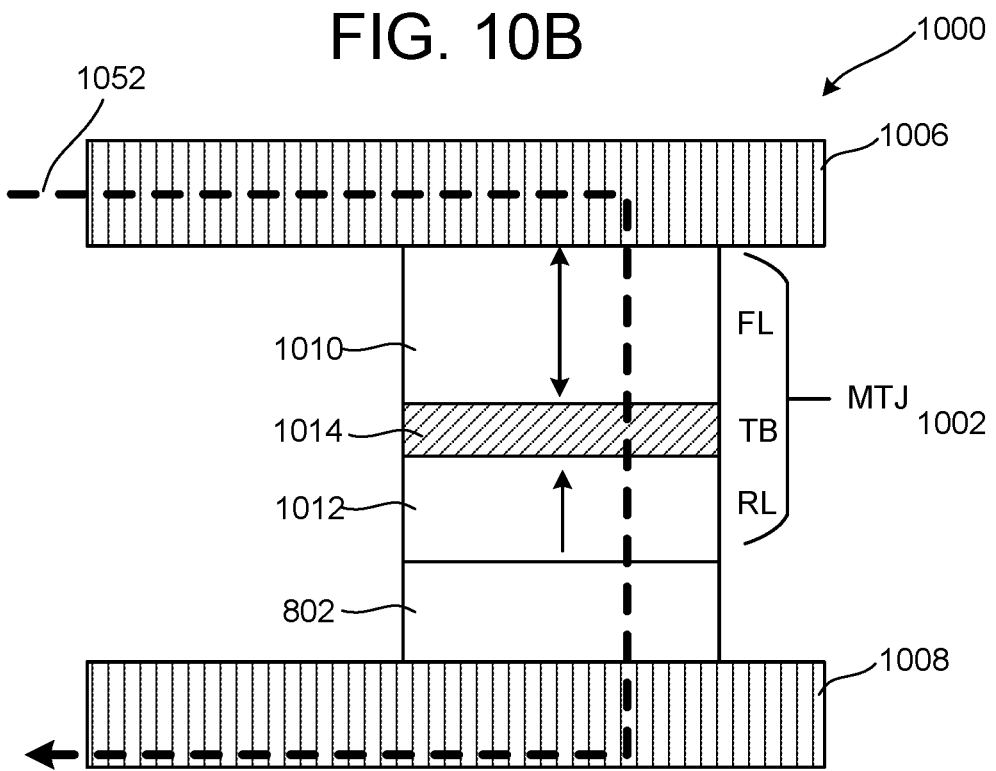

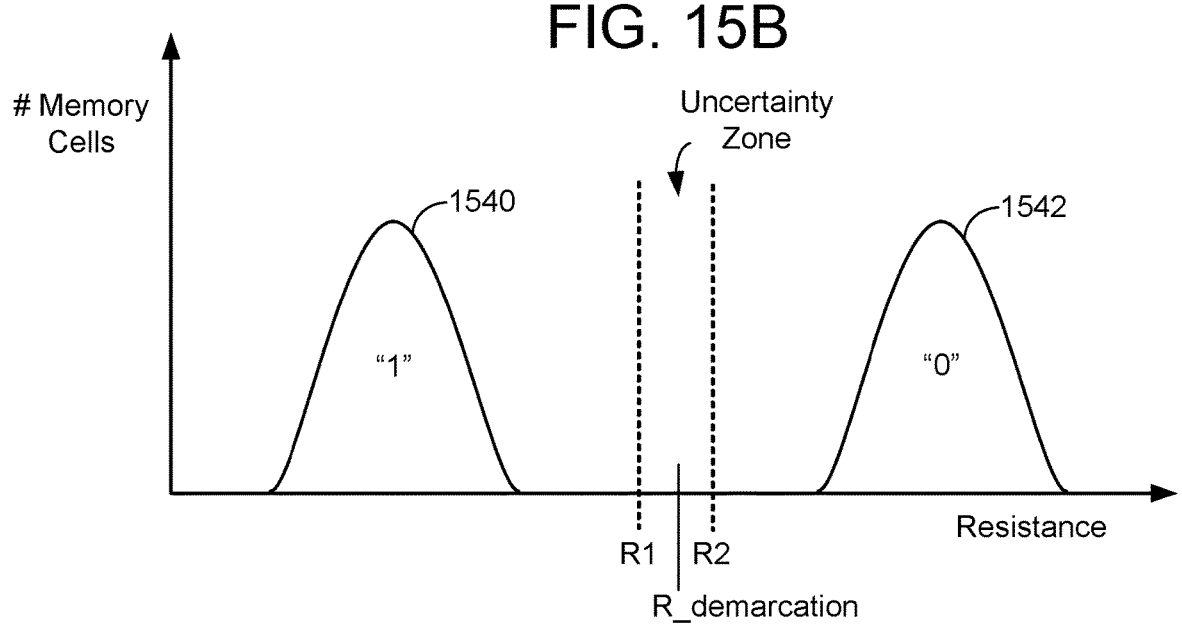
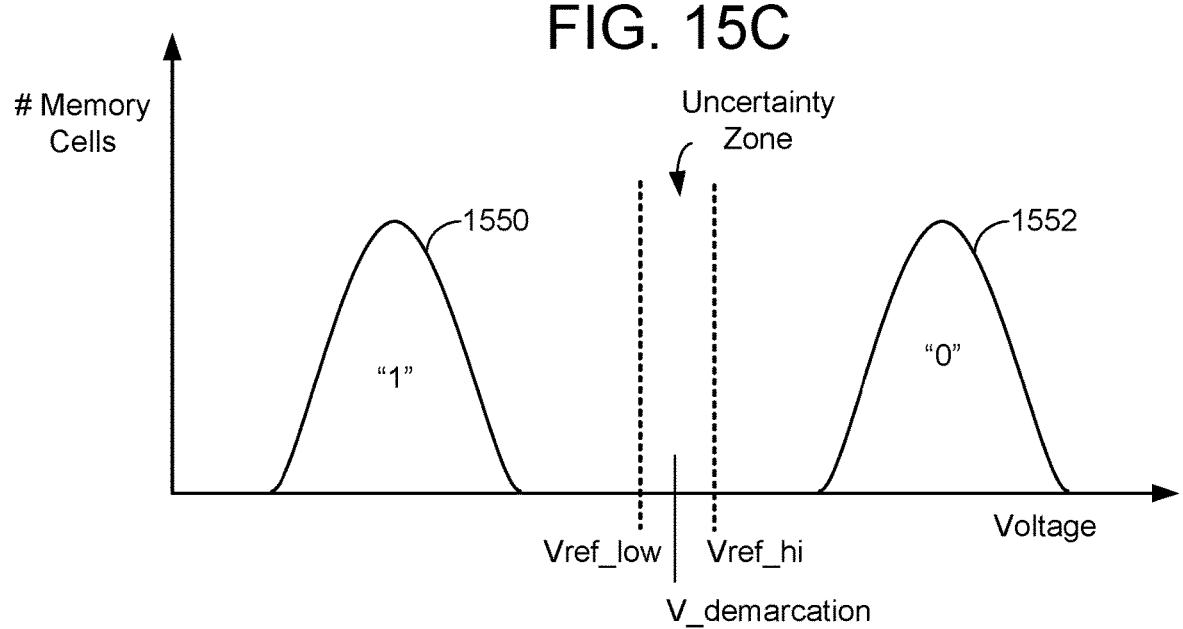

MIXED CURRENT-FORCED READ SCHEME FOR MRAM ARRAY WITH SELECTOR

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

The memory cells may reside in a cross-point memory array. In a memory array with a cross-point type architecture, a first set of conductive lines run across the surface of a substrate and a second set of conductive lines are formed over the first set of conductive lines, running over the substrate in a direction perpendicular to the first set of conductive lines. The memory cells are located at the cross-point junctions of the two sets of conductive lines.

A reversible resistivity cell is formed from a material having a programmable resistance. In a binary approach, the memory cell at each cross-point can be programmed into one of two resistance states: high and low. In some approaches, more than two resistance states may be used. One type of reversible resistivity cell is a magnetoresistive random access memory (MRAM) cell. An MRAM cell uses magnetization to represent stored data, in contrast to some other memory technologies that use electronic charges to store data. A bit of data is written to an MRAM cell by changing the direction of magnetization of a magnetic element ("the free layer") within the MRAM cell, and a bit is read by measuring the resistance of the MRAM cell (low resistance typically represents a "0" bit and high resistance typically represents a "1" bit).

Challenges exist in reading reversible resistivity memory cells including, but not limited to, MRAM cells. One technique for reading reversible resistivity cells is a referenced read in which a condition of the memory cell is compared to a reference signal, such as a reference voltage. A signal is applied to the memory cell to determine the condition of the memory cell. For example, a voltage may be applied across the memory cell resulting in a current having a magnitude that is representative of the resistance of the memory cell. The current may be converted to a sample voltage, which is compared to the reference voltage. The memory cell's state is determined based on whether the sample voltage is higher or lower than the reference voltage.

Another technique for reading reversible resistivity cells is a self-referenced read (SRR). One SSR technique includes a first read, a write to a known state, and a second read. One technique for the first read is to apply a read voltage across the memory cell, resulting in a current having a magnitude that is representative of the resistance of the memory cell and stored. The stored voltage may be adjusted (for example up by 150$mv$) for comparison to a later read. One technique for the second read is to apply the read voltage across the memory cell, resulting in a current having a magnitude that is representative of the resistance of the memory cell. A voltage sample from the first read is stored and compared with a voltage sample from the second read. The determination of the original state of the memory cell depends on the difference between the first adjusted read voltage and the second read voltage after the destructive write to a known state. Then, if the second read shows the bit state has not changed, it was in the state of the destructive write before the destructive write. If the bit state changes, it was changed by the destructive write from a different state to the state to which the destructive write drives the bit.

BRIEF DESCRIPTION OF THE DRAWING

Like-numbered elements refer to common components in the different figures.

FIG. 4 is a block diagram of one embodiment of a memory package.

FIGS. 10A and 10B illustrate the writing of an MRAM memory cell by flowing current that generates spin torque transfer (STT).

FIG. 15B depicts two resistance distributions of memory cells, with an uncertainty zone between the two resistance distributions.

FIG. 15C depicts the concept of the uncertainty zone, with the horizontal axis being the voltage.

DETAILED DESCRIPTION

Figure 1:
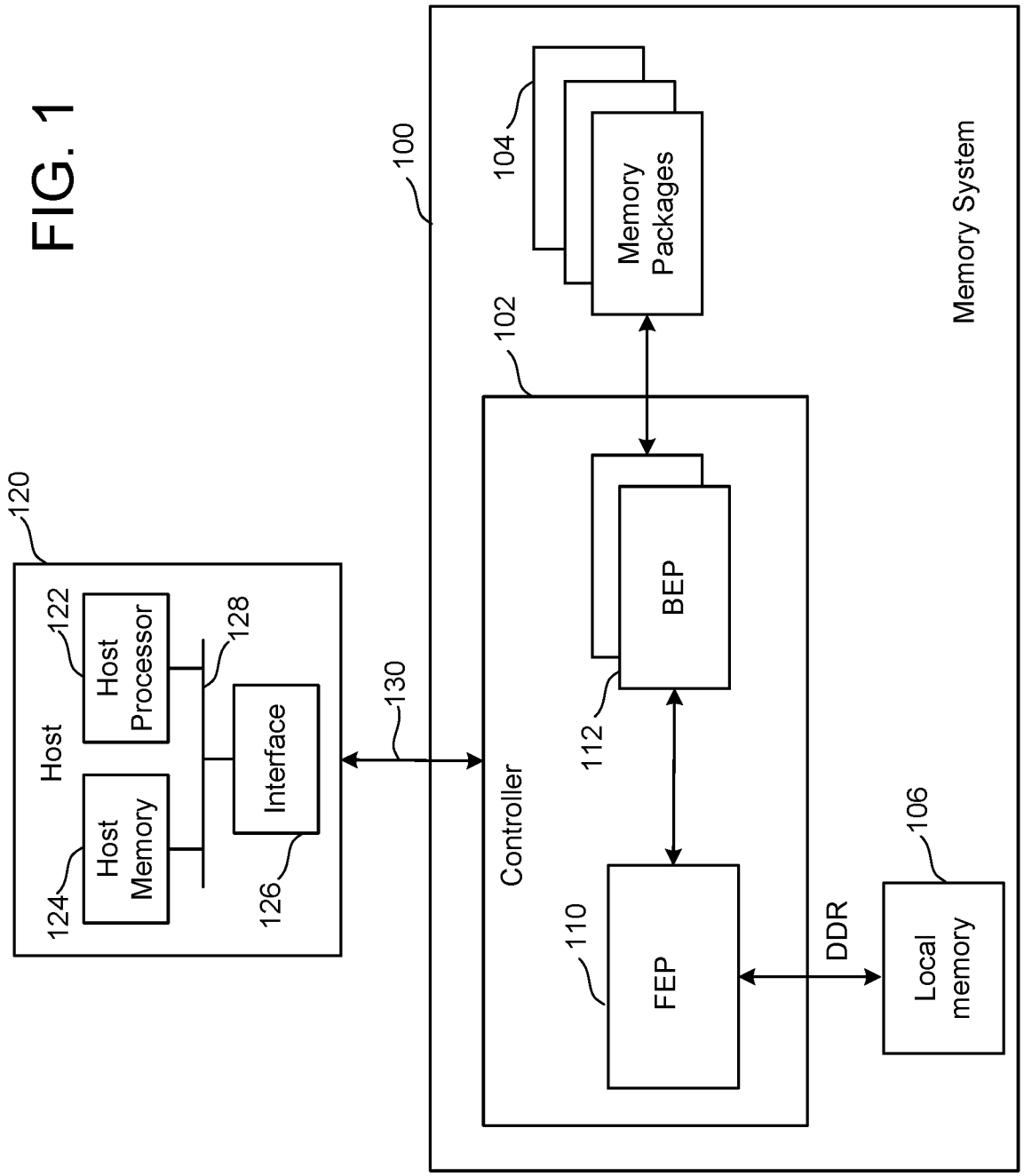
FIG. 1 is a block diagram of one embodiment of a non-volatile memory system connected to a host.

Technology is disclosed herein for reading reversible resistivity cells in a memory array when using a current-force read. A current-force read forces a current through the memory cell and measures a voltage that appears across the cell and select circuitry as a result. The measured voltage is representative of the resistance of the memory cell. The memory cells may reside in a cross-point memory array. In an embodiment, each memory cell has a resistive random access memory element in series with a two terminal selector element. The two terminal selector element may be a threshold switching selector such as an Ovonic Threshold Switch (OTS). In an embodiment, the resistive random access memory element comprises a magnetoresistive random access memory (MRAM) element.

In an embodiment, the memory cells are first read using a current-force referenced read. If the current-force referenced read is successful, then results of the current-force referenced read are returned. If the current-force referenced read is unsuccessful, then a current-force self-referenced read (SRR) is performed and results of the current-force SRR are returned. The current-force referenced read provides a faster read of the memory cells and can be successful in most cases. The current-force SRR provides a more accurate (higher margin) read in the event that the current-force referenced read is not successful. Moreover, the current-force referenced read may use less power than the current-force SRR. In some embodiments, the current-force referenced read will be successful most of the time (e.g., about 99 percent of the time). Therefore, most of the time the read is accomplished using the lower power current-force referenced read. Therefore, substantial power and latency is saved relative to always performing a SRR.

As noted, the reads may be current-force reads. In an embodiment of a current-force read, a memory cell is accessed by forcing a current through the selected word line while applying a select voltage to a selected bit line. The access current flows through a portion of the selected word line, through the selected memory cell, and also through a portion of the selected bit line; and through each of the respective decode circuitry. A voltage will appear across the selected memory cell in response to the access current. The voltage across the selected memory cell will depend on the magnitude of the access current and the resistance of the memory cell. Hence, the voltage across the selected memory cell is representative of the resistance of the memory cell.

In some embodiments, the memory cells are in a cross-point array and are magnetoresistive random access memory (MRAM) cells. An MRAM cell uses magnetization to represent stored data, in contrast to some other memory technologies that use electronic charges to store data. A bit of data is written to an MRAM cell by changing the direction of magnetization of a magnetic element ("the free layer") within the MRAM cell, and a bit is read by measuring the resistance of the MRAM cell (low resistance typically represents a "0" bit and high resistance typically represents a "1" bit). As used herein, direction of magnetization is the direction that the magnetic moment is oriented with respect to a reference direction set by another element of the MRAM ("the reference layer"). In some embodiments, the low resistance is referred to as a parallel or P-state and the high resistance is referred to as an anti-parallel or AP-state. MRAM can use the spin-transfer torque effect to change the direction of the magnetization from P-state to AP-state and vice-versa, which typically requires bipolar (bi-directional write) operation for writes.

One conventional approach forces a voltage across a memory cell and samples a resulting memory cell current to read reversible resistivity memory cells such as MRAM cells. In some embodiments, the MRAM cell has a threshold switching selector in series with the programmable resistive element. An example of a threshold switching selector is an Ovonic Threshold Switch (OTS). There can be considerable variations of the OTS electrical properties from one memory cell to the next, which can reduce read margin. Using such a voltage-force approach to read an MRAM cell in series with a threshold switching selector can be problematic. One problem is the voltage-force read technique does not compensate for variations in the voltage drops across threshold switching selectors when they are in the on-state. The on-state voltage drop is also called the "offset voltage". A current-force approach can compensate for offset voltage variations in such threshold switching selectors. A current-force approach can also compensate for issues such as voltage drop across the selected word line and the selected bit line due to variation in resistances of the word line and bit line depending on decoded position in the array.

As noted, issues such as variations of the OTS (electrical properties) can reduce read margin. One way to deal with this issue is to use a larger signal to read the memory cell. For example, in order to successfully read an MRAM cell, there should be a sufficiently large current forced through the memory cell. Alternatively, there should be a sufficiently large voltage forced across the memory cell to successfully read an MRAM cell. Both the current-force and the voltage-force techniques result in a voltage across the memory cell, which will now be referred to as a cell voltage. If the cell voltage is not large enough then the bit error rate can be higher than can be corrected by error correction circuitry. However, if the cell voltage is too high then undue stress is placed on the reversible-resistivity memory cell and reduces endurance. In some embodiment, the current-force read limits the voltage that can appear across the memory cell by clamping the voltage that can appear across the MRAM cell.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable tolerance for a given application.

FIG. 1 is a block diagram of one embodiment of a non-volatile memory system (or more briefly "memory system") 100 connected to a host system 120. Memory system 100 can implement the technology presented herein for a mixed current-force read scheme. Many different types of memory systems can be used with the technology proposed herein. Example memory systems include dual in-line memory modules (DIMMs), solid state drives ("SSDs"), memory cards and embedded memory devices; however, other types of memory systems can also be used.

Memory system 100 of FIG. 1 comprises a controller 102, non-volatile memory 104 for storing data, and local memory 106 (e.g., MRAM, ReRAM, DRAM). In one embodiment, memory controller 102 provides access to memory cells in a cross-point array in local memory 106. For example, memory controller 102 may provide for access in a cross-point array of MRAM cells in local memory 106. In another embodiment the controller 102 or interface 126 or both are eliminated and the memory packages are connected directly to the Host 120 through a bus such as DDRn. The local memory 106 may be referred to as a memory system. The combination of the memory controller 102 and local memory 106 may be referred to herein as a memory system. In some embodiments, the resistive random access memory elements in local memory 106 are read using a mixed current-force read that includes performing a current-force referenced read followed by a current-force SRR if the current-force referenced read is unsuccessful.

Memory controller 102 comprises a Front-End Processor (FEP) circuit 110 and one or more Back-End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front-end and back-end functions. In another embodiment, the FEP and BEP are eliminated in favor of direction control by the Host 120 and any functions required of the memory are generated on the memory chip, such as ECC and wear leveling. Further details of on-chip memory maintenance are described in U.S. Pat. No. 10,545,692, titled "Memory Maintenance Operations During Refresh Window", and U.S. Pat. No. 10,885,991, titled "Data Rewrite During Refresh Window", both of which are hereby incorporated by reference in their entirety. If the time allowed for reading the memory is consistently the same (and therefore allows for both first read/sample/store/and SRR), the memory is synchronous. If a handshake is used, the memory is asynchronous and requires a handshake so that the improved latency of forced current referenced read can be signaled for reduced latency. In another embodiment, the forced current referenced read is always used without any SRR cycles, so the chip can be used synchronously at this faster latency in direct replacement of DRAM in DDRn interface directly to host; then the BER must be adequately low so that all errors are within the capacity to correct of the ECC engine.

The ASICs for each of the BEP circuits 112 and the FEP circuit 110 are implemented on the same semiconductor such that the memory controller 102 is manufactured as a System on a Chip ("SoC"). Alternatively, such circuitry can be placed on each memory chip avoiding the overhead space and expense of adding an external controller and/or BEP or FEP. FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Media Management Layer (MML) that performs memory management (e.g., garbage collection, wear leveling, etc.), logical to physical address translation, communication with the host, management of local memory 106 and management of the overall operation of the SSD (or other non-volatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, memory controller 102 is connected to one or more non-volatile memory die. In one embodiment, the memory package can include types of memory, such as storage class memory (SCM) based on resistive random access memory (such as ReRAM, MRAM, FeRAM or RRAM) or a phase change memory (PCM). In one embodiment, memory controller 102 provides access to memory cells in a cross-point array in a memory package 104.

Memory controller 102 communicates with host system 120 via an interface 130 that implements a protocol such as, for example, Compute Express Link (CXL). Or such controller can be eliminated and the memory packages can be placed directly on the host bus, DDRn for example. For working with memory system 100, host system 120 includes a host processor 122, host memory 124, and interface 126 connected along bus 128. Host memory 124 is the host's physical memory, and can be DRAM, SRAM, ReRAM, MRAM, non-volatile memory, or another type of storage. In an embodiment, host memory 124 contains a cross-point array of non-volatile memory cells, with each memory cell comprising a resistive random access memory element and a two terminal selector element in series with the memory element. In some embodiments, the resistive random access memory elements in host memory 124 are read using a mixed current-force read that includes performing a current-force referenced read followed by a current-force SRR if the current-force referenced read is unsuccessful.

Host system 120 is external to and separate from memory system 100. In one embodiment, memory system 100 is embedded in host system 120. Host memory 124 may be referred to herein as a memory system. The combination of the host processor 122 and host memory 124 may be referred to herein as a memory system. In an embodiment, such host memory can be cross-point memory using MRAM.

Figure 2:
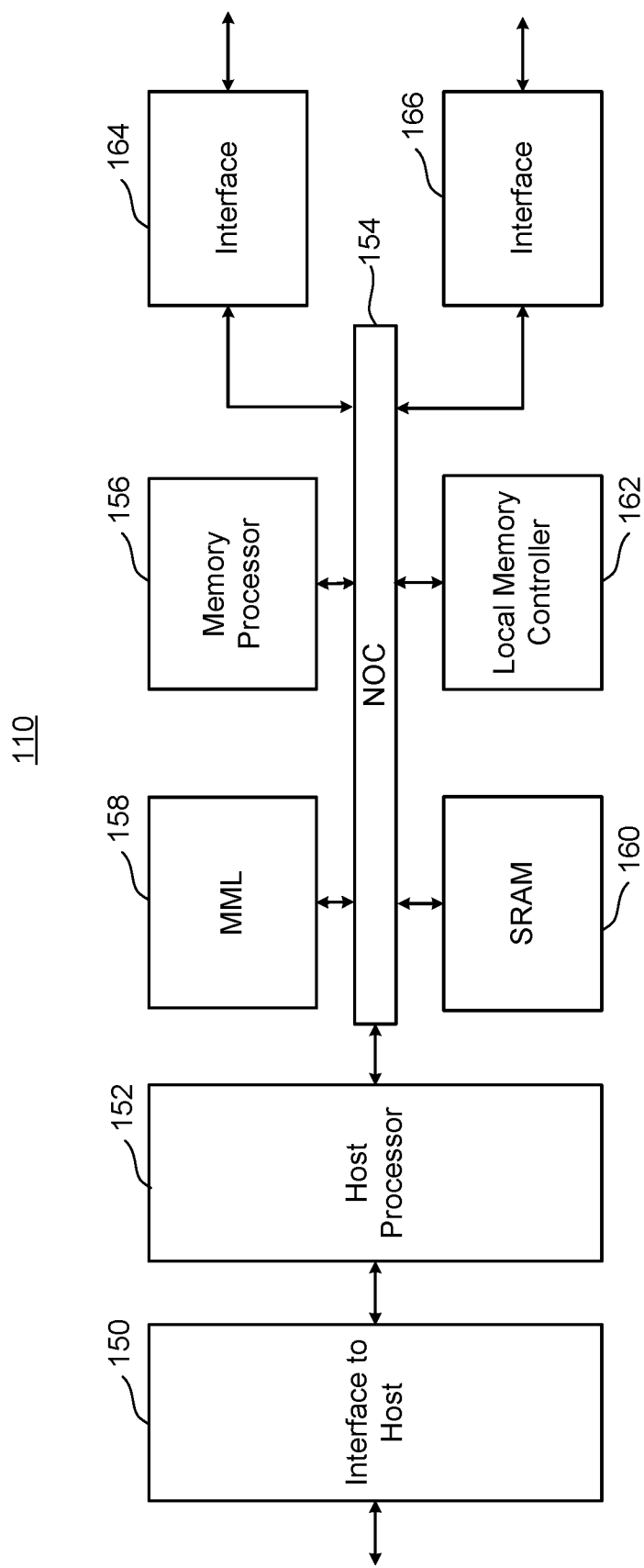
FIG. 2 is a block diagram of one embodiment of a Front-End Processor Circuit. In some embodiments, the Front-End Processor Circuit is part of a memory controller.

FIG. 2 is a block diagram of one embodiment of FEP circuit 110. FIG. 2 shows an interface 150 to communicate with host system 120 and a host processor 152 in communication with that interface. Interface 150 may be CXL, DDR, or PCIe, for example. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a local memory controller 162. The local memory controller 162 is used to operate and communicate with the local memory 106 (e.g., local memory 106 in FIG. 1). In one embodiment, local memory controller 162 is an MRAM controller to operate and communicate with MRAM in local memory 106. In one embodiment, local memory controller 162 is a ReRAM controller to operate and communicate with ReRAM in local memory 106. SRAM 160 is local RAM memory used by memory processor 156. Memory processor 156 is used to run the FEP circuit and perform the various memory operations. Also, in communication with the NOC are two Interfaces 164 and 166, which may be CXL, DDR, or PCIe, for example. In the embodiment of FIG. 2, the SSD controller will include two BEP circuits 112; therefore, there are two Interfaces 164/166. Each Interface 164/166 communicates with one of the BEP circuits 112. In other embodiments, there can be more or less than two BEP circuits 112; therefore, there can be more than two Interfaces 164/166.

FEP circuit 110 can also include a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 502 of FIGS. 5A and 5B below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
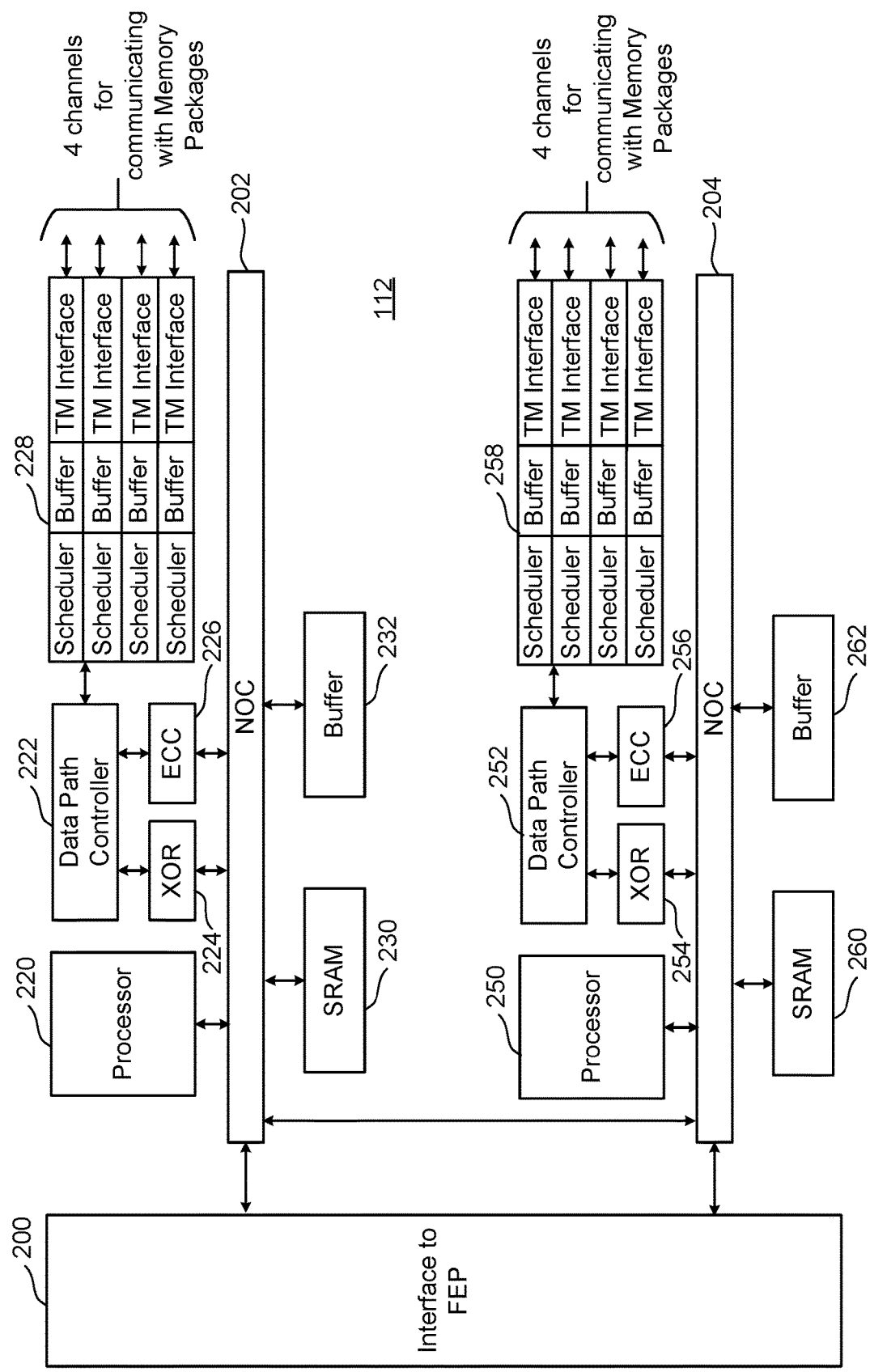
FIG. 3 is a block diagram of one embodiment of a Back-End Processor Circuit. In some embodiments, the Back-End Processor Circuit is part of a memory controller.

FIG. 3 is a block diagram of one embodiment of the BEP circuit 112. FIG. 3 shows an Interface 200 (which may be CXL, DDR, or PCIe, for example) for communicating with the FEP circuit 110 (e.g., communicating with one of Interfaces 164 and 166 of FIG. 2). Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits. In another embodiment, such circuitry and software or some portion thereof is placed on the chip in each memory.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5A:
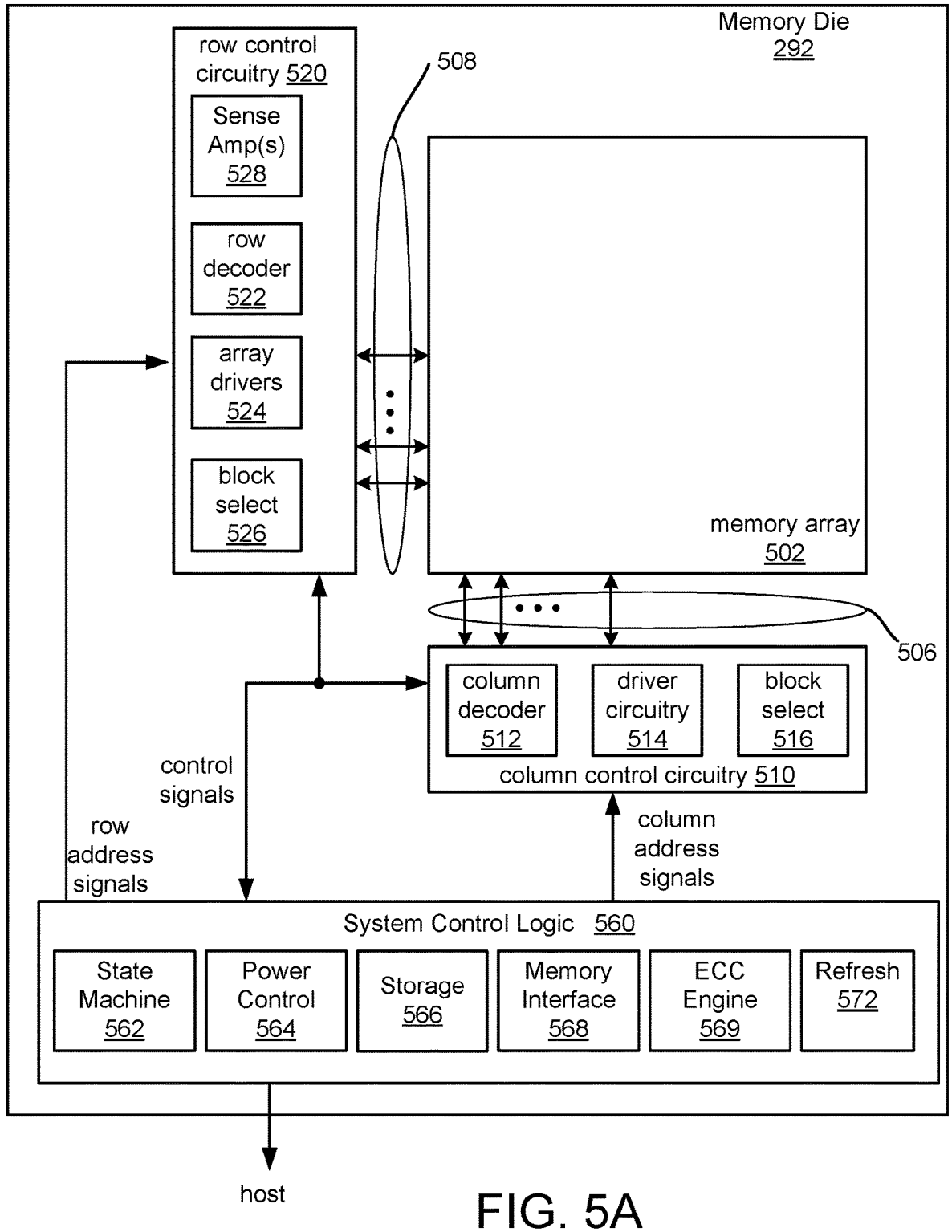
FIG. 5A is a block diagram of one embodiment of a memory die.

FIG. 5A is a block diagram that depicts one example of a memory die 292 that can implement the technology described herein. In one embodiment, memory die 292 is included in local memory 106. In one embodiment, memory die 292 is included in host memory 124. Memory die 292 includes a memory array 502 that can include any of memory cells described in the following. The array terminal lines of memory array 502 include the various layer(s) of word lines organized as rows, and the various layer(s) of bit lines organized as columns. However, other orientations can also be implemented. Memory die 292 includes row control circuitry 520, whose outputs 508 are connected to respective word lines of the memory array 502. Row control circuitry 520 receives a group of M row address signals and one or more various control signals from System Control Logic circuit 560, and typically may include such circuits as row decoders 522, row drivers 524, and block select circuitry 526 for both reading and writing operations. Row control circuitry 520 may also include read/write circuitry. In an embodiment, row decode and control circuitry 520 has sense amplifiers 528, which each contain circuitry for sensing a condition (e.g., voltage) of a word line of the memory array 502. In an embodiment, by sensing a word line voltage, a condition of a memory cell in a cross-point array is determined. Memory die 292 also includes column decode and control circuitry 510 whose input/outputs 506 are connected to respective bit lines of the memory array 502. Although only single block is shown for array 502, a memory die can include multiple arrays or "tiles" that can be individually accessed. Column control circuitry 510 receives a group of N column address signals and one or more various control signals from System Control Logic 560, and typically may include such circuits as column decoders 512, column decoders and drivers 514, block select circuitry 516, as well as read/write circuitry, and I/O multiplexers.

System control logic 560 receives data and commands from a host system and provides output data and status to the host system. In other embodiments, system control logic 560 receives data and commands from a separate controller circuit and provides output data to that controller circuit, with the controller circuit communicating with the host system. In another embodiment those data and commands are sent and received directly from the memory packages to the Host without a separate controller, and any controller needed is within each die or within a die added to a multi-chip memory package. This In some embodiments, the system control logic 560 can include a state machine 562 that provides die-level control of memory operations. In one embodiment, the state machine 562 is programmable by software. In other embodiments, the state machine 562 does not use software and is completely implemented in hardware (e.g., electrical circuits). In another embodiment, the state machine 562 is replaced by a micro-controller or microprocessor. The system control logic 560 can also include a power control module 564 controls the power and voltages supplied to the rows and columns of the memory 502 during memory operations and may include charge pumps and regulator circuit for creating regulating voltages. System control logic 560 includes storage 566, which may be used to store parameters for operating the memory array 502. Such system control logic may be commanded by the host 120 or memory controller 102 to refresh logic 572, which shall load an on-chip stored row and column address (Pointer) which may be incremented after refresh. Such address bit(s) may be selected only (to refresh the OTS). Or such address may be read, corrected by steering through ECC engine 569, and then stored in a "spare" location which is also being incremented (so all codewords are periodically read, corrected, and relocated in the entire chip). Such operation may be more directly controlled by the host of an external controller, for example a PCIe or CXL controller.

Commands and data are transferred between the memory controller 102 and the memory die 292 via memory controller interface 568 (also referred to as a "communication interface"). Such interface may be PCIe, CXL, DDRn for example. Memory controller interface 568 is an electrical interface for communicating with memory controller 102. Examples of memory controller interface 568 include a Toggle Mode Interface. Other I/O interfaces can also be used. For example, memory controller interface 568 may implement a Toggle Mode Interface that connects to the Toggle Mode interfaces of memory interface 228/258 for memory controller 102. In one embodiment, memory controller interface 568 includes a set of input and/or output (I/O) pins that connect to the controller 102. In another embodiment, the interface is JEDEC standard DDRn or LPDDRn, such as DDR5 or LPDDR5, or a subset thereof with smaller page and/or relaxed timing.

System control logic 560 located in an external controller on the memory die in the memory packages may include Error Correction Code (ECC) engine 569. ECC engine 569 may be referred to as an on-die ECC engine, as it is on the same semiconductor die as the memory cells. That is, the on-die ECC engine 569 may be used to encode data that is to be stored in the memory array 502, and to decode the decoded data and correct errors. The encoded data may be referred to herein as a codeword or as an ECC codeword. ECC engine 569 may be used to perform a decoding algorithm and to perform error correction. Hence, the ECC engine 569 may decoded the ECC codeword. In an embodiment, the ECC engine 569 is able to decode the data very rapidly, which facilitates mixed current-force reading of MRAM and other memory element technologies with two terminal selectors, such as OTS.

Having the ECC engine 569 on the same die as the memory cells allows for very fast decoding, which facilitates embodiments of mixed current-force read. The ECC engine 569 can use a wide variety of decoding algorithms including, but not limited to, Reed Solomon, a Bose-Chaudhuri-Hocquenghem (BCH), and low-density parity check (LDPC). In an embodiment, the ECC engine 569 is able to determine or estimate a number of bit errors in a codeword prior to decoding the codeword. In an embodiment, the ECC engine 569 calculates the syndrome of the codeword in order to estimate the number of bit errors in the codeword. In an embodiment, the syndrome is based on the number of unsatisfied parity check equations. In an embodiment, the ECC engine 569 is capable of decoding a codeword provided that there are no more than a certain number of bits in error in the codeword.

In some embodiments, all of the elements of memory die 292, including the system control logic 560, can be formed as part of a single die. In other embodiments, some or all of the system control logic 560 can be formed on a different die.

In one embodiment, memory structure 502 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In another embodiment, memory structure 502 comprises a two-dimensional memory array of non-volatile memory cells.

The exact type of memory array architecture or memory cell included in memory structure 502 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 502 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 502 include two dimensional arrays, three dimensional arrays, cross-point arrays, stacked two dimensional arrays, vertical bit line arrays, and the like.

One example of a ReRAM or MRAM cross-point memory includes reversible resistance-switching elements in series with and OTS selector arranged in cross-point arrays accessed by X lines and Y lines (e.g., word lines and bit lines). In another embodiment of cross-point is PCM in series with and OTS selector. In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive random access memory (MRAM) stores data using magnetic storage elements. The elements are formed from two ferromagnetic layers, each of which can hold a magnetization, separated by a thin insulating layer. For a field-controlled MRAM, one of the two layers is a permanent magnet set to a particular polarity; the other layer's magnetization can be changed to match that of an external field to store memory. Other types of MRAM cells are possible. A memory device may be built from a grid of MRAM cells. In one embodiment for programming, each memory cell lies between a pair of write lines arranged at right angles to each other, parallel to the cell, one above and one below the cell. For some MRAM cells, when current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). The memory cells are programmed by current pulses that can change the co-ordination of the PCM material or switch it between amorphous and crystalline states. Note that the use of "pulse" in this document does not require a square pulse but includes a (continuous or non-continuous) vibration or burst of sound, current, voltage light, or other wave. And the current forced for Write can, for example, be driven rapidly to a peak value and then linearly ramped lower with, for example, a 500 ns edge rate. Such peak current force may be limited by a zoned voltage compliance that varies by position of the memory cell along the word line or bit line.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5A can be grouped into two parts, the memory structure 502 and the peripheral circuitry, including all of the other elements. An important characteristic of a memory circuit is its capacity, which can be increased by increasing the area of the memory die 292 that is given over to the memory structure 502; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 560, reduced availability of area can limit the available functionalities that can be implemented on-chip. Consequently, a basic trade-off in the design of a memory die 292 is the amount of area to devote to the memory structure 502 and the amount of area to devote to the peripheral circuitry. Such tradeoffs may result in more IR drop from use of larger x-y arrays of memory between driving circuits on the word line and bit line, which in turn may be benefit more from use of voltage limit and zoning of the voltage compliance by memory cell position along the word line and bit line.

Another area in which the memory structure 502 and the peripheral circuitry are often at odds is in the processing involved in forming these regions, since these regions often involve differing processing technologies and the trade-off in having differing technologies on a single die. For example, elements such as sense amplifier circuits, charge pumps, logic elements in a state machine, and other peripheral circuitry in system control logic 560 often employ PMOS devices. In some cases, the memory structure will be based on CMOS devices. Processing operations for manufacturing a CMOS die will differ in many aspects from the processing operations optimized for an NMOS technologies.

Figure 5B:
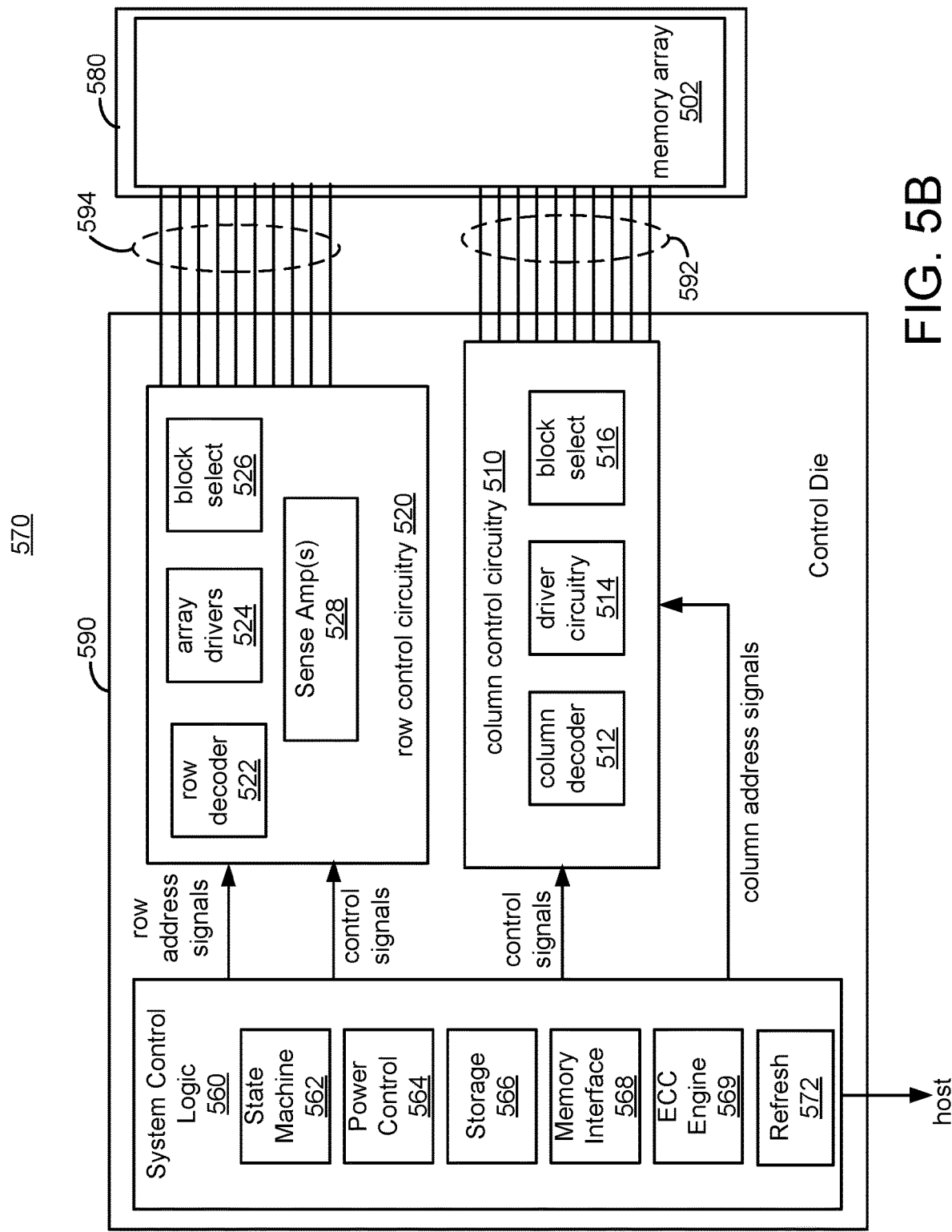
FIG. 5B is a block diagram of one embodiment of an integrated memory assembly containing a control die and a memory structure die.

To improve upon these limitations, embodiments described below can separate the elements of FIG. 5A onto separately formed dies that are then bonded together. FIG. 5B depicts an integrated memory assembly 570 having a memory structure die 580 and a control die 590. The memory structure 502 is formed on the memory structure die 580 and some or all of the peripheral circuitry elements, including one or more control circuits, are formed on the control die 590. For example, a memory structure die 580 can be formed of just the memory elements, such as the array of memory cells of MRAM memory, PCM memory, ReRAM memory, or other memory type. Some or all of the peripheral circuitry, even including elements such as decoders and sense amplifiers, can then be moved on to the control die. This allows each of the semiconductor dies to be optimized individually according to its technology. This allows more space for the peripheral elements, which can now incorporate additional capabilities that could not be readily incorporated were they restricted to the margins of the same die holding the memory cell array. The two die can then be bonded together in a bonded multi-die integrated memory assembly, with the array on the one die connected to the periphery elements on the other die. Although the following will focus on an integrated memory assembly of one memory die and one control die, other embodiments can use additional dies, such as two memory dies and one control die, for example.

As with 502 of FIG. 5A, the memory die 580 in FIG. 5B can include multiple independently accessible arrays or "tiles." System control logic 560, row control circuitry 520, and column control circuitry 510 are located in control die 590. In some embodiments, all or a portion of the column control circuitry 510 and all or a portion of the row control circuitry 520 are located on the memory structure die 580. In some embodiments, some of the circuitry in the system control logic 560 is located on the on the memory structure die 580.

FIG. 5B shows column control circuitry 510 on the control die 590 coupled to memory structure 502 on the memory structure die 580 through electrical paths 592. For example, electrical paths 592 may provide electrical connection between column decoder 512, column driver circuitry 514, and block select 516 and bit lines of memory structure 502. Electrical paths may extend from column control circuitry 510 in control die 590 through pads on control die 590 that are bonded to corresponding pads of the memory structure die 580, which are connected to bit lines of memory structure 502. Each bit line of memory structure 502 may have a corresponding electrical path in electrical paths 592, including a pair of bond pads, which connects to column control circuitry 510. Similarly, row control circuitry 520, including row decoder 522, row drivers 524, block select 526, and sense amplifiers 528 are coupled to memory structure 502 through electrical paths 594. Each of electrical path 594 may correspond to, for example, a word line. Additional electrical paths may also be provided between control die 590 and memory die 580.

For purposes of this document, the phrase "a control circuit" can include one or more of memory controller 102, system control logic 560, column control circuitry 510, row control circuitry 520, a micro-controller, a state machine, host processor 122, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit. Such control circuitry may include drivers such as direct drive via connection of a node through fully on transistors (gate to the power supply) driving to a fixed voltage such as a power supply. Such control circuitry may include a current source driver.

For purposes of this document, the term "apparatus" can include, but is not limited to, one or more of host system 120, the combination of host processor 122 and host memory 124, host memory 124, memory system 100, memory controller 102, local memory 106, the combination of memory controller 102 and local memory 106, memory package 104, memory die 292, integrated memory assembly 570, and/or control die 590.

In the following discussion, the memory array 502 of FIGS. 5A and 5B will be discussed in the context of a cross-point architecture. In a cross-point architecture, a first set of conductive lines or wires, such as word lines, run in a first direction relative to the underlying substrate and a second set of conductive lines or wires, such a bit lines, run in a second direction relative to the underlying substrate. The memory cells are sited at the intersection of the word lines and bit lines. The memory cells at these cross-points can be formed according to any of a number of technologies, including those described above. The following discussion will mainly focus on embodiments based on a cross-point architecture using MRAM memory cells, each in series with a two terminal selector such as Ovonic Threshold Switch (OTS) to comprise a selectable memory bit. Hence an embodiment includes a mixed current-force read scheme in a cross-point architecture having MRAM cells each with a series OTS selector. However, embodiments of a mixed current-force read scheme are not limited to a cross-point architecture having MRAM cells each with a series OTS selector.

Figure 6A:
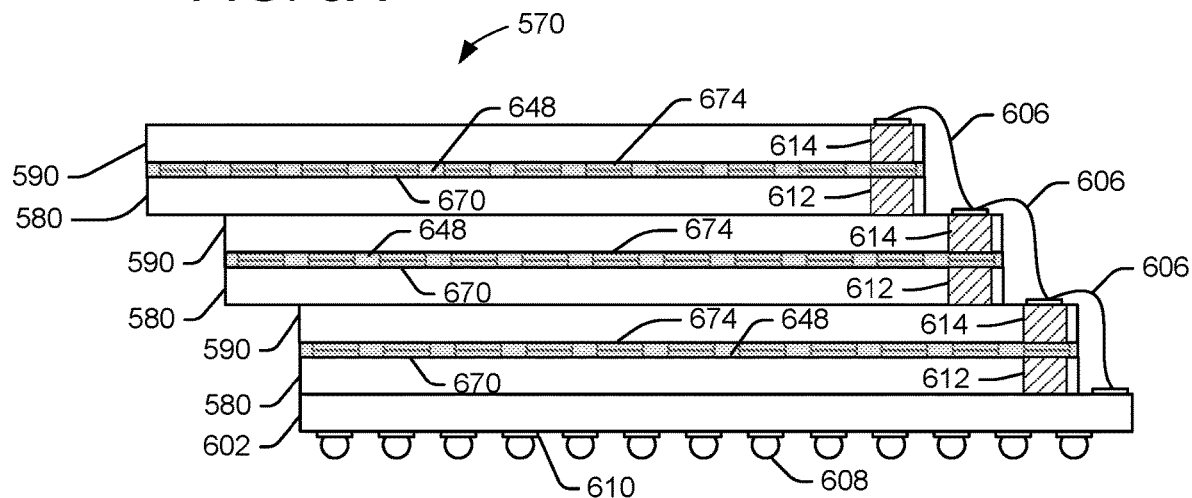
FIG. 6A depicts a side view of an embodiment of an integrated memory assembly stacked on a substrate.

In some embodiments, there is more than one control die 590 and more than one memory structure die 580 in an integrated memory assembly 570. In some embodiments, the integrated memory assembly 570 includes a stack of multiple control dies 590 and multiple memory structure dies 580. FIG. 6A depicts a side view of an embodiment of an integrated memory assembly 570 stacked on a substrate 602 (e.g., a stack comprising control dies 590 and memory structure dies 580). The integrated memory assembly 570 has three control dies 590 and three memory structure dies 580. In some embodiments, there are more than three memory structure dies 580 and more than three control dies 590.

Each control die 590 may be affixed (e.g., bonded) to at least one of the memory structure dies 580. Each control die 590 has a number of bond pads 674 on a major surface of the control die 590. Each memory structure die 580 has a number of bond pads 670 on a major surface of the memory structure die 580. Note that there are bond pad pairs 670/674. In one embodiment, the pattern of bond pads 670 matches the pattern of bond pads 674. In some embodiments, bond pads 670 and/or 674 are flip-chip bond pads. Thus, the bond pads 670, 674 electrically and physically couple the memory die 580 to the control die 590. Also, the bond pads 670, 674 permit internal signal transfer between the memory die 580 and the control die 590. Thus, the memory die 580 and the control die 590 are bonded together with bond pads.

The bond pads 670, 674 may be formed for example of copper, aluminum, and alloys thereof. There may be a liner 648 between the bond pads 670, 674 and the major surfaces. The liner may be formed for example of a titanium/titanium nitride stack. The bond pads 670, 674 and liner may be applied by vapor deposition and/or plating techniques. The bond pads and liners together may have a thickness of 720 nm, though this thickness may be larger or smaller in further embodiments.

The bond pads allow for internal signal transfer. Herein, "internal signal transfer" means signal transfer between the control die 590 and the memory die 580. The internal signal transfer permits the circuitry on the control die 590 to control memory operations in the memory die 580. Therefore, the bond pads 670, 674 may be used for memory operation signal transfer. Herein, "memory operation signal transfer" refers to any signals that pertain to a memory operation in a memory die 580. A memory operation signal transfer could include, but is not limited to, providing a voltage, providing a current, receiving a voltage, receiving a current, sensing a voltage, and/or sensing a current.

There may be many more bond pads than depicted in FIG. 6A. A space between two dies 580, 590 that are bonded together is filled with a solid layer 648, which may be formed from epoxy or other resin or polymer. This solid layer 648 protects the electrical connections between the dies 580, 590, and further secures the dies together. Various materials may be used as solid layer 648, but in embodiments, it may be Hysol epoxy resin from Henkel Corp., having offices in California, USA.

The integrated memory assembly 570 may for example be stacked with a stepped offset, leaving the bond pads at each level uncovered and accessible from above. Wire bonds 606 connected to the bond pads connect the control die 590 to the substrate 602. A number of such wire bonds may be formed across the width of each control die 590 (i.e., into the page of FIG. 6A).

A memory structure die through silicon via (TSV) 612 may be used to route signals through a memory structure die 580. A control die through silicon via (TSV) 614 may be used to route signals through a control die 590. The TSVs 612, 614 may be formed before, during or after formation of the integrated circuits in the semiconductor dies 580, 590. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped poly-silicon, and alloys or combinations thereof may be used.

Solder balls 608 may optionally be affixed to contact pads 610 on a lower surface of substrate 602. The solder balls 608 may be used to electrically and mechanically couple the integrated memory assembly 570 to a host device such as a printed circuit board. Solder balls 608 may be omitted where the integrated memory assembly 570 is to be used as an LGA package. The solder balls 608 may form a part of the interface between the integrated memory assembly 570 and the memory controller 102.

Figure 6B:
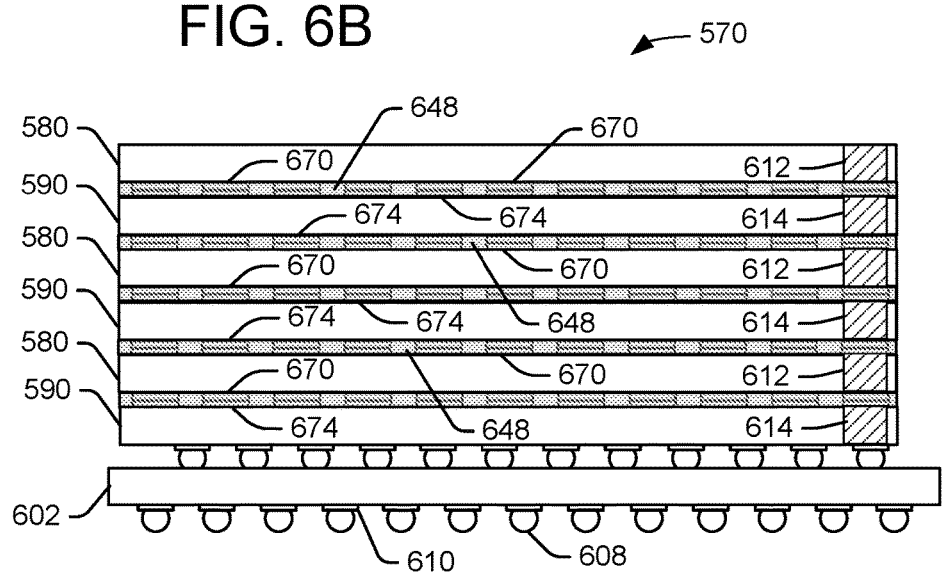
FIG. 6B depicts a side view of an embodiment of an integrated memory assembly stacked on a substrate.

FIG. 6B depicts a side view of an embodiment of an integrated memory assembly 570 stacked on a substrate 602. The integrated memory assembly 570 has three control dies 590 and three memory structure dies 580. In some embodiments, there are many more than three memory structure dies 580 and many more than three control dies 590. In this example, each control die 590 is bonded to at least one memory structure die 580. Optionally, a control die 590 may be bonded to two memory structure die 580.

Some of the bond pads 670, 674 are depicted. There may be many more bond pads. A space between two dies 580, 590 that are bonded together is filled with a solid layer 648, which may be formed from epoxy or other resin or polymer. In contrast to the example in FIG. 6A, the integrated memory assembly 570 in FIG. 6B does not have a stepped offset. A memory structure die through silicon via (TSV) 612 may be used to route signals through a memory structure die 580. A control die through silicon via (TSV) 614 may be used to route signals through a control die 590.

Solder balls 608 may optionally be affixed to contact pads 610 on a lower surface of substrate 602. The solder balls 608 may be used to electrically and mechanically couple the integrated memory assembly 570 to a host device such as a printed circuit board. Solder balls 608 may be omitted where the integrated memory assembly 570 is to be used as an LGA package.

As has been briefly discussed above, the control die 590 and the memory structure die 580 may be bonded together. Bond pads on each die 580, 590 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 6 µm square and spaced from each other with a pitch of 6 µm to 6 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 6 µm square and spaced from each other with a pitch of 1 µm to 6 µm. Bonding techniques may be used providing bond pads with even smaller sizes and pitches.

Some embodiments may include a film on surface of the dies 580, 590. Where no such film is initially provided, a space between the dies may be under filled with an epoxy or other resin or polymer. The under-fill material may be applied as a liquid which then hardens into a solid layer. This under-fill step protects the electrical connections between the dies 580, 590, and further secures the dies together. Various materials may be used as under-fill material, but in embodiments, it may be Hysol epoxy resin from Henkel Corp., having offices in California, USA.

Figure 7A:
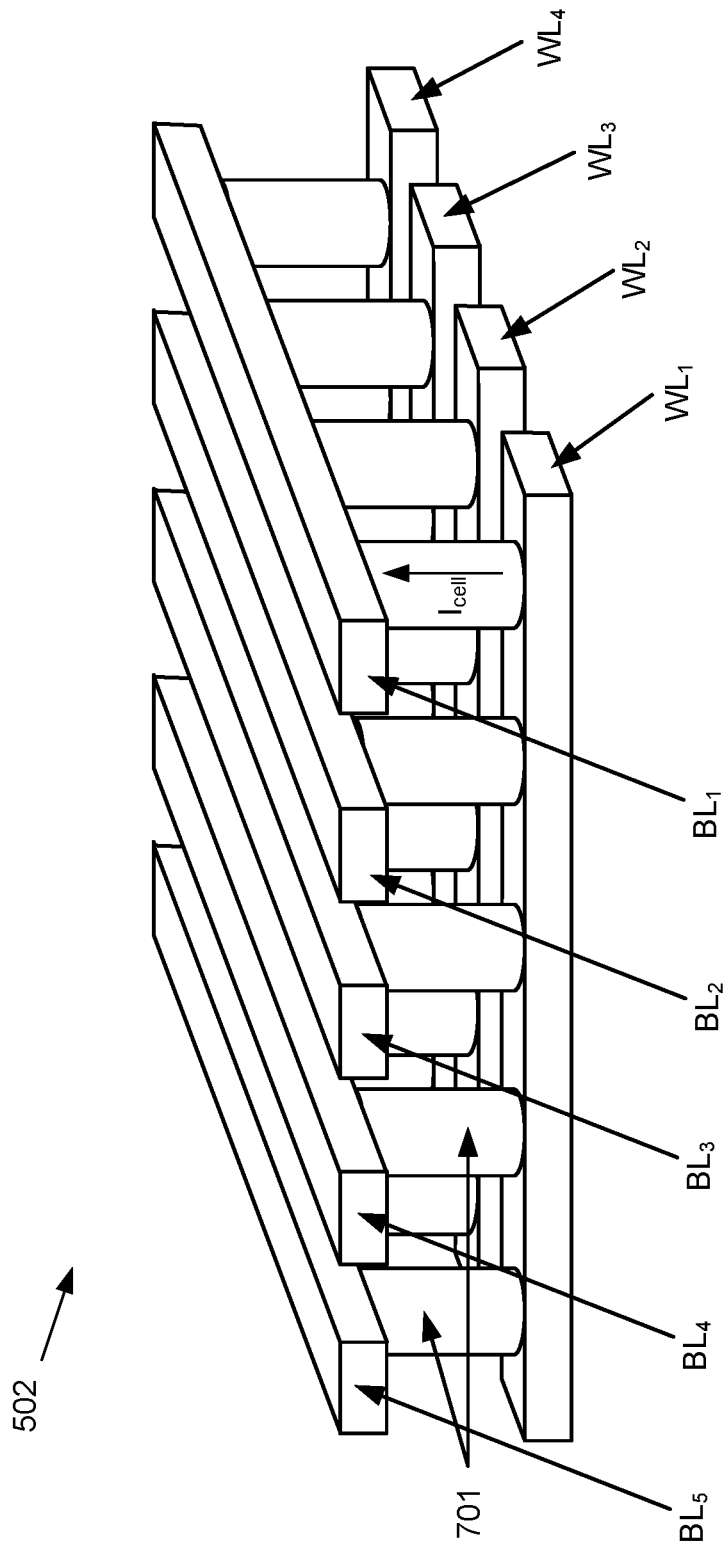
FIG. 7A depicts one embodiment of a portion of a memory array that forms a cross-point architecture in an oblique view.

FIG. 7A depicts one embodiment of a portion of a memory array that forms a cross-point architecture in an oblique view. Memory array 502 of FIG. 7A is one example of an implementation for memory array 502 in FIG. 5A or 5B, where a memory die 292 or memory structure die 580 can include multiple such array structures. The memory array 502 may be included in local memory 106 or host memory 124. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction. FIG. 7A is an example of a horizontal cross-point structure in which word lines $WL_1$-$WL_5$ and $BL_1$-$BL_5$ both run in a horizontal direction relative to the substrate, while the memory cells, two of which are indicated at 701, are oriented so that the current through a memory cell (such as shown at $I_{cell}$) runs in the vertical direction. In a memory array with additional layers of memory cells, such as discussed below with respect to FIG. 7D, there would be corresponding additional layers of bit lines and word lines.

As depicted in FIG. 7A, memory array 502 includes a plurality of memory cells 701. The memory cells 701 may include re-writeable memory elements, such as can be implemented using ReRAM, MRAM, PCM, or other material with a programmable resistance. A memory cell that includes a MRAM memory element will be simply denoted as an MRAM memory cell. The memory cells 701 may also include selector elements, such as can be implemented using an Ovonic Threshold Switch (OTS), Volatile Conductive Bridge (VCB), Metal-Insulator-Metal (MIM), or other material that provides a highly non-linear dependence of current on select voltage. The following discussion will focus on memory cells composed of an MRAM memory elements combined in series with an Ovonic Threshold switch, although much of the discussion can be applied more generally. The current in the memory cells of the first memory level is shown as flowing upward as indicated by arrow Ica', but current can flow in either direction, as is discussed in more detail in the following.

Figure 7B:
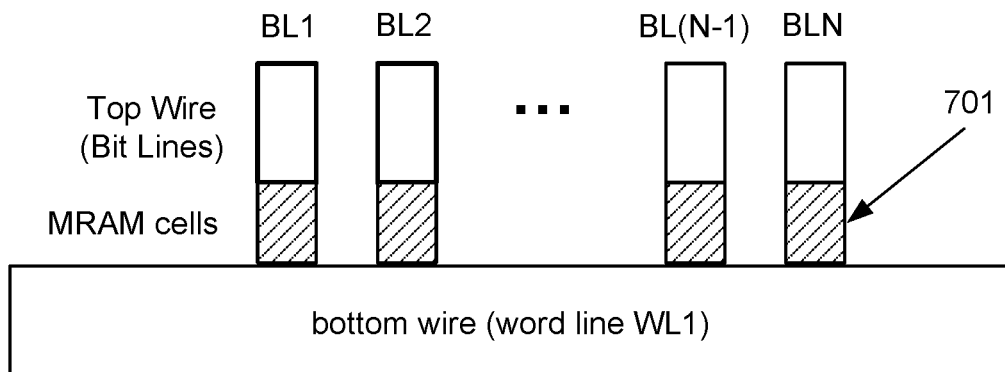
FIGS. 7B and 7C respectively present side and top views of the cross-point structure in FIG. 7A.
Figure 7C:
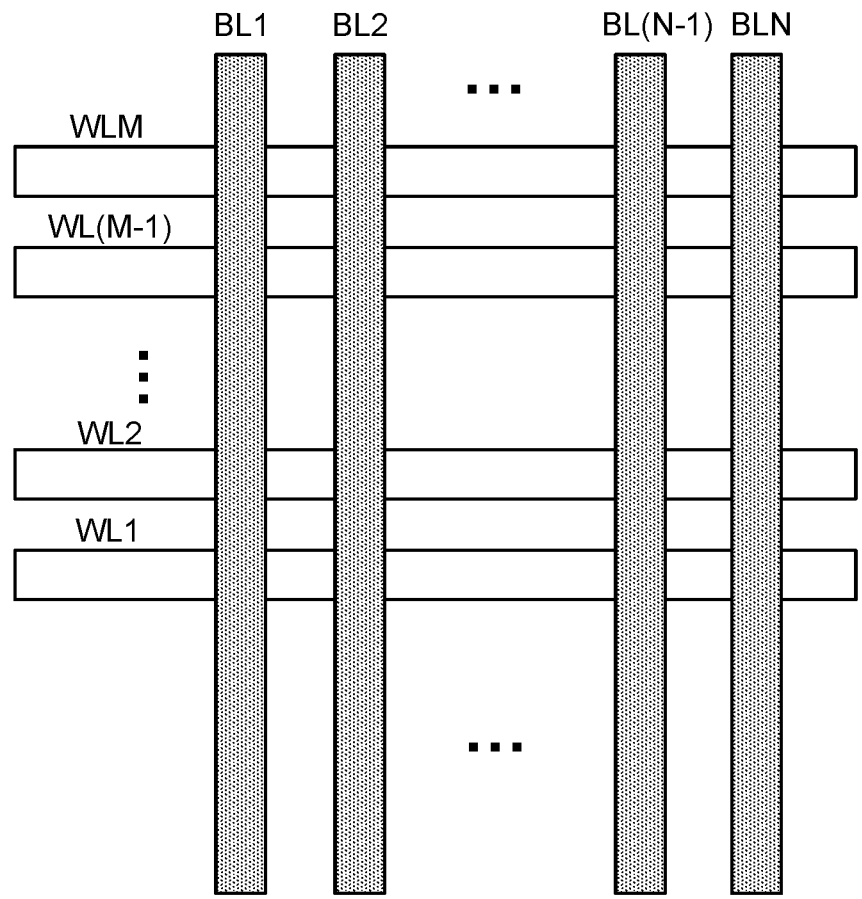

FIGS. 7B and 7C respectively present side and top views of the cross-point structure in FIG. 7A. The sideview of FIG. 7B shows one bottom wire, or word line, $WL_1$ and the top wires, or bit lines, $BL_1$-$BL_n$. At the cross-point between each top wire and bottom wire is an MRAM memory cell 701, although PCM, ReRAM, FeRAM, or other technologies can be used as the memory element. FIG. 7C is a top view illustrating the cross-point structure for M bottom wires $WL_1$-$WL_M$ and N top wires $BL_1$-$BL_N$. In a binary embodiment, the MRAM cell at each cross-point can be programmed into one of two resistance states: high and low. More detail on embodiments for an MRAM memory cell design and techniques for their reading are given below. In some embodiments, sets of these wires are arrayed continuously as a "tile", and such tiles may be paired adjacently in the Word Line (WL) direction and orthogonally in the Bit Line direction to create a module. Such a module may be composed of 2×2 tiles to form a four tile combination wherein the WL drivers between the tiles is "center driven"

between the tiles with the WL running continuously over the driver at the approximate center of the line. Similarly, BL drivers may be located between the pair of tiles paired in the BL direction to be center driven, whereby the driver and its area is shared between a pair of tiles. One embodiment of a module having four tiles is shown in FIG. 12B, which will be discussed below.

The cross-point array of FIG. 7A illustrates an embodiment with one layer of word lines and bits lines, with the MRAM or other memory cells sited at the intersection of the two sets of conducting lines. To increase the storage density of a memory die, multiple layers of such memory cells and conductive lines can be formed. A two-layer example is illustrated in FIG. 7D.

Figure 7D:
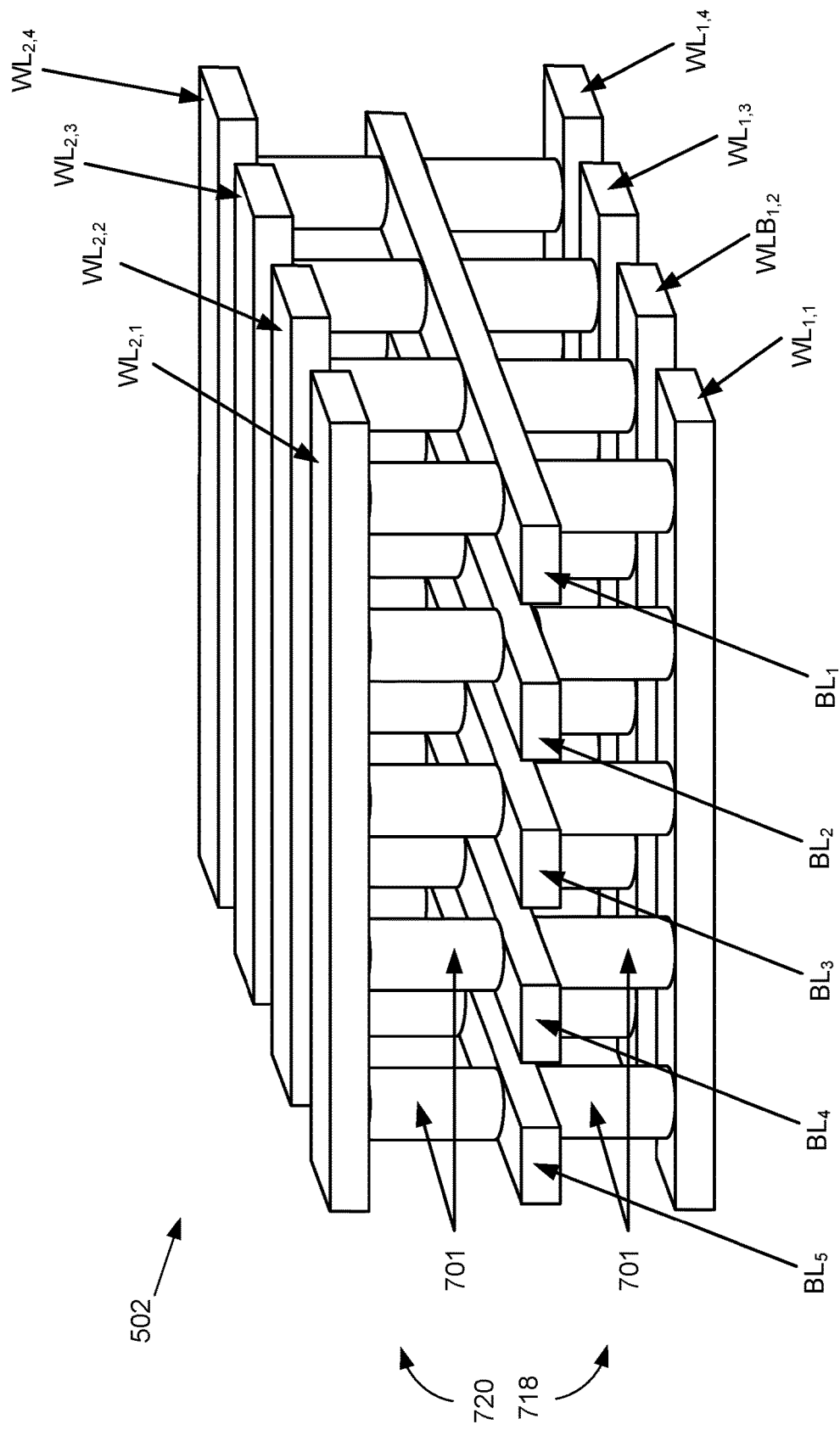
FIG. 7D depicts an embodiment of a portion of a two-level memory array that forms a cross-point architecture in an oblique view.

FIG. 7D depicts an embodiment of a portion of a two-level memory array that forms a cross-point architecture in an oblique view. As in FIG. 7A, FIG. 7D shows a first layer 718 of memory cells 701 of an array 502 connected at the cross-points of the first layer of word lines $WL_{1,1}$-$WL_{1,4}$ and bit lines $BL_1$-$BL_5$. A second layer of memory cells 720 is formed above the bit lines $BL_1$-$BL_5$ and between these bit lines and a second set of word lines $WL_{2,1}$-$WL_{2,4}$. Although FIG. 7D shows two layers, 718 and 720, of memory cells, the structure can be extended upward through additional alternating layers of word lines and bit lines. Depending on the embodiment, the word lines and bit lines of the array of FIG. 7D can be biased for read or program operations such that current in each layer flows from the word line layer to the bit line layer or the other way around. The two layers can be structured to have current flow in the same direction in each layer for a given operation or to have current flow in the opposite directions by driver selection in the positive or negative direction.

The use of a cross-point architecture allows for arrays with a small footprint and several such arrays can be formed on a single die. The memory cells formed at each cross-point can be a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used in the memory die 292 of FIG. 4, the local memory 106 in FIG. 1, and/or the host memory 124 in FIG. 1. Resistive type memory cells can be formed according to many of the technologies mentioned above, such as ReRAM, PCM, FeRAM, or MRAM. The following discussion is presented mainly in the context of memory arrays using a cross-point architecture with binary valued MRAM memory cells, although much of the discussion is more generally applicable.

Figure 8:
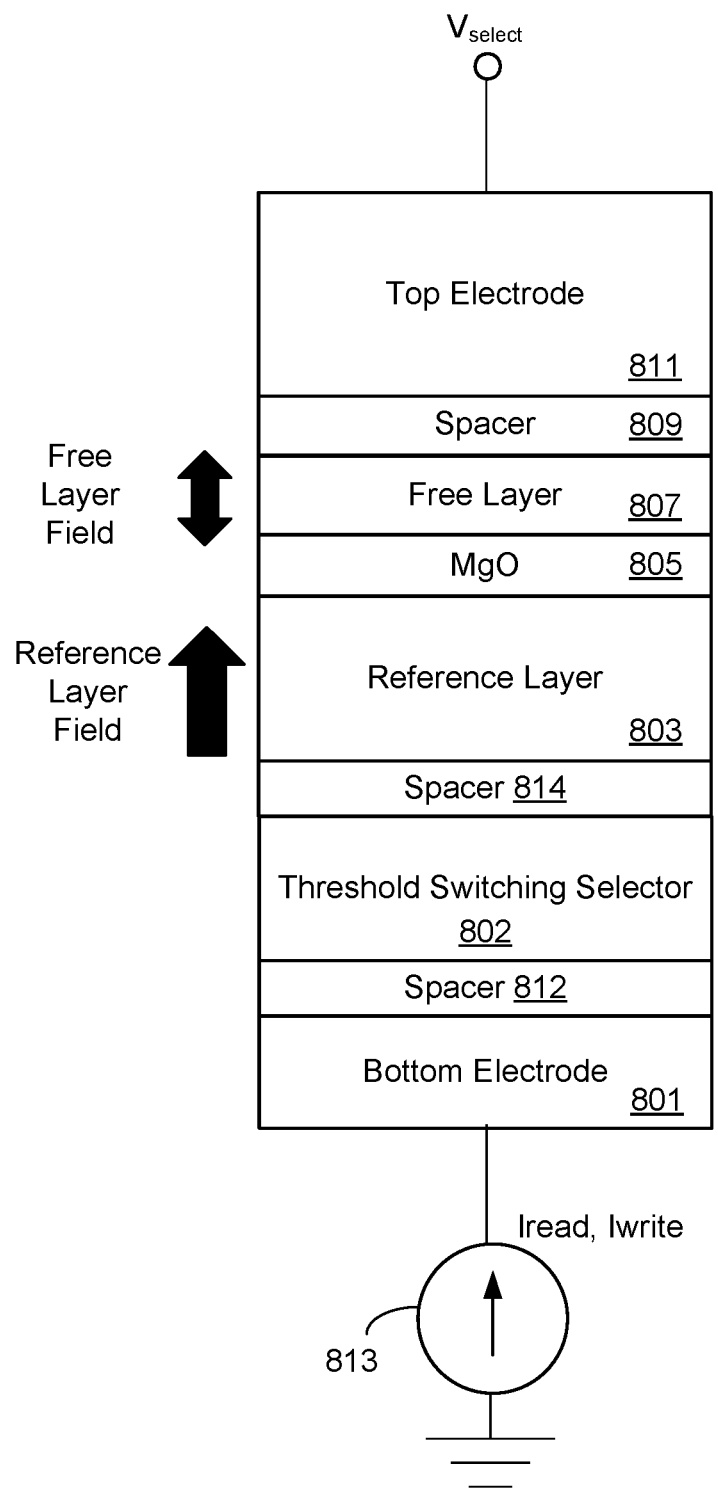
FIG. 8 illustrates an embodiment for the structure of an MRAM memory cell, here for example the selected cell is driven by a current source to read or write.

FIG. 8 illustrates an embodiment for the structure of an MRAM cell. The MRAM cell includes a bottom electrode 801, spacer 812, a threshold switching selector 802, spacer 814, a pair of magnetic layers (reference layer 803 and free layer 807) separated by a separation or tunneling layer of, in this example, magnesium oxide (MgO) 805, and then a top electrode 811 separated from the free layer 807 by a spacer 809. In another embodiment, the locations of the reference layer 803 and free layer 807 are switched, with the reference layer 803 on top of MgO 805, and the free layer 807 below MgO 805. In another embodiment, the location of the threshold switching selector 802 is between the free layer 807 and the top electrode 811.

In some embodiments, the bottom electrode 801 is referred to as a word line and the top electrode 811 is referred to as a bit line. In other embodiments, the bottom electrode 801 is referred to as a bit line and the top electrode 811 is referred to as a word line. The state of the memory cell is based on the relative orientation of the magnetizations of the reference layer 803 and the free layer 807: if the two layers are magnetized in the same direction, the memory cell will be in a parallel (P) low resistance state (LRS); and if they have the opposite orientation, the memory cell will be in an anti-parallel (AP) high resistance state (HRS). An MLC embodiment would include additional intermediate states. The orientation of the reference layer 803 is fixed and, in the example of FIG. 8, is oriented upward. Reference layer 803 is also known as a fixed layer or pinned layer. The reference layer 803 can be composed of multiple ferromagnetic layers coupled anti-ferromagnetically in a structure commonly referred to a synthetic anti-ferromagnet or SAF for short.

Data is written to an MRAM memory cell by programming the free layer 807 to either have the same orientation or opposite orientation. An array of MRAM memory cells may be placed in an initial, or erased, state by setting all of the MRAM memory cells to be in the low resistance state in which all of their free layers have a magnetic field orientation that is the same as their reference layers. Each of the memory cells is then selectively programmed (also referred to as "written") by placing its free layer 807 to be in the high resistance state by reversing the magnetic field to be opposite that of the reference layer 803. The reference layer 803 is formed so that it will maintain its orientation when programming the free layer 807. The reference layer 803 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the cell.

The threshold switching selector 802 has a high resistance (in an off or non-conductive state) until it is biased to a voltage higher than its threshold voltage or current above its threshold current, and until its voltage bias falls below Vhold ("Voffset") or current below Ithreshold. After Vt is exceeded and while Vhold is exceeded across the switching selector, the switching selector has a low resistance (in an on or conductive state). The threshold switching selector remains on until its current is lowered below a holding current Ihold, or the voltage is lowered below a holding voltage, Vhold. When this occurs, the threshold switching selector returns to the off (higher) resistance state. Accordingly, to program a memory cell at a cross-point, a voltage is applied which is sufficient to turn on the associated threshold switching selector and set or reset the memory cell; and to read a memory cell, the threshold switching selector similarly is activated by being turned on before the resistance state of the memory cell can be determined. One set of examples for a threshold switching selector is an ovonic threshold switching material of an Ovonic Threshold Switch (OTS). Example threshold switching materials include Ge—Se, Ge—Se—N, Ge—Se—As, Ge—Se—Sb—N, Ge58Se42, $GeTe_6$, Si—Te, Zn—Te, C—Te, B—Te, Ge—As—Te—Si—N, Ge—As—Se—Te—Si and Ge—Se—As—Te, with atomic percentages ranging from a few percent to more than 90 percent for each element. In an embodiment, the threshold switching selector is a two terminal device. The threshold switching selector 802 can also contain additional conducting layers on the interface with the reference layer 803. For example, spacer 814 is depicted between switching selector 802 and reference layer 803. The spacer layer 814 on the interface with reference layer 803 can be a single conducting layer or composed of multiple conducting layers. The threshold switching selector 802 can also contain additional conducting layers on the interface with the bottom electrode 801. For example, spacer 812 is depicted between switching selector 802 and reference layer 803. The spacer layer 812 on the interface with bottom electrode 801 can be a single conducting layer or composed of multiple conducting layers. Examples of conducting layers adjacent to the OTS include carbon, carbon nitride, carbon silicide, carbon tungsten, titanium, titanium nitride, tungsten, tungsten nitride, tantalum, tantalum nitride, and others. Threshold voltage switches have a Threshold Voltage (Vt) above which the resistance of the device changes substantially from insulating, or quasi insulating, to conducting.

In the embodiment of FIG. 8, a current-force approach is used to access the MRAM cell. The current-force approach may be used to read or write the MRAM cell. In the current-force approach, an access current (e.g., $I_{read}$ or $I_{write}$) is driven through the electrode 801 by a current source 813. The current source 813 is a part of the row driver circuitry for the electrode 801. A voltage (e.g., $V_{select}$) is provided to the electrode 811. An access current is driven through a portion of a first conductive line (e.g., word line), through a selected memory cell, and through a portion of a second conductive line (e.g., bit line). Herein, the terms "read current" ($I_{read}$) and "write current" ($I_{write}$) will be used in connection with access currents that are driven through MRAM cells. The write current will change the state of the MRAM cell. As an example, a write current of about 30 uA for 50 ns may be used for an MRAM cell with a Critical Dimension (CD) of approximately 20 nanometers with RA10Ω·µm². Read currents may be about half the write current if applied for a limited time, such as <20 ns. A write current that flows in one direction through the MRAM cell will change an AP-state MRAM cell from the AP-state to the P-state. A write current that flows in the other direction through the MRAM cell will change a P-state MRAM cell from the P-state to the AP-state. In general, a read current will preferably be set low enough and the read duration short enough so as not to change the state of an MRAM cell from the P-state to the AP-state or from the AP-state to the P-state.

As discussed more fully below in connection with FIG. 10B, in some embodiments, a read current may be applied in an P2AP direction or, alternatively, in a AP2P direction. In some embodiments, the MRAM cell is read by performing an SRR (self-referenced-read). The SRR operation can include two read operations and two write operations that allow direct comparison of the initial bit state resistance to the bit's resistance in a known programmed state, followed by a recovery of the initial bit state by re-writing if it was different from the initial state after first write. In one embodiment, an SRR has a first read (Read1 in the P2AP direction), a first write (Write 1 to the AP-state), and a second read (Read2 in the P2AP direction), followed by optional second write (Write 2 to the P-state for bits initially in the P-state). The voltage level of the memory cell due to Read1 in the P2AP direction is stored, for example on a capacitor; or by conversion to digital bits by an Analog to Digital converter and the bits stored in memory, for example in SRAM until after use in Read2. The state stored on a capacitor can be adjusted 150 mv positive or negative by forcing a voltage on one terminal of a capacitor connected to the storage capacitor. Or the digital stored level can be adjusted by digitally adding or subtracting 150 mV to the stored bits.

Next the memory cell is written to the AP-state (Write 1). The sensed voltage level due to Read2 in the P2AP direction (after a Write 1) is compared with the voltage level stored and adjusted from Read1, both Read1 and Read2 done in the P2AP direction. An adequate change in the voltage level between Read2 and Read1, for example more than 150 mV, indicates that the MRAM cell was originally in the P-state. If the change in voltage is less than 150 mV, the MRAM cell was originally in the AP state (to which write was directing the bit state). An optional Write 2 of the bit AP2P is performed if the bit was originally in the P state and switched to the AP state by Write 1. Alternatively, the SRR has a first read (Read1 in the AP2P direction), a first (Write 1 to the P-state), and a second read (Read2 in the AP2P direction). The voltage level of the memory cell due to Read1 in the AP2P direction is stored and adjusted by, for example −150 mV. Next the memory cell is written to the P-state (Write 1). The voltage level due to Read2 in the AP2P direction is compared with the adjusted voltage level due to Read1 in the AP2P direction. An adequate change in the voltage level indicates that the MRAM cell was originally in the AP-state. An optional Write 2 is performed if the bit was originally in the AP state and switched to the P state by Write 1. In some embodiments, the same polarity is used for Read1, Write1, and Read2, which avoids switching the selector off between Read1 and Read2. In some embodiments Write 2 is delayed and performed only after other operations are performed. In some embodiments the Write 1 is performed by extending the duration of the read current applied during Read 1.

In one embodiment, the MRAM cell is read by applying, for example, 0V to the electrode 811, while driving a current of, for example, 15 micro-Amperes (µA) through the electrode 801. This read current will flow from the electrode 801 to the electrode 811. Note that the read may be Read1 or Read2 in the P2AP direction. P2AP means current flows in the direction that would write the bit from P to AP or AP to AP. In some embodiments, data is written to the MRAM cell using a bipolar write operation. In one embodiment, the MRAM cell is written from the AP-state to the P-state by applying, for example, 3V to the electrode 811, while driving a write current of, for example, −30 µA through the electrode 801. This write current will flow from the one electrode 811 to the other electrode 801. In one embodiment, the MRAM cell is written from the P-state to the AP-state by applying, for example, 0V to the one electrode 811, while driving a current of, for example, 30 µA through the other electrode 801. This write current will flow from electrode 801 to the electrode 811.

As an alternative to the approach in FIG. 8, the select voltage can be applied to the electrode 801, with the access current applied through the electrode 811. In one such embodiment, the MRAM cell is read by applying, for example, 3V to one electrode 801, while driving a read current of, for example, −15 µA through the other electrode 811. This read current will flow from electrode 801 to the top electrode 811.

Figure 9:
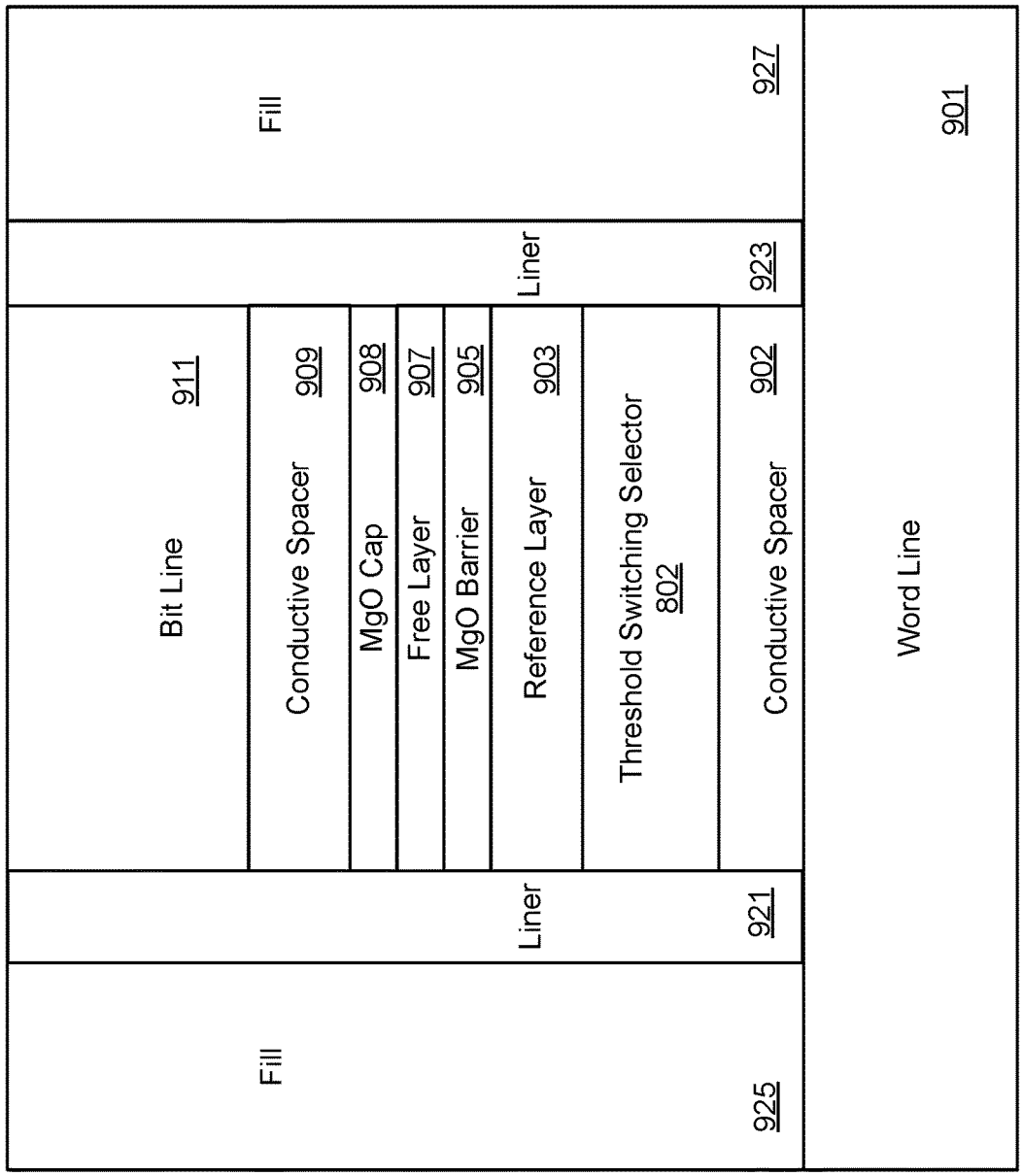
FIG. 9 illustrates an embodiment for an MRAM memory cell design as it would be implemented in a cross-point array in more detail.

In one embodiment, the MRAM cell is written from the AP-state to the P-state by applying, for example, −3V to the bottom electrode 801, while driving a write current of, for example, 30 µA through the top electrode 811. The electron current will flow from the bottom electrode 801 to the top electrode 811. In one embodiment, the MRAM cell is written from the P-state to the AP-state by applying, for example, 0V to the bottom electrode 801, while driving a current of, for example, −30 µA through the top electrode 811. The electron current will flow from the top electrode 811 to the bottom electrode 801 The duration that the read current is applied can be substantially different from the duration that the write current is applied. For example, the read current can be applied for 20 ns, while the write current can be applied for 50 ns, before the current through the cell is reduced to zero or an amount that has a negligible chance of disturbing the cell for the duration it will be applied. The durations of the write and read current can also be the same or substantially similar, such as 20 ns, for example. Each Read can be performed at considerably less applied current than Write, such as 10 ua and 40 ua, respectively. In this discussion it is also understood that the direction of the current polarity to switch the magnetization of the bit into the P or AP state can vary based on reference layer design and the location of the reference layer with respect the free layer FIG. 9 illustrates an embodiment for an MRAM memory cell design as it may be implemented in a cross-point array in more detail. When placed in a cross-point array, the top and bottom electrodes of the MRAM memory cells will be the top and bottom wires of the array. In the embodiment shown here, the bottom electrode is the word line 901 and the top electrode is the bit line 911 of the memory cell, but these can be reversed in other embodiments. Between the word line 901 and bit line 911 are the reference layer 903 and free layer 907, which are again separated MgO barrier 905. In the embodiment shown in FIG. 9, an MgO cap 908 is also formed on top of the free layer 907 and a conductive spacer 909 is formed between the bit line 911 and the MgO cap 908. The reference layer 903 is separated from the word line 901 by another conductive spacer 902. A threshold switching selector 802 may reside between the reference layer 903 and the conductive spacer 902. On either side of the memory cell structure is a liner 921 and 923, where these can be part of the same structure, but appear separate in the cross-section of FIG. 9. To either side of the liner 921, 923 is shown some of fill material 925, 927 used to fill in the otherwise empty regions of the cross-point structure.

With respect to the free layer design 907, embodiments include CoFe or CoFeB Alloy with a thickness on the order ~1-2 nm, where an Ir layer can be interspersed in the free layer close to MgO barrier 905 and the free layer 907 can be doped or interspersed with Ta, W, or Mo. Embodiments for the reference layer 903 can include a bilayer of CoFeB and Co/Pt multilayer coupled with an Ir or Ru spacer, or a combination or alloy of both 902. The MgO cap 908 is optional but can be used to increase anisotropy and reduce the critical switching current of free layer 907. The conductive spacers can be conductive metals such as Ta, W, Ru, CN, TiN, and TaN, among others. The free-layer can also be a composite free layer composed of multiple free-layers with conductive layers in between, such as W, Ta, W, or tunneling layers in between, such as MgO.

The following discussion will mainly be discussed with respect to a perpendicular spin transfer torque MRAM memory cell, where the free layer 807/907 of FIGS. 8 and 9 comprises a switchable direction of magnetization that is perpendicular to the plane of the free layer. Spin transfer torque ("STT") is an effect in which the orientation of a magnetic layer in a magnetic tunnel junction (MJT) can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (the reference layer), a spin-polarized current can be produced. If this spin-polarized current is injected into a second magnetic layer (the free layer), angular momentum can be transferred to this second magnetic layer, changing the direction of magnetization of the second magnetic layer. This is referred to as spin transfer torque. FIGS. 10A and 10B illustrate the use of spin transfer torque to program or write to MRAM memory. Spin transfer torque magnetic random access memory (STT MRAM) has the advantages of lower power consumption and better scalability over other MRAM variations. Compared to other MRAM implementations, such as toggle MRAM, the STT switching technique requires relatively low power, virtually eliminates the problem of adjacent bit disturbs, and has more favorable scaling for higher memory cell densities (reduced MRAM cell size). The latter issue also favors STT MRAM where the free and reference layer magnetizations are orientated perpendicular to the film plane, rather than in-plane.

As the STT phenomenon is more easily described in terms electron behavior, FIGS. 10A and 10B and their discussion is given in terms of electron current, where the direction of the write current is defined as the direction of the electron flow. Therefore, the term write current in reference to FIGS. 10A and 10B refers to an electron current. As electrons are negatively charged, the electron current will be in the opposite direction from the conventionally defined current, so that an electron current will flow from a lower voltage level towards a higher voltage level instead the conventional current flow of from a higher voltage level to a lower voltage level.

FIGS. 10A and 10B illustrate the writing of an MRAM memory cell by the STT mechanism, depicting a simplified schematic representation of an example of an STT-switching MRAM memory cell 1000 in which both the reference and free layer magnetization are in a perpendicular direction. Memory cell 1000 includes a magnetic tunnel junction (MTJ) 1002 comprising an upper ferromagnetic layer 1010, a lower ferromagnetic layer 1012, and a tunnel barrier (TB) 1014 as an insulating layer between the two ferromagnetic layers. In this example, upper ferromagnetic layer 1010 is the free layer FL and the direction of its magnetization can be switched. Lower ferromagnetic layer 1012 is the reference (or fixed) layer RL and the direction of its magnetization cannot be switched. When the magnetization in free layer 1010 is parallel to the magnetization in reference layer RL 1012, the resistance across the memory cell 1000 is relatively low. When the magnetization in free layer FL 1010 is anti-parallel to the magnetization in reference layer RL 1012, the resistance across memory cell 1000 is relatively high. The data ("0" or "1") in memory cell 1000 is read by measuring the resistance of the memory cell 1000, such as by forcing. In this regard, electrical conductors 1006/1008 attached to memory cell 1000 are utilized to read the MRAM data. By design, both the parallel and antiparallel configurations remain stable in the quiescent state and/or during a read operation (at sufficiently low read current).

For both the reference layer RL 1012 and free layer FL 1010, the direction of magnetization is in the perpendicular direction (i.e. perpendicular to the plane defined by the free layer and perpendicular to the plane defined by the reference layer). FIGS. 10A and 10B show the direction of magnetization of reference layer RL 1012 as up and the direction of magnetization of free layer FL 1010 as switchable between up and down, which is perpendicular to the plane.

In one embodiment, tunnel barrier 1014 is made of Magnesium Oxide (MgO); however, other materials can also be used. Free layer 1010 is a ferromagnetic metal that possess the ability to change/switch its direction of magnetization. Multilayers based on transition metals like Co, Fe and their alloys can be used to form free layer 1010. In one embodiment, free layer 1010 comprises an alloy of Cobalt, Iron and Boron. Reference layer 1012 can be many different types of materials including (but not limited to) multiple layers of Cobalt and Platinum and/or an alloy of Cobalt and Iron.

To "set" the MRAM memory cell bit value (i.e., choose the direction of the free layer magnetization), an electron current 1050 is applied from conductor 1008 to conductor 1006, as depicted in FIG. 10A (hence current flows in the opposite direction). To generate the electron current 1050, the top conductor 1006 is placed at a higher voltage level than bottom conductor 1008, due the negative charge of the electron. The electrons in the electron current 1050 become spin-polarized as they pass through reference layer 1012 because reference layer 1012 is a ferromagnetic metal. When the spin-polarized electrons tunnel across the tunnel barrier 1014, conservation of angular momentum can result in the imparting of a spin transfer torque on both free layer 1010 and reference layer 1012, but this torque is inadequate (by design) to affect the magnetization direction of the reference layer 1012. Contrastingly, this spin transfer torque is (by design) sufficient to switch the magnetization orientation in the free layer 1010 to become parallel (P) to that of the reference layer 1012 if the initial magnetization orientation of the free layer 1010 was anti-parallel (AP) to the reference layer 1012, referred to as an anti-parallel-to-parallel (AP2P) write. The parallel magnetizations will then remain stable before and after such electron current is turned off.

In contrast, if free layer 1010 and reference layer 1012 magnetizations are initially parallel, the direction of magnetization of free layer 1010 can be switched to become antiparallel to the reference layer 1012 by application of an electron current of opposite direction to the aforementioned case. For example, electron current 1052 is applied from conductor 1006 to conductor 1008, as depicted in FIG. 10B, by placing the higher voltage level on the lower conductor 1008. This will write a free layer 1010 in a P state to an AP state, referred to as a parallel-to-anti-parallel (P2AP) write. Thus, by way of the same STT physics, the direction of the magnetization of free layer 1010 can be deterministically set into either of two stable orientations by judicious choice of the electron current direction (polarity).

The data ("0" or "1") in memory cell 1000 can read by measuring the resistance of the memory cell 1000. Low resistance typically represents a "0" bit and high resistance typically represents a "1" bit, although sometimes the alternate convention occurs. A read current can be applied across the memory cell (e.g., across the MJT 1002) by applying an electron current from conductor 1008 to conductor 1006, flowing as shown for 1050 in FIG. 10A (the "AP2P direction"); alternatively, the electron current can be applied from conductor 1006 to conductor 1008, flowing as shown for 1052 in FIG. 10B (the "P2AP direction"). As is well-understood, the electron current flows in the opposite direction as conventionally defined current. In a read operation, if the electron current is too high, this can disturb data stored in a memory cell and change its state. For example, if electron current Read1 uses the P2AP direction of FIG. 10B, too high of a current or voltage level can switch any memory cells in the low resistance P state into the high resistance AP state before the bit voltage during Read1 is stored. Consequently, although the MRAM memory cell can be read in either direction, the directional nature of the write operation may make one read direction preferable over the other in various embodiments. For example, for a given read current, the error rate may be less doing SRR in the P2AP direction.

Although the discussion of FIGS. 10A and 10B was in the context of electron current for the read and write currents, the subsequent discussion will be in the context of conventional current unless otherwise specified.

Whether to read or write selected memory cells in the array structures of FIGS. 7A-7D, the bit line and word line corresponding a selected memory cell is biased to place a voltage across the selected memory cell, or a current through, and induce the flow of electrons as illustrated with respect to FIG. 10A or 10B. Note that herein, a "selected memory cell" means that the memory cell is selected for access (e.g., read access, write access). An "unselected memory cell" means that the memory cell is not selected for access by placing either its WL or BL or both at a voltage approximately midway between the maximum positive and minimum negative voltages across the memory cell. A given process may result in write currents that are about the same for forward versus reverse write of the MRAM, or it may be that writing from low resistance state (LRS) to high resistance state (HRS) requires 20% or more current for a CD of approximately 20 nm and RA10 $\Omega\mu m^2$.

Some biasing techniques may result in voltage across non-selected memory cells of the array, which can induce currents in non-selected memory cells. Although this wasted power consumption can be mitigated to some degree by designing the memory cells to have relatively high resistance levels for both high and low resistance states, this will still result in increased current and power consumption as well as placing additional design constraints on the design of the memory cells and the array. One approach to address this unwanted current leakage is to place a selector element in series with each MRAM or other resistive (e.g., ReRAM, PCM) memory cell. For example, a select transistor can be placed in series with each resistive memory cell element in FIGS. 7A-7D so that the memory cells 701 is now a composite of a select transistor and a programmable resistance. Use of a select transistor, however, requires the introduction of additional control lines and cell area to be able to turn on the corresponding transistor of a selected memory cell. Additionally, transistors will often not scale in the same manner as the resistive memory element write current, so that as memory arrays move to smaller sizes the use of transistor based selectors can be a limiting factor in reducing cost, for example. An alternate approach to select transistors is the use of a threshold switching selector (e.g., threshold switching selector 802) in series with the programmable resistive element. A two terminal threshold switching selector does not require the aforementioned additional control lines and cell area to be able to turn on the corresponding select transistor of a selected memory cell.

Figure 11A:
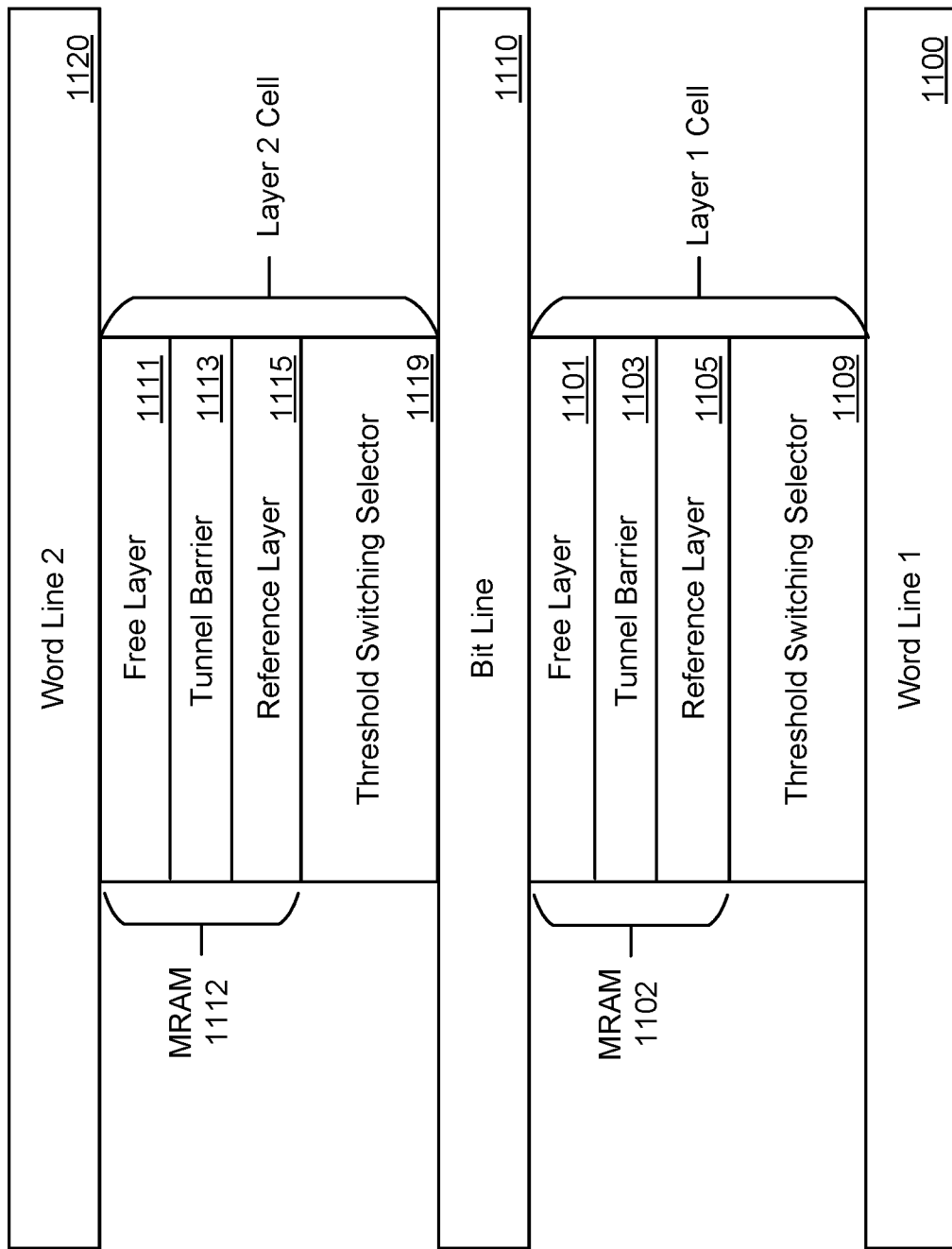
FIGS. 11A and 11B illustrate embodiments for the incorporation of threshold switching selectors into an MRAM memory array having a cross-point architecture.
Figure 11B:
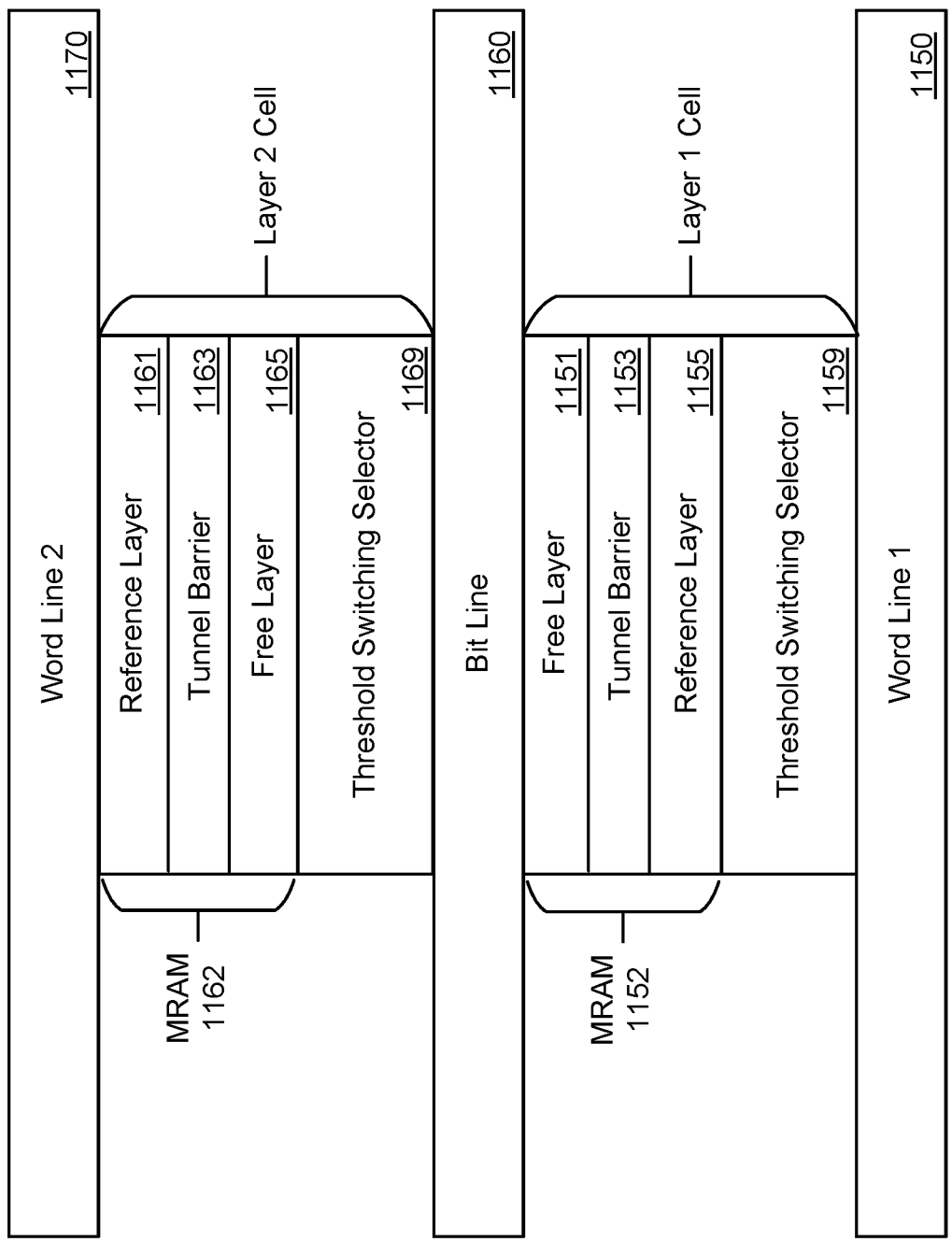

FIGS. 11A and 11B illustrate embodiments for the incorporation of threshold switching selectors into an MRAM memory array having a cross-point architecture. The examples of FIGS. 11A and 11B show two MRAM cells (Layer 1 Cell, Layer 2 Cell) in a two layer cross-point array, such as shown in FIG. 7D, but in a side view. FIGS. 11A and 11B show a lower first conducting line of word line 1 1100, an upper first conducting line of word line 2 1120, and an intermediate second conducting line of bit line 1110. In these figures, all of these lines are shown running left to right across the page for ease of presentation, but in a cross-point array they would be more accurately represented as in the oblique view of FIG. 7D where the word lines, or first conducting lines or wires, run in one direction parallel to the surface of the underlying substrate and the bit lines, or second conducting lines or wires, run in a second direction parallel to the surface to the substrate that is largely orthogonal to the first direction. The MRAM memory cells are also represented in a simplified form, showing only the reference layer, free layer, and the intermediate tunnel barrier, but in an actual implementation would typically include the additional structure described above with respect to FIG. 9.

An MRAM element 1102 including free layer 1101, tunnel barrier 1103, and reference layer 1105 is formed above the threshold switching selector 1109, where this series combination of the MRAM element 1102 and the threshold switching selector 1109 together form the layer 1 cell between the bit line 1110 and word line 1 1100. The series combination of the MRAM element 1102 and the threshold switching selector 1109 operate largely as described above with respect to FIGS. 10A and 10B when the threshold switching selector 1109 is turned on. Initially, though, the threshold switching selector 1109 needs to be turned on by applying a voltage above the threshold voltage Vth of the threshold switching selector 1109, and then the biasing current or voltage needs to be maintained high enough above the holding current or holding voltage of the threshold switching selector 1109 so that it stays on during the subsequent read or write operation.

On the second layer, an MRAM element 1112 includes free layer 1111, tunnel barrier 1113, and reference layer 1115 is formed above the threshold switching selector 1119, with the series combination of the MRAM element 1112 and the threshold switching selector 1119 together forming the layer 2 cell between the bit line 1110 and word line 2 1120. The layer 2 cell will operate as for the layer 1 cell, although the lower conductor now corresponds to a bit line 1110 and the upper conductor is now a word line, word line 2 1120. Additional paired layers may similarly share another bit line between them, having a pattern of WL1, BL1, WL2; WL3, BL2, WL4; or have separate bit lines in a pattern such as WL1, BL1, WL2, BL2.

In the embodiment of FIG. 11A, the threshold switching selector 1109/1119 is formed below the MRAM element 1102/1112, but in alternate embodiments the threshold switching selector can be formed above the MRAM element for one or both layers. As discussed with respect to FIGS. 10A and 10B, the MRAM memory cell is directional. In FIG. 11A, the MRAM elements 1102 and 1112 have the same orientation, with the free layer 1101/1111 above (relative to the unshown substrate) the reference layer 1105/1115. Forming the layers between the conductive lines with the same structure can have a number of advantages, particularly with respect to processing as each of the two layers, as well as subsequent layers in embodiments with more layers, can be formed according to the same processing sequence.

FIG. 11B illustrates an alternate embodiment that is arranged similarly to that of FIG. 11A, except that in the layer 2 cell the locations of the reference layer and free layer are reversed. More specifically, between word line 1 1150 and bit line 1160, as in FIG. 11A the layer cell 1 includes an MRAM element 1 having a free layer 1151 formed over tunnel barrier 1153, that is turn formed over the reference layer 1155, with the MRAM element 1152 formed over the threshold switching selector 1159. The second layer of the embodiment of FIG. 11B again has an MRAM element 1162 formed over a threshold switching selector 1169 between the bit line 1160 and word line 2 1170, but, relative to FIG. 11A, with the MRAM element 1162 inverted, having the reference layer 1161 now formed above the tunnel barrier 1163 and the free layer 1165 now under the tunnel barrier 1163. Alternatively, the configuration of MRAM cell 1162 may be used for the Layer 1 cell and the configuration of MRAM cell 1152 may be used for the Layer 2 cell.

Although the embodiment of FIG. 11B requires a different processing sequence for the forming of layers, in some embodiments it can have advantages. In particular, the directionality of the MRAM structure can make the embodiment of FIG. 11B attractive since when writing or reading in the same direction (with respect to the reference and free layers) the bit line will be biased the same for both the lower layer and the upper layer, and both word lines will be biased the same. For example, if both layer 1 and layer 2 memory cells are sensed in the P2AP direction (with respect to the reference and free layers), the bit line layer 1160 will be biased such as in the P2AP direction, the bit line 1160 is biased low (e.g., 0V) for both the upper and lower cell, with word line 1 1150 and word line 2 1170 both biased to a higher voltage level. Similarly, with respect to writing, for writing to the high resistance AP state the bit line 1160 is biased low (e.g., 0V) for both the upper and lower cell, with word line 1 1150 and word line 2 1170 both biased to a higher voltage level; and for writing to the low resistance P state the bit line 1160 is biased to the high voltage level, with word line 1 1150 and word line 2 1170 both biased to the low voltage level. In contrast, for the embodiment of FIG. 11A, the bit lines and word lines would need to have their bias levels reversed for performing any of these operations on the upper level relative to the lower level. Note that in one embodiment of a current-force approach the word lines are biased to a target voltage by driving a current through the word line.

To either read data from or write data to an MRAM memory cell involves passing a current through the memory cell. In embodiments where a threshold switching selector is placed in series with the MRAM element, before the current can pass through the MRAM element the threshold switching selector needs to be turned on by applying a sufficient voltage across and current through the series combination of the threshold switching selector and the MRAM element.

Figure 12:
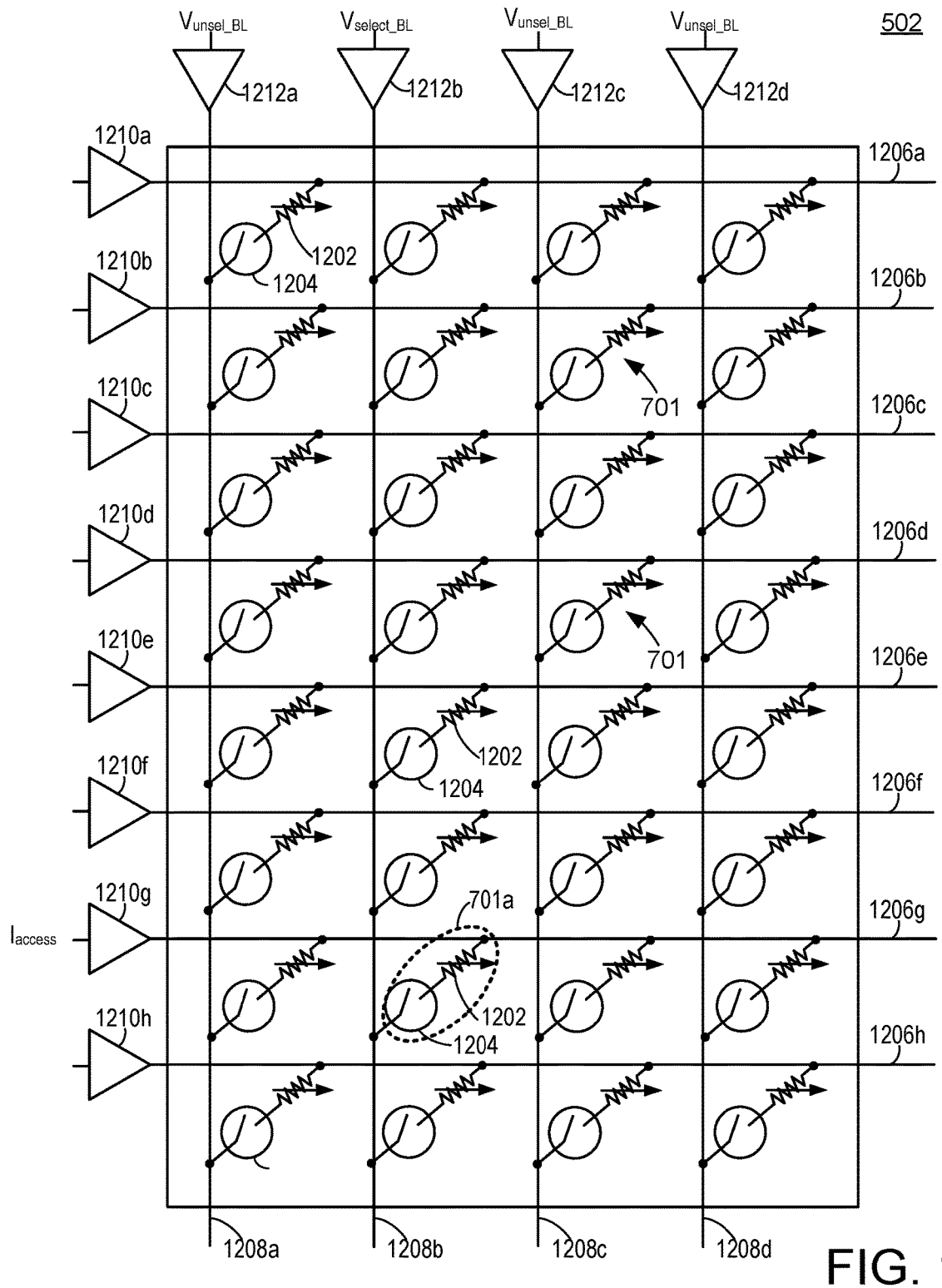
FIG. 12 depicts an embodiment of a memory array having a cross-point architecture.

FIG. 12 depicts an embodiment of a memory array 502 having a cross-point architecture. The array 502 has a set of first conductive lines 1206a-1206h and a set of second conductive lines 1208a-1208d. In one embodiment, the set of first conductive lines 1206a-1206h are word lines and the set of second conductive lines 1208a-1208b are bit lines. For ease of discussion, the set of first conductive lines 1206a-1206h may be referred to as word lines and the set of second conductive lines 1208a-1208b may be referred to as bit lines. However, the set of first conductive lines 1206a-1206h could be bit lines and the set of second conductive lines 1208a-1208b could be word lines.

The array 502 has a number of memory cells 701. Each memory cell 701 is connected between one of the first conductive lines 1206 and a one of the second conductive lines 1208. Each memory cell 701 has a magnetoresistive random access memory (MRAM) element 1202 in series with a threshold switching selector element 1204. Hence, each memory cell ("bit") 701 may be referred to as an MRAM cell or bit. The threshold switching selector 1204 is configured to become conductive with lower resistance in response to application of a voltage level exceeding a threshold voltage of the threshold switching selector 1204, and remains conductive with lower resistance until the current through the switching selector 1204 is reduced below the selector holding current, Ihold. The threshold switching selector element 1204 is a two terminal device. In an embodiment, the threshold switching selector element 1204 comprises an OTS.

Each first conductive line 1206 may be driven by one of the WL drivers 1210a-1210h. For example, first conductive line 1206a may be driven by WL driver 1210a, first conductive line 1206b may be driven by WL driver 1210b, etc. Each second conductive line 1208 is driven by one of the BL drivers 1212a-1212d. For example, second conductive line 1208a is driven by BL driver 1212a, second conductive line 1208b is driven by BL driver 1212b, etc. In one embodiment, the word lines and the bit lines are driven from one end of the word line or bit line. FIG. 12A depicts such an embodiment in which the word lines and the bit lines are driven from one end. In an alternative embodiment, the bit lines and/or the word lines are driven from a midpoint. Driving a word line or bit line from a midpoint reduces the worst case IR drop.

Although a separate driver 1210 is depicted connected to each word line 1206, it is not required to have a separate driver 1210 for each word line. In one embodiment, the same driver can be used to provide the access current to whatever word line is presently selected. This driver may be connected to the selected word line by decode circuitry that selects the WL 1206 to be driven. The driver and decode circuitry may be connected to a "global node" (see global node VX in FIG. 20). However, locations of WL drivers 1210a-1210h in FIG. 12A may still indicate the location (e.g., end) of the word line that is driven.

For purpose of discussion, memory cell 701a is being selected for access. This could be a read or a write access. Selected memory cell 701a is at the cross-point of selected word line 1206g and selected bit line 1208b. The other memory cells not selected for access (i.e., are unselected memory cells). All other word lines and all other bit lines are unselected by forcing them to an unselect voltage, such as Vmid, for example 1.65V, at approximately one half the drive compliance voltage, for example 3.3V. To select a memory cell 701, a select voltage ($V_{select\_BL}$) such as near ground is provided to the selected bit line (e.g., bit line 1208b) and an access current is driven (or forced) through a selected word line (e.g., word line 1206g). The access current may flow between a portion of the selected word line, through the selected memory cell, and through a portion of the selected bit line. An unselect voltage ($V_{unsel\_BL}$) is provided to the unselected bit lines (e.g., bit lines 1208a, 1208c, 1208d). In one embodiment, $V_{select\_BL}$ has a magnitude such that the threshold switching selector 1204 in a selected memory cell will turn on, for example $V_{select\_BL}$ may be approximately 0V. On the other hand, $V_{unsel\_BL}$ has a magnitude such that the threshold switching selector 1204 in an unselected memory cell will not turn on, for example $V_{select\_BL}$ may be approximately 1.65V. Word line driver 1210g drives an access current ($I_{access}$) through at least a portion of selected word line 1206g. This access current may also flow through the selected memory cell 701a and in a portion of selected bit line 1208b. Such a selected WL may, for example, be driven high by 15 ua to read or 30 ua to write by a current source with compliance voltage of, for example 3.3V.

The WL drivers 1210 are configured to either source a current or sink a current. Thus, $I_{access}$ could flow in either direction through the selected word line (as well as the selected bit line). By convention used herein, when a current driver 1210 is used as a current source the magnitude of the access current is positive. By convention used herein, when a current driver 1210 is used as a current sink the magnitude of the access current is negative. Whether a current driver 1210 sources or sinks a current, herein this will be referred to as forcing the current through the selected word line. In one embodiment, no current other than leakage is forced through unselected word lines (e.g., 1206a, 1206b, 1206c, 1206d, 1206e, 1206f, and 1206h). Note that herein, a "selected word line" forced with, for example for a 20 nm CD, at 15 ua for read or 30 ua for write with voltage compliance of approximately 3.3V, means that the word line is connected to a selected memory cell, such cell further determined by its connection to a "selected" bit line at approximately 0V. To write the opposite polarity, the selected word line is forced, for example, with −15 ua. A selected word line may also be connected to unselected memory cells if the other cell terminal is connected to an unselected bit line at Vmid, such as 1.65V. An "unselected word line" means that the word line is connected to only unselected memory cells. In other words, all memory cells that connect to an unselected word line are unselected memory cells, for example when the unselected WL is forced at Vmid 1.65V; or when the unselected BL is forced at Vmid 1.65V, for example. Note that herein, a "selected bit line" means that the bit line at, for example, near 0V if reading and writing P2AP, or near Vp (~3.3V) if writing AP1P, is connected to at least one selected memory cell. An "unselected bit line" means that the bit line is connected to only unselected memory cells. In other words, all memory cells that connect to an unselected bit line are unselected memory cells. As noted above, a selected memory cell is a memory cell that is selected for access. A selected memory cell is connected between a selected word line and a selected bit line.

In one embodiment, the selected word line voltage is clamped to a voltage limit (voltage compliance) while driving an access current (current force) through a portion of the selected word line and through a portion of the selected bit line and into the selected memory cell. In other words, the voltage may be clamped such that it is not permitted to exceed a certain magnitude. Clamping the selected word line voltage when using a current-force read can lead to a lower bit error rate, while reducing stress on the memory cells.

In the example of FIG. 12 there are more word lines than bit lines in the cross-point array. In one embodiment, there are more bit lines than word lines in the cross-point array. In one embodiment, the number of bit lines equals the number of word lines in the cross-point array. In the example of FIG. 12 there are twice as many word lines as bit lines in the cross-point array; however, a different ratio could be used. Thereby, different tile sizes may be realized. For example, a tile may have 1024 BL by 2048 WL, which may be composed into a module of 2048×4096 cells by center driving the WL and BL between the four tiles.

In embodiments of a mixed read scheme, a current-force approach is used to access memory cells in a cross-point memory array. A current-force approach helps to automatically correct for IR drops due to varying word line resistance and/or varying bit line resistance. Threshold switching selectors may be used in series with the memory cells. The threshold switching selector is connected in series with the memory element between the word line and the bit line. Hence, any voltage across the switching selector will reduce the voltage across the memory element. Typically, there will be some variation in the offset voltage between the switching selectors. A current-force approach helps to mitigate offset voltage variation between threshold switching selectors.

Figure 13:
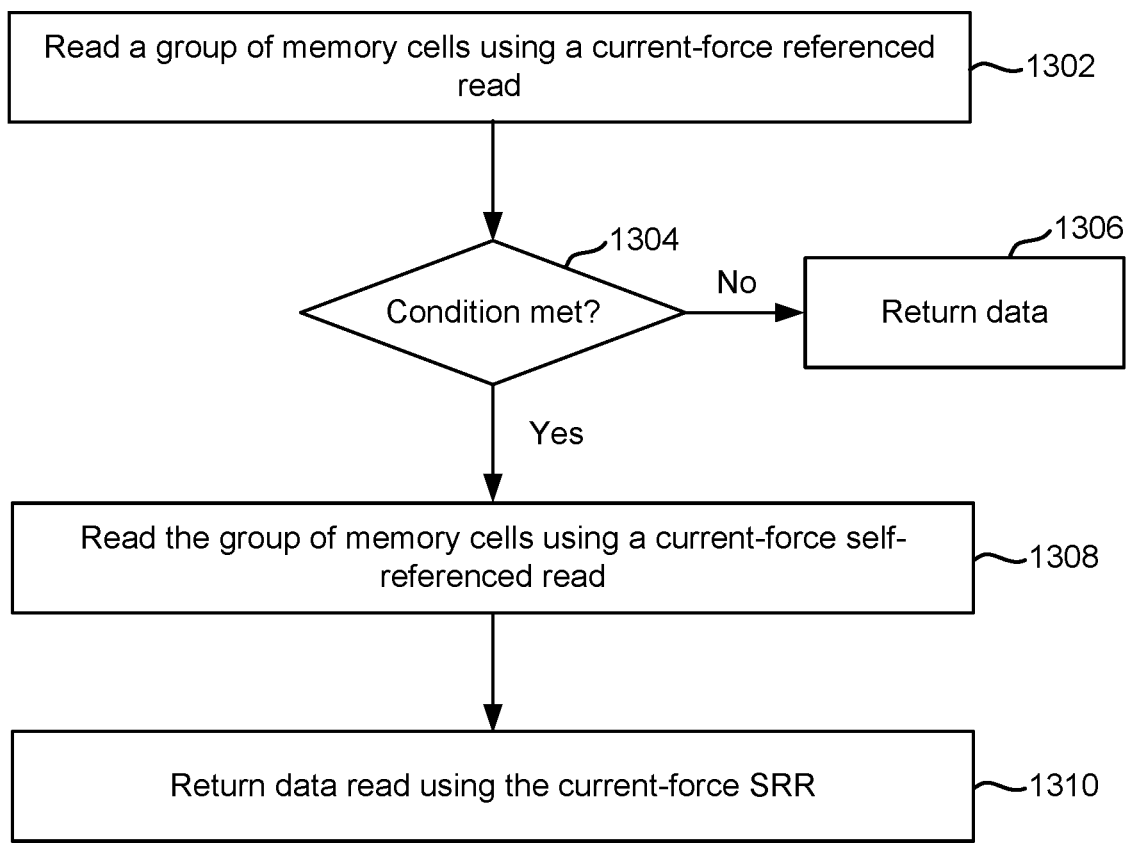
FIG. 13 is a flowchart of one embodiment of a process of mixed current-force read.

FIG. 13 is a flowchart of one embodiment of a process 1300 of mixed current-force read. The process 1300 may be used on non-volatile memory cells, each having a resistive random access memory element and a two terminal selector element in series with the memory element. The non-volatile memory cells may reside in a cross-point array. In an embodiment, the memory cells are MRAM cells. In an embodiment, the selector is an OTS.

Step 1302 includes reading a group of memory cells using a current-force referenced read. In a current-force referenced read of a particular memory cell, a current is forced through the memory cell being read. A voltage that appears across the cell as a result of forcing the current through the cell is sensed. This voltage is compared to a reference voltage. Note that step 1302 is performed on a group of memory cells, which could be in different tiles of the memory array. Collectively, the memory cells may store an ECC codeword. Further details of one embodiment of a current-force referenced read are discussed below in connection with FIG. 16.

Step 1304 includes determining whether a condition is met with respect to the current-force referenced read. In one embodiment, the condition is whether data that was read from the memory cells is successfully decoded by an ECC engine. In an embodiment, the ECC engine resides on the same semiconductor die as the memory cells, which facilitates a rapid determination of whether the data is successfully decoded. Further details of one embodiment in which the condition is whether data that was read from the memory cells is successfully decoded by an ECC engine are discussed below in connection with FIG. 14. In one embodiment, the condition is based on how many of the memory cells in the group have a resistance that falls into an uncertainty zone. Further details of one embodiment in which the condition is based on how many of the memory cells in the group have a resistance that falls into an uncertainty zone are discussed below in connection with FIG. 15A.

If the condition is not met, then step 1306 is performed. Step 1306 includes returning data based on the current-force referenced read. In an embodiment, step 1306 is performed if data read from the group is successfully decoded. Hence, step 1306 may include returning the successfully decoded data.

If the condition is met, then step 1308 is performed. Step 1308 includes reading the group of memory cells using a current-force SRR. Further details of one embodiment of a current-force SRR are discussed below in connection with FIG. 17.

Step 1310 includes returning data that was read using the current-force SRR. The ECC engine may be used to decode and correct the data that was read using the current-force SRR. Hence, the data that is returned in step 1310 may be decoded and corrected data. Given that the current-force SRR may be substantially more accurate and error free, prior to applying the ECC engine, than the current-force referenced read, the ECC engine should be able to successfully decode the data in almost all cases. In the very rare chance that the data is not successfully decoded, an error message may be returned.

Figure 14:
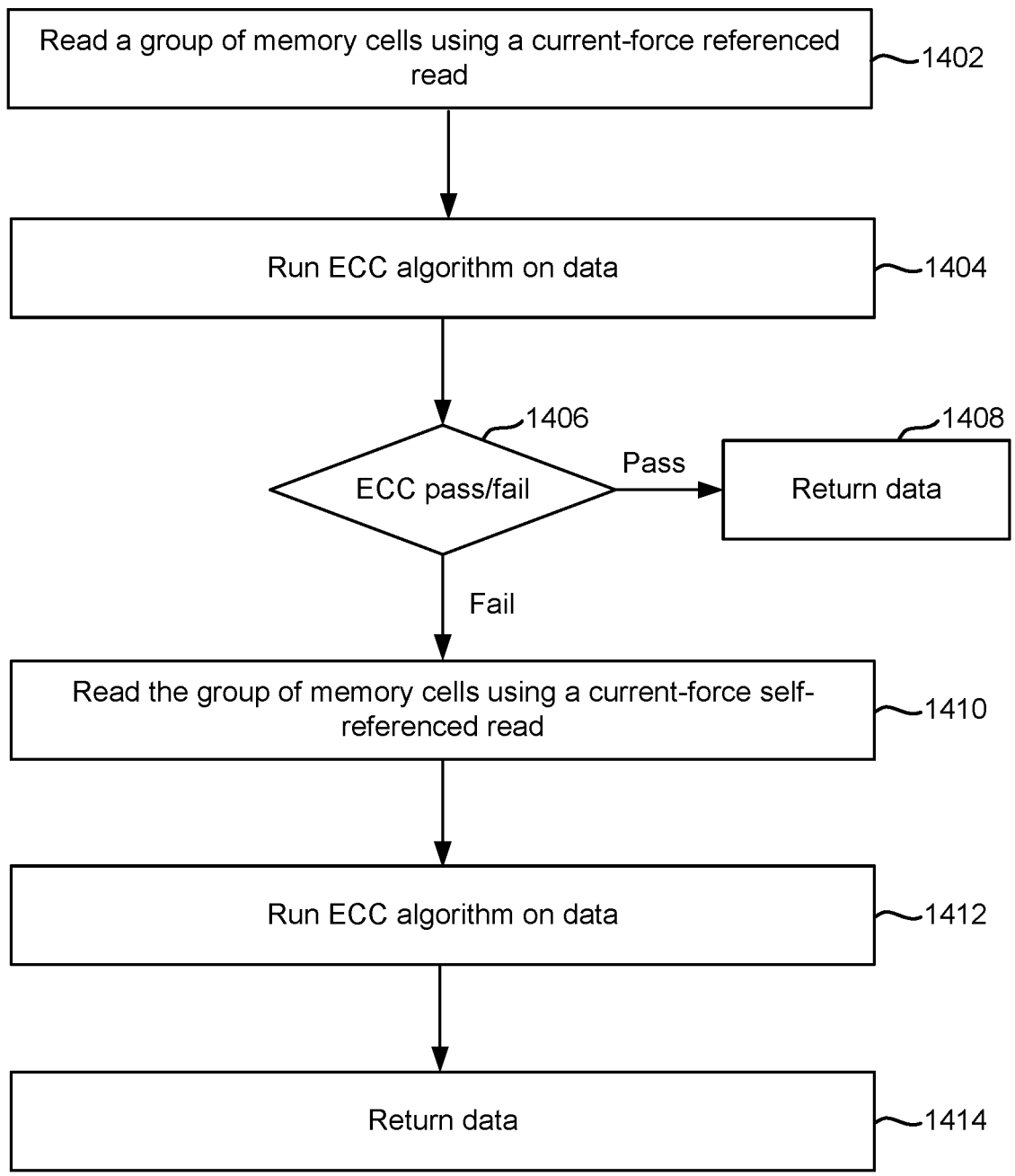
FIG. 14 is a flowchart of one embodiment of a process of a mixed current-force read in which an ECC engine is used to test if a current-force referenced read is successful.

FIG. 14 is a flowchart of one embodiment of a process 1400 of a mixed current-force read in which an ECC engine is used. The process 1400 provides further details of one embodiment of process 1300. Step 1402 includes reading a group of memory cells using a current-force referenced read. Step 1402 is similar to step 1302 and will not be described in detail. Step 1404 is to run an ECC algorithm on the data that is sensed using the current-force referenced read. Step 1406 is a determination of whether the decoding was successful. If the decoding passed, then the decoded data is returned in step 1408. If the decoding failed, then the group of memory cells is read using a current-force SRR in step 1410. Step 1410 is similar to step 1308 and will not be described in detail. Step 1412 includes running an ECC algorithm on the data to decode and correct the data. Step 1414 includes returning data that was read using the current-force SRR. As noted, the data may be decoded and corrected by an ECC engine.

In an alternative to step 1404, in one embodiment, an ECC engine is used to determine or to estimate the number of bit errors in a codeword prior to decoding the codeword. In an embodiment, the ECC engine 569 calculates the syndrome of the codeword in order to estimate the number of bit errors in the codeword. In an embodiment, the syndrome is based on the number of unsatisfied parity check equations. In an embodiment, the ECC engine 569 is capable of decoding a codeword provided that there are no more than a certain number of bits in error in the codeword. In step 1406, a determination is made as to whether to attempt to decode the codeword or to proceed to step 1410. This determination may be based on whether decoding the codeword is likely to be successful. For example, if the estimate of the number of bit errors in the codeword is less than or equal to the number of bits that can be corrected by the ECC engine 569, then the codeword is decoded and corrected. If the estimate of the number of bit errors in the codeword is more than the number of bits that can be corrected, then the current-force SRR is performed, and then the resulting read data may be decoded and corrected, and then returned.

Figure 15A:
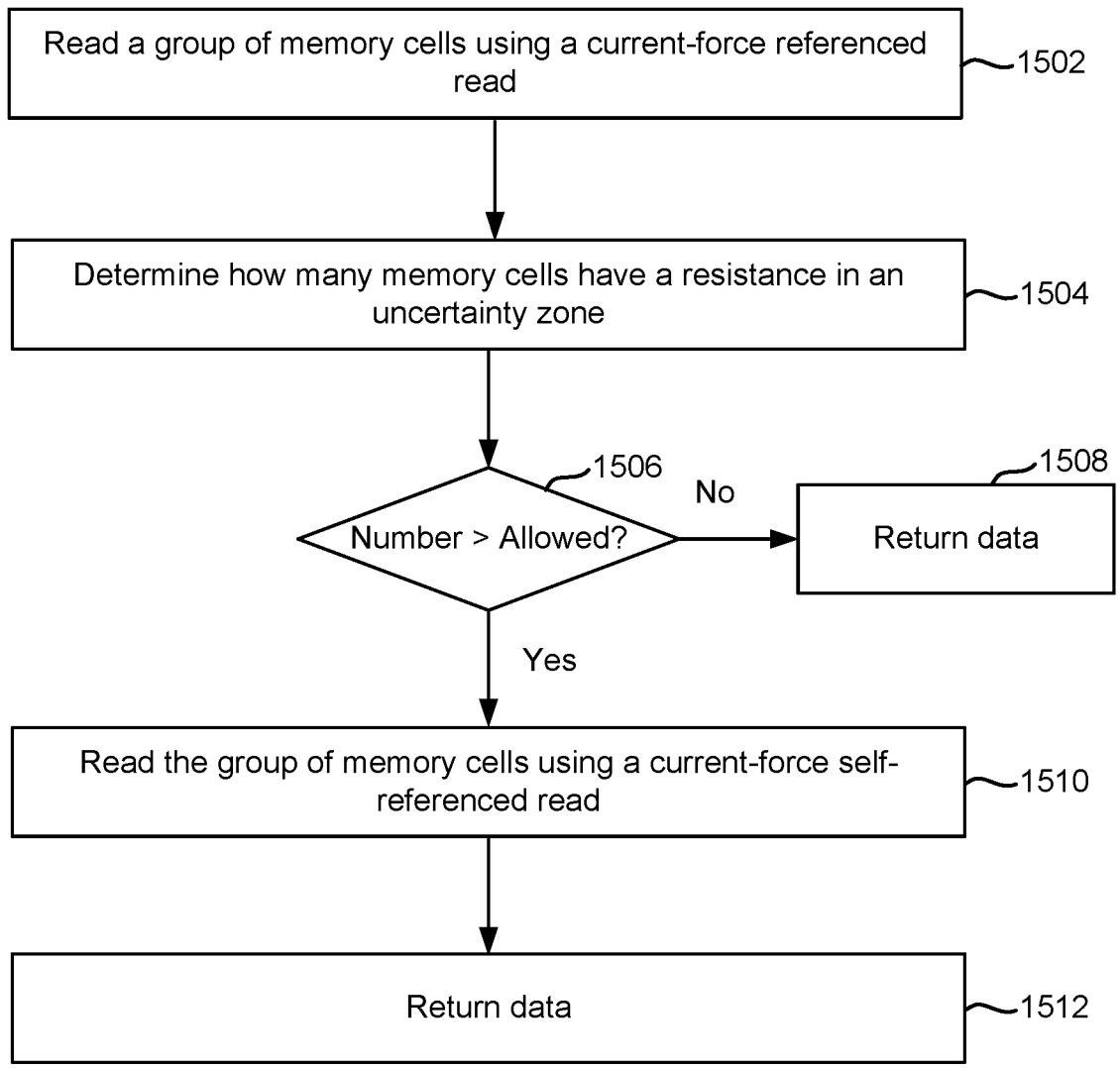
FIG. 15A is a flowchart of one embodiment of a process of a mixed current-force read in which memory cells are tested for being in an uncertainty zone.

FIG. 15A is a flowchart of one embodiment of a process 1500 of a mixed current-force read in which memory cells are tested for being in an uncertainty zone. The process 1500 provides further details of one embodiment of process 1300. Step 1502 includes reading a group of memory cells using a current-force referenced read. Step 1502 is similar to step 1302 and will not be described in detail.

Step 1504 is a determination of how many memory cells have a resistance in an uncertainty zone. FIG. 15B depicts two resistance distributions of memory cells, with an uncertainty zone between the two resistance distributions. FIG. 15B shows low resistance distribution 1540 and high resistance distribution 1542. In an embodiment, distribution 1540 corresponds to memory cells programmed to a 0, and distribution 1542 corresponds to memory cells programmed to a 1. Memory cells having a resistance below R_demarcation are considered to store a "1". Memory cells having a resistance above R_demarcation are considered to store a "0". Although FIG. 15B shows a clear gap between the two distributions, in practice some memory cells may have a resistance in the uncertainty zone. FIG. 15C depicts the concept of the uncertainty zone, but the horizontal axis is the voltage that is sensed across the memory cell when reading the cell, as opposed to cell's resistance. Hence, there is a lower voltage distribution 1550, and an upper voltage distribution 1552. In an embodiment of current-force read, a higher sensed voltage corresponds to a higher cell resistance. Memory cells sensed at a voltage below V_demarcation are considered to store a "1". Memory cells sensed at a voltage above V_demarcation are considered to store a "0". The voltage Vref low corresponds to R1, and the voltage Vref_hi corresponds to R2. Thus, in one embodiment, to determine how many memory cells have a resistance in the uncertainty zone, the system determines how many memory cells have a sensed voltage between Vref low and Vref high. Such sensed voltage may vary, for example, with variations in the CD of the MRAM or position along the word line or bit line.

Figure 15D:
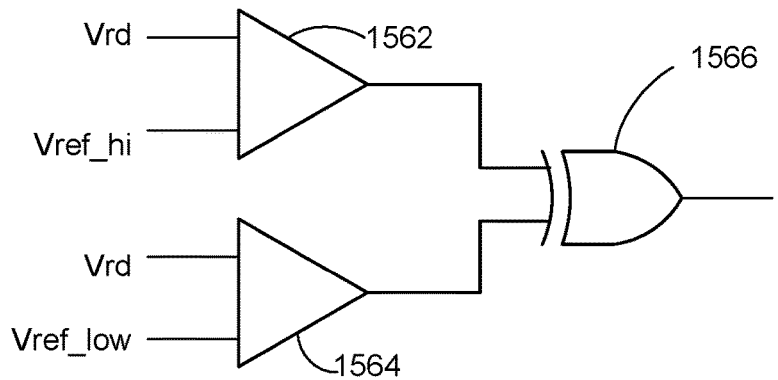
FIG. 15D depicts circuitry that may be used to determine whether a memory cell is in the uncertainly zone.

FIG. 15D depicts circuitry that may be used to determine whether a memory cell is in the uncertainly zone. The circuitry includes a first sense amplifier 1562 and a second sense amplifier 1564, and XOR logic 1566. The first sense amplifier 1562 inputs Vref_hi, which is compared with Vrd (the voltage that is sampled from the memory cell). The second sense amplifier 1562 inputs Vref low, which is compared with Vrd. The output of each respective sense amplifier is input to the XOR logic 1566. If the output of the XOR logic 1566 is true (e.g., "1"), this indicates that the memory cell falls into the uncertainty zone.

Returning again to FIG. 15A, step 1506 includes a determination of whether the number of memory cells is greater than an allowed number. In an embodiment, the allowed number is pre-determined. In one embodiment, the allowed number corresponds to a number of bits that can be corrected by the ECC engine 569. For example, the ECC engine may be able to correct up to 9 bits in error in the codeword. If the number is less than or equal to the allowed number, then step 1508 is performed. Step 1508 is to decode the data using the ECC engine and return the decoded and corrected data. Note that step 1508 may be performed even if there are some memory cells in the uncertainty zone, provided that the number is within the allowed number. This allows the process 1500 to complete based on the current-force referenced read, without the need to perform the current forced SRR with its added latency. Therefore, considerable time and power is saved. Also note that in some very rate cases decoding of the data in step 1508 may fail, in which case the process my proceed with step 1510.

If the number from step 1504 is more than the allowed number, then step 1510 is performed. Step 1510 is to read the group of memory cells using the current-force SRR. Step 1512 is to returned data (decoded and corrected) from the current-force SRR. Steps 1510 and 1512 may be similar to steps 1308 and 1310, respectively.

Figure 16:
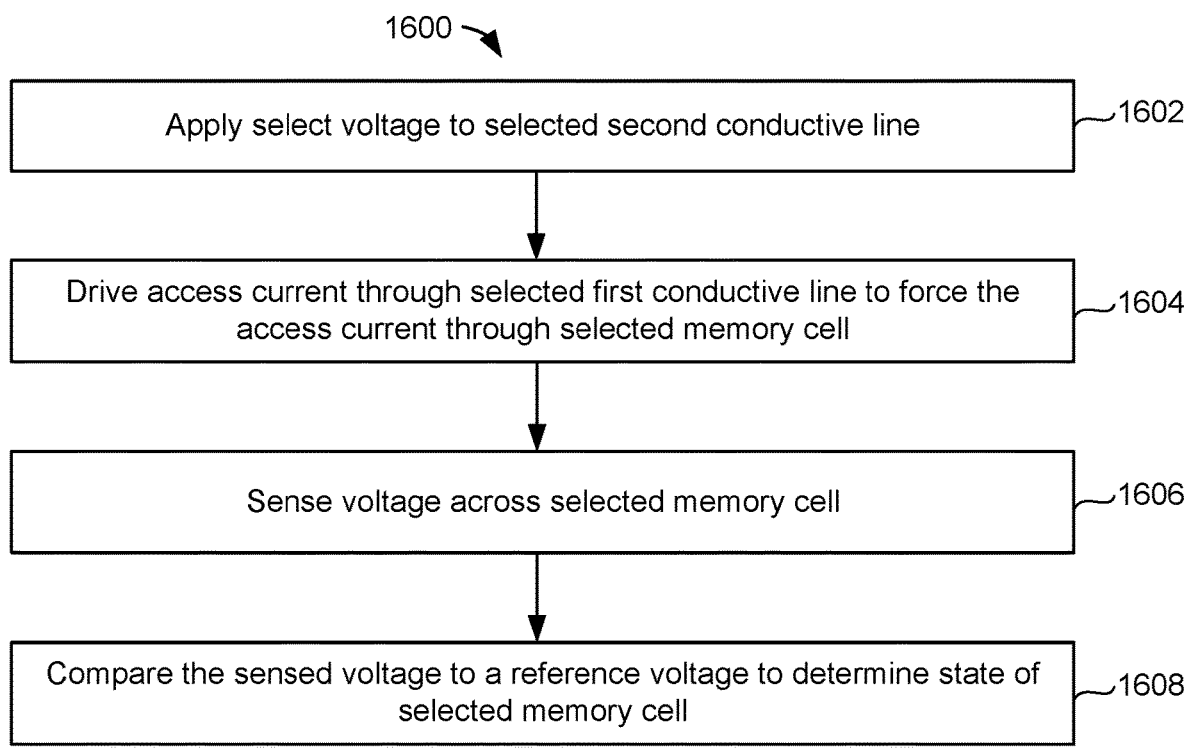
FIG. 16 is a flowchart depicting one embodiment of a process of current-force referenced read.

FIG. 16 is a flowchart depicting one embodiment of a process 1600 of current-force referenced read. Process 1600 may be used in steps 1302, 1402, or 1502. Process 1600 describes reading one memory cell. The process may be performed in parallel on the different memory cells in the group. The group may store an ECC codeword. Step 1602 includes applying a select voltage to a selected second conductive line. With reference to FIG. 12A, Vselect is provided to the selected bit line 1208b. Unselect voltages are provided to the unselected bit lines.

Step 1604 includes driving a read current to a selected word line to force the read current through the selected memory cell. With reference to FIG. 12A, $I_{access}$ is driven into the selected word line 1206g. Access currents are not provided to the unselected word lines. The access current may flow through a portion of the selected word line, through the selected memory cell, and through a portion of the selected bit line. In particular, the access current may flow through the portion of the selected word line from where the word line is driven (by a current driver) to the selected memory cell. The access current may flow through the portion of the selected bit line from the selected memory cell to where the bit line is driven by the voltage driver.

Step 1606 includes sensing a voltage generated by the selected memory cell. In an embodiment, the voltage between the selected word line and the selected bit line at the selected bit is sensed, either directly or on a global node that includes the drive circuitry. The sensed voltage is between ground and the current source driving current into the array decode circuitry.

Step 1608 includes comparing the sensed voltage to a reference voltage to determine a state of the memory cell. The reference voltage could be, for example, V_demarcation that is depicted in FIG. 15C. The magnitude of the reference voltage is independent of the physical state (e.g., resistance) of the memory cell. A common reference voltage may be used for different memory cells in the array. However, in some embodiments, the magnitude of the reference voltage may be based on a factor such as the location of the memory cell in the array. Therefore, the reference voltage is not required to have the same magnitude for all memory cells in the array.

Figure 17:
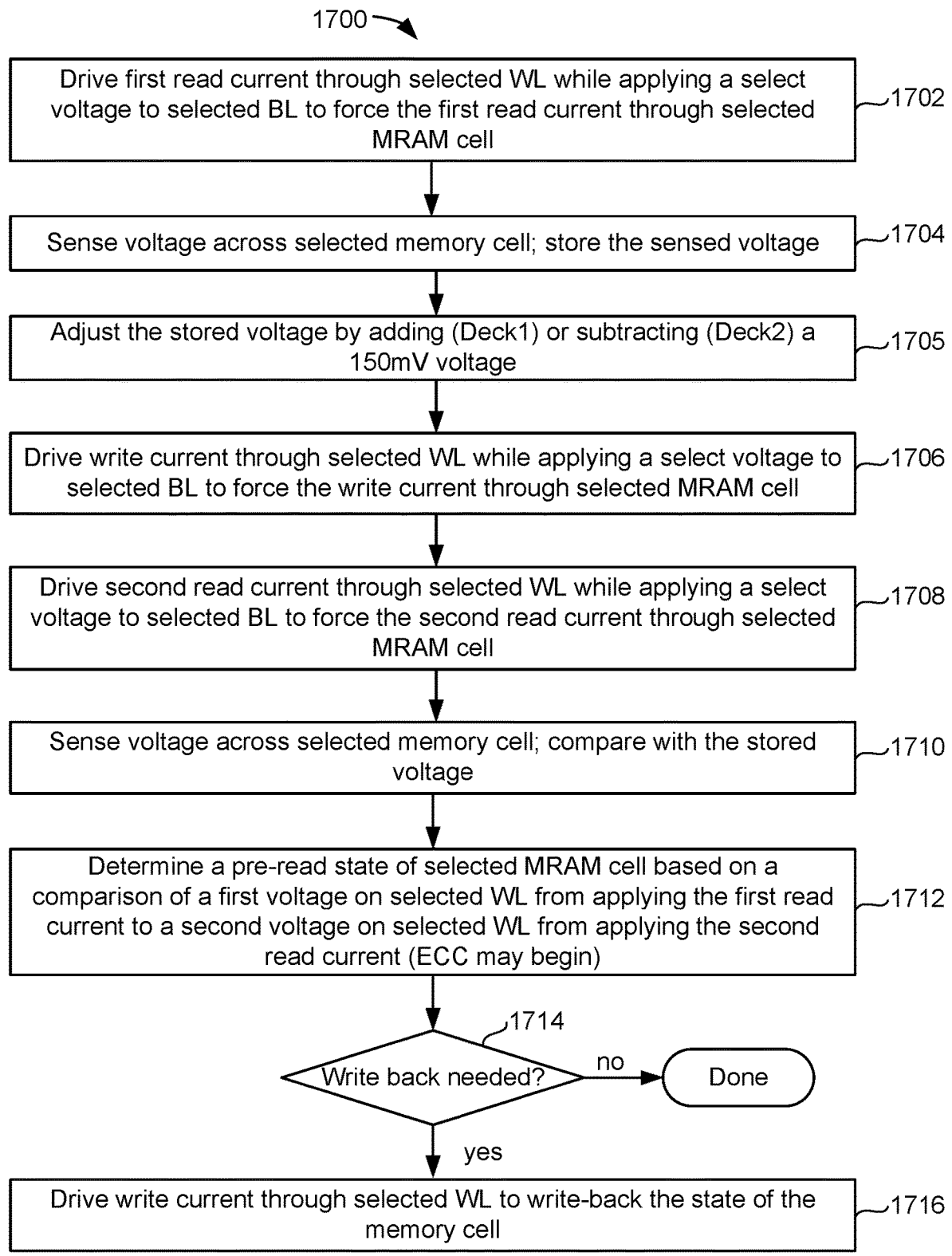
FIG. 17 is a flowchart depicting one embodiment of a process of current-force SRR.
Figure 18A:
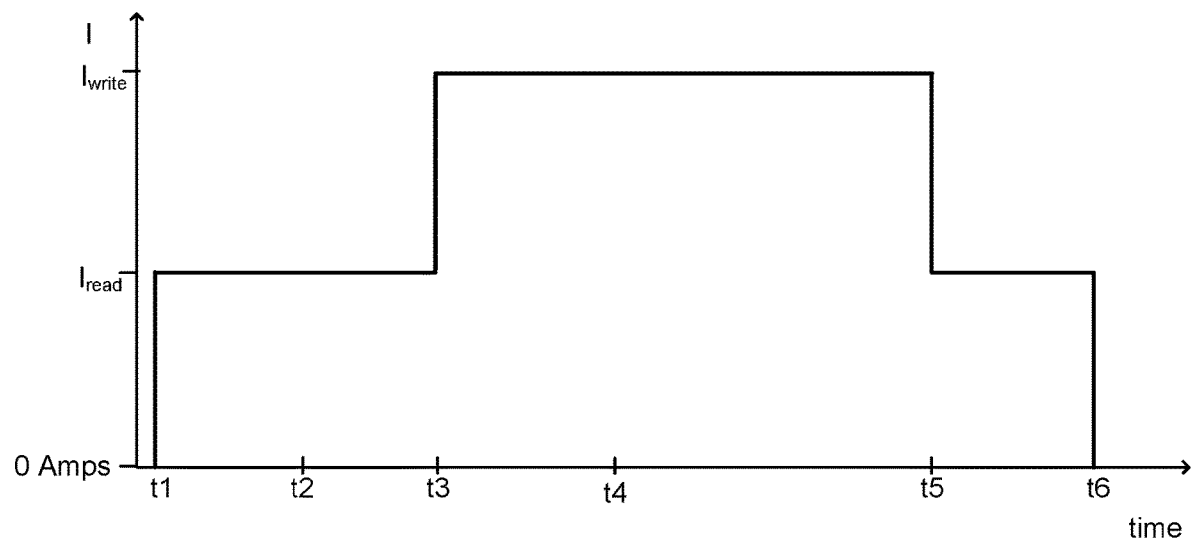
FIG. 18A depicts current versus time for an accessed bit current that is driven through a selected word line during an embodiment of current-force SRR.
Figure 18B:
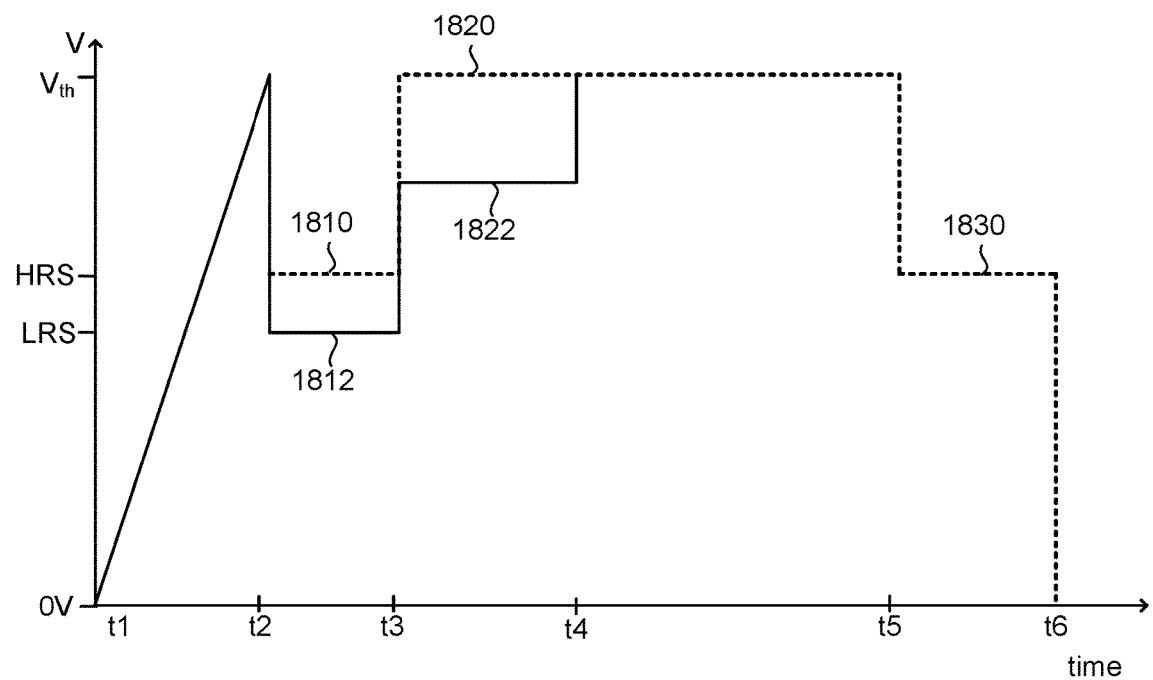
FIG. 18B depicts voltage versus time for the voltage across a selected MRAM cell during an embodiment of current-force, the dashed lines for a bit already in AP state, and the solid line for a bit in the P state that is written to AP state during the 1822 waveform.

FIG. 17 is a flowchart depicting one embodiment of a process 1700 of current-force SRR. The SRR may be referred to as a destructive SRR, which means that the original state of the memory cell may be changed during the SRR. Process 1700 may be used in step 1308, 1410, or 1510. Process 1700 describes reading one memory cell, and may be performed in parallel on the memory cells in the codeword group (which may reside in different tiles or groups of tiles). In one embodiment, the process 1700 is performed by a control circuit in the memory die 292. In one embodiment, the process 1700 is performed by a control circuit in the control die 590. In one embodiment, the process 1700 is performed by a control circuit (e.g., host processor 122) in the host 122. Process 1700 will be discussed with reference to FIGS. 18A and 18B. FIG. 18A depicts current versus time for the access current that is driven through a selected word line during an embodiment of current-force. FIG. 18B depicts voltage versus time for the voltage across a selected MRAM cell during an embodiment of current-force.

Step 1702 includes driving a first read current through the selected word line while applying a select voltage to a selected bit line in order to force the first access current through the selected MRAM cell. With reference to FIG. 12, $I_{access}$ is driven by current driver 1210g through selected first conductive line 1206g to drive $I_{access}$ through memory cell 701a using a current of, for example, 15 ua. With reference to FIG. 12, $V_{select\_BL}$ is applied by voltage driver 1212b to second conductive line 1208b. In one embodiment, for example, $I_{access}$ is 15 µA and $V_{select\_BL}$ is 0V. In another embodiment, the current is −15 ua and $V_{select\_BL}$ is 3.3V for 20 nm CD MRAM with RA 10 that may have low resistance state of about 25K Ohm and high resistance state of about 50K Ohm.

FIGS. 18A and 18B will now be discussed with respect to one MRAM cell 701 to further elaborate on step 1702. With reference to FIG. 18A, the current is increased to $I_{read}$ at time t1 and is held at $I_{read}$ until t3. With reference to FIG. 18B, the voltage across the memory cell 701 increases from t1 to t2. The threshold switching selector 1204 is off between t1 and t2. Between t1 and t2, the current causes the word line voltage to increase. The current also supports any leakage in the path. Once the voltage across threshold switching selector 1204 reaches the threshold voltage Vth of the threshold switching selector 1204, it will turn on and switch to a low resistance state (at t2). Thus, the voltage across the series combination of the threshold switching selector 1204 and the resistive MRAM element 1202 ramps up as the threshold switching selector is in an off state.

Once the threshold switching selector 1204 is in the on state (at t2), the $I_{read}$ current will flow through the selected memory cell 701a. As the access current is held fixed at $I_{read}$, the voltage across the memory cell will drop to a level dependent upon the series resistance of the MRAM element 1202 and the on-state resistance of the threshold switching selector 1204. For a binary embodiment in which a memory cell only stores two states, the memory cell will have a high resistance, AP-state, for example 50K Ohm, and a low resistance, P-state, for ex example 25K Ohm. The resultant voltage across the series connected MRAM element 1202 and threshold switching selector 1204 in response to the $I_{read}$ current for the high resistance state (HRS) and low resistance state (LRS) are respectively shown as lines 1810 and 1812. Although the discussion here is in the context of an MRAM based memory cell being placed in series with the threshold switching selector, this read technique can similarly be applied to other programmable resistance memory cells, such as PCM or ReRAM devices.

Returning again to FIG. 17, step 1704 includes sensing a voltage across the selected memory cell. Step 1704 may also include storing the sensed voltage on, for example, a capacitor. Step 1705 includes adjusting the stored voltage by adding (Deck1) or subtracting (Deck2) a 150 mV voltage.

Step 1706 includes driving a write current through the selected word line while applying a select voltage to the selected bit line to force the write current through the selected MRAM cell. With reference to FIG. 12, $I_{access}$ is driven by current driver 1210g through selected first conductive line 1206g to force $I_{access}$ through memory cell 701a. With reference to FIG. 12, $V_{select\_BL}$ is applied by voltage driver 1212b to second conductive line 1208b. In one embodiment, $I_{access}$ to write is 30 µA and $V_{select\_BL}$ is 0V. In another embodiment, $I_{access}$ to write is −30 µA and $V_{select\_BL}$ is 3.3V FIGS. 18A and 18B will now be discussed with respect to one MRAM cell 701 to further elaborate on step 1706. With reference to FIG. 18A, the access current is increased to $I_{write}$ at time t3 and is held at $I_{write}$ until t5. With reference to FIG. 18B, at t3 the voltage across the MRAM cell 701 increases at t3. If the MRAM cell 701 was in the HRS (line 1810), then the voltage across the MRAM cell will increase to the level indicated by line 1820 at t3 and stay there until t5. Recall that the HRS is the AP-state. Thus, this MRAM cell will stay in the AP-state.

If the MRAM cell 701 was in the LRS (line 1812), then the voltage across the MRAM cell will increase to the level indicated by line 1822 at t3. Recall that the LRS is the P-state. If the MRAM cell 701 was in the P-state, it will switch to the AP-state. FIG. 18B shows line 1822 increases at t4 to meet with line 1820. This represents the MRAM cell has switched from the P-state (LRS) to the AP-state (HRS).

Returning again to FIG. 17, step 1708 includes driving a second read current through the selected word line while applying a select voltage to the selected bit line in order to force the second access current through the selected MRAM cell. In one embodiment, the second access current has the same direction and substantially the same magnitude as the first access current. With reference to FIG. 12, $I_{access}$ is driven by current driver 1210g through selected first conductive line 1206g to force $I_{access}$ through memory cell 701a. With reference to FIG. 12, $V_{select}$ is applied by voltage driver 1212b to second conductive line 1208b. In one embodiment, $I_{access}$ is 15 µA and $V_{select}$ is 0V.

FIGS. 18A and 18B will now be discussed with respect to one MRAM cell 701 to further elaborate on step 1708. With reference to FIG. 18A, the access current is decreased from Twit, to $I_{read}$ at time t5 and is held at $I_{read}$ until t6. With reference to FIG. 18B, the voltage across the memory cell 701 decreases at t5 to the level indicated by 1830 and holds at that level until t6. Note that line 1830 is at the HRS level. Also recall that regardless of the initial state of the MRAM cell, the MRAM cell was placed into the HRS state (AP-state) in step 1708.

Returning again to FIG. 17, step 1710 includes sensing the voltage across the selected memory cell. Step 1710 also includes comparing the voltage sensed in step 1710 with the voltage that was stored in step 1704.

Step 1712 includes determining a pre-read state of the selected MRAM cell based on a comparison of a stored voltage from driving the first read current through the selected memory cell to the voltage from forcing the second read current through the selected memory cell. After step 1712, the data from each memory cell in the group being read may be provided to the ECC engine, which may begin to decode the data. In some embodiments, the ECC engine 569 is on the same semiconductor die as the memory cells, which provides for faster decoding by reducing data transfer time.

FIGS. 18A and 18B will now be discussed with respect to one MRAM cell 701 to further elaborate on step 1712. The first voltage on the selected word line from applying the first read current will be the voltage between t2 and t3. Hence, the first voltage is either the HRS level 1810 or the LRS level 1812. Note that this first voltage may be stored in step 1704 by, for example, charging a sense capacitor using the word line voltage. The second voltage on the selected word line from applying the second read current will be the voltage between t5 and t6. This second voltage will typically be at about the HRS level 1810. However, the second voltage could be slightly different from the HRS level 1810. Comparing the first voltage with the second voltage may thus be used to determine whether the MRAM cell was at the HRS level 1810 or the LRS level 1812 between t2 and t3. To facilitate comparison, the level generated by the Read1 current to the AP-state may be stored and bumped positive by about half the voltage difference between HRS and LRS, for example 150 mV. Alternatively, the level may be bumped negative if the Read1 current is to the P-state. These choices may be reversed depending on MRAM cell orientation as will be apparent to one reasonably skilled in the art.

Returning again to FIG. 17, after step 1712 a determination is made whether a write back is needed (step 1714). As noted above, process 1700 is a destructive SRR in which the original state of the memory cell may be lost during step 1706. The write back is used to restore the original state of the memory cell, if needed. Hence, step 1716 is performed if the write back is needed. Step 1716 includes driving a write current through the selected word line to write back the original state of the memory cell, if needed. Recall that step 1706 placed all MRAM cells in the AP-state. Hence, all MRAM cells that were originally in the P-state are written back to the P-state, in step 1716. All MRAM cells that were originally in the AP-state are left in the AP-state, in step 1716. Note that as described above, the ECC engine can begin to decode and correct the data in step 1712. Hence, the data can be decoded, corrected, and provided to a requestor prior to the write back finishing in step 1716.

Figure 19:
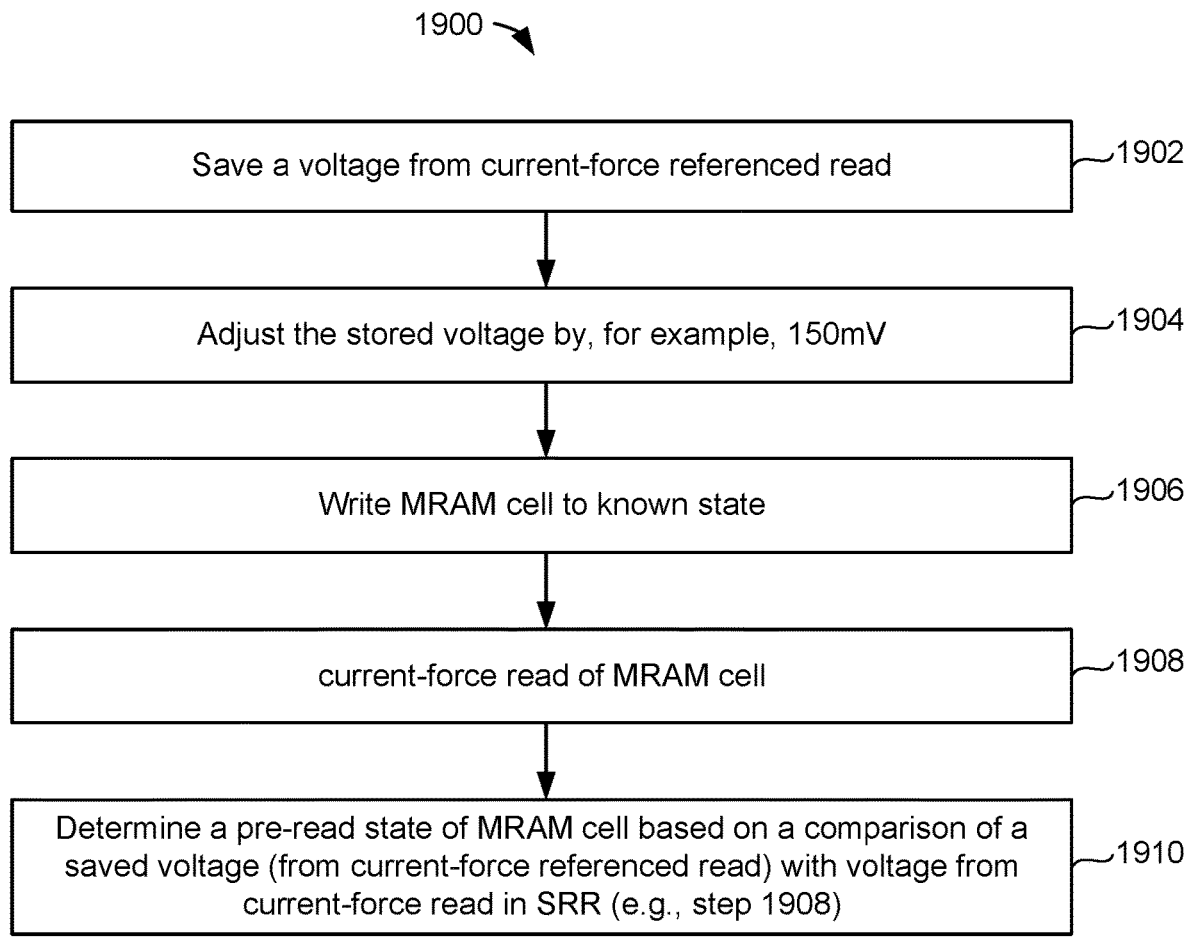
FIG. 19 is a flowchart depicting one embodiment of a process in which a value from a current-force referenced read is saved and used in a current-force SRR.

In some embodiments, the current-force SRR is shortened by saving a value from the current-force referenced read and using this value thereby eliminating the need for the first read in the current-force SRR. FIG. 19 is a flowchart depicting one embodiment of a process 1900 in which a value from a current-force referenced read is saved and used in a current-force SRR. Step 1902 includes saving a value from a current-force referenced read. In one embodiment, a voltage is stored onto a capacitor. Step 1902 may be performed during step 1502 of FIG. 15.

Step 1904 includes changing the stored voltage by, for example, 150 mV. However, note that the first read of the current-force SRR may be skipped. With reference to the process 1700 of FIG. 17, steps 1702 and 1704 may be skipped. Step 1906 includes writing the MRAM cell to a known state. With reference to the process 1700 of FIG. 17, step 1706 may be performed. Step 1908 includes a current-force read of the MRAM cell. With reference to the process 1700 of FIG. 17, steps 1708 and 1710 may be performed. Step 1910 includes determining a pre-read state of the MRAM cell based on a comparison of the saved voltage (from the current-force referenced read) with a voltage from the current-force read in the SRR (e.g., a sampled voltage from step 1908). Thus, process 1900 saves time and/or power by alleviating the need for the first read in the SRR.

Figure 20:
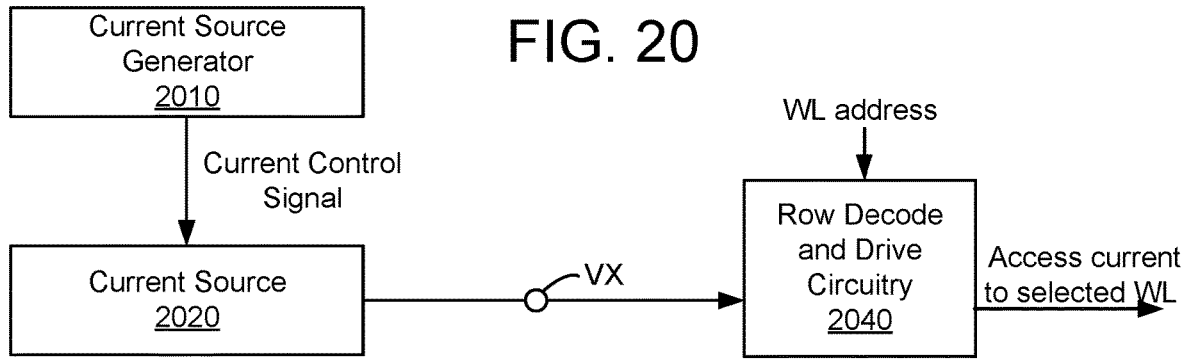
FIG. 20 is a block diagram of components for forcing a current to a word line.

FIG. 20 is a block diagram of components for driving a current to a word line in order to force a current through a memory cell. The current source generator 2010 generates and outputs a current control signal, which is provided to the current source 2020. In an embodiment, the current control signal is a high-precision voltage. The current source 2020 outputs a fixed magnitude current in response to the current control signal. The current source 2020 could be used to generate a read current or a write current, which may be referred to as an access current. The access current is provided to the selected word line by way of row decode and drive circuitry 2040. The row decode and drive circuitry 2040 inputs a WL address, and provides the access current to the selected word line. The state machine 562 may provide the WL address to the row decode and drive circuitry 2040. In an embodiment, there are separate current sources 2020 for generating the read current and the write current, with selection logic to select the appropriate current source for the memory operation. In an embodiment, there is a first current source for generating a positive write current and a second current source for generating a negative write current. Not depicted in FIG. 20 is a bit line driver, which may provide a select voltage to the selected bit line. The access current may flow through a portion of the selected word line, through the selected memory cell, and through a portion of the selected bit line. In one embodiment, the voltage at node VX is clamped, such that it does not exceed a certain magnitude. Clamping the voltage at node VX will clamp the voltage on the word line, which reduces stress on memory cells (e.g., MRAM cells) while maintaining a low bit error rate by choice of clamp voltage high enough not to reduce read margin yet low enough to reduce stress on some smaller CD MRAM bits.

Figure 21:
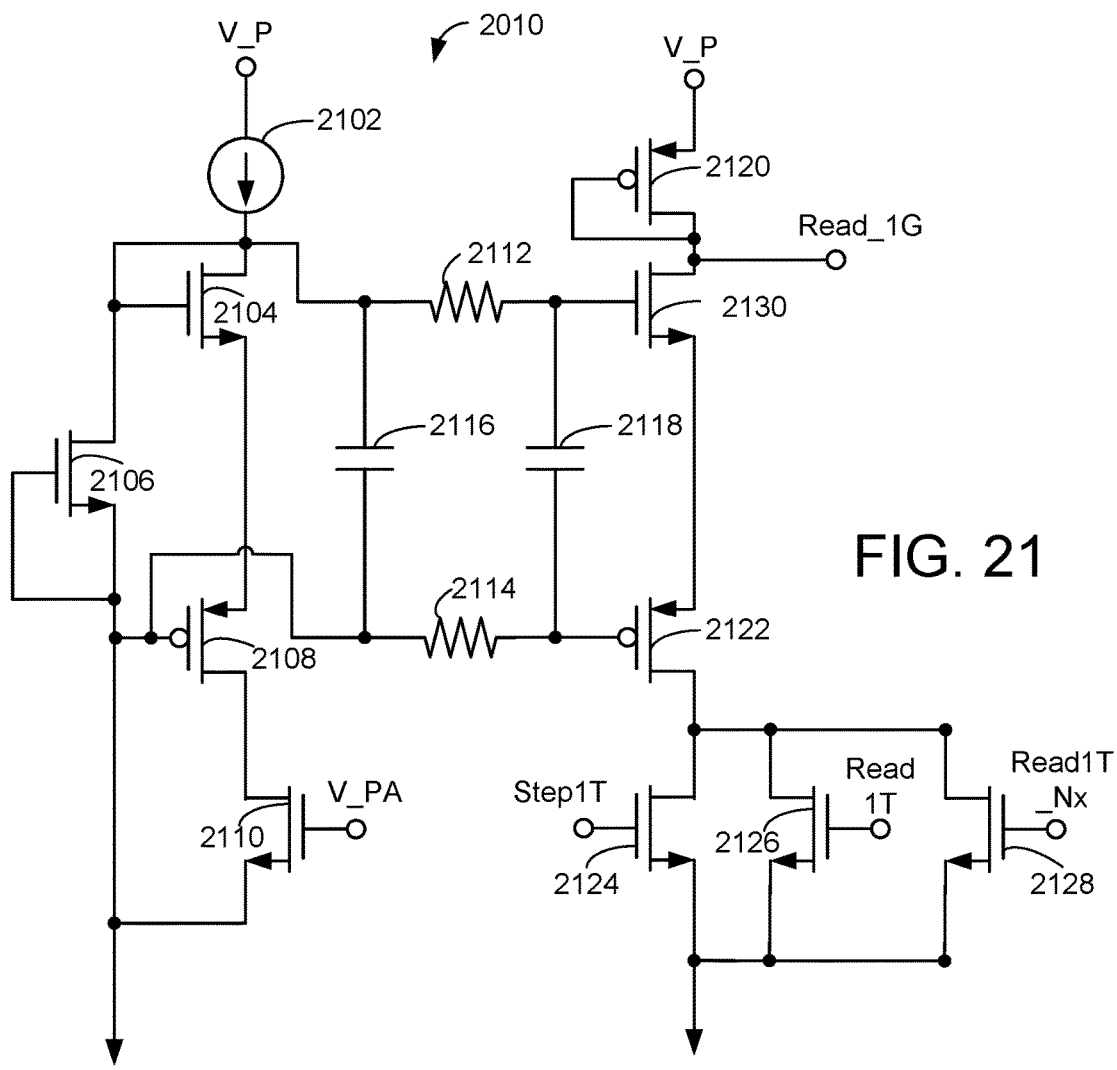
FIG. 21 is a schematic diagram of one embodiment of a current generator that reduces variation in tile to tile current despite varying distances from reference and power supplies.

FIG. 21 is a schematic diagram of one embodiment of the current source generator 2010. The current source generator 2010 outputs voltage Read 1G (between transistors 2120 and 2130), which is provided to the current source 2020. In some embodiments, Read 1G may be provided to several types current sources, such as a read current source, a positive current write source, and a negative current write source.

The gates of transistors 2130 and 2122 are provided voltages by resistors 2112 and 2114, respectively. Those resistor voltages are generated by the left-side circuitry, which includes current source 2102, transistor 2104, transistor 2106, transistor 2108, and transistor 2110, as well as capacitors 2116 and 2118. The current source 2102 may be about 5 micro-Amperes. The right-side circuitry includes transistors 2120, 2130, 2122, 2124, 2126, and 2128. In some embodiments, the left-side circuitry is used for an entire bank, with a separate version of the right-side circuitry being used for each tile. The current source 2102, for example 5 ua, may generate a voltage approximately 2 Vt above ground on the drain of transistor 2104 that is distributed to the tiles. V_PA into the gate of transistor 2110 may be high (e.g., V_P) to activate the circuit, or it may open the circuit if the gate of transistor 2110 is taken to ground so current is eliminated when the circuit is unused. The gate of transistor 2104 may be distributed to the tiles and drive only transistor gates and no source or drains to eliminate drops to the tiles and render the resulting current in the tiles relatively the same for each. In turn, the two distributed voltages at approximately 1.5V and 0V are connected in each tile to generators on the right. That is, the gate of transistor 2130 will be approximately 1.5V, and the gate of transistor 2122 approximately 0V. In turn, those mirror circuits may be turned on by either Step1T, Read1 T, or Read1T_NX high at V_P. The result is that the current of current source 2102 is driven into transistor 2120 drain and the gate of transistor 2120 will be at V_P–Vt, or approximately 2.5V if V_P is 3.3V.

One of the challenges of a mixed current-force read scheme is the interface timing between the memory device and a requestor of the data, such as a memory controller. For example, because the current-force SRR may take longer than the current-force referenced read, there is the potential that from the memory controller's perspective that the data is returned in a non-deterministic time after the memory controller issues the read request. In an embodiment, the data is returned to the memory controller in a deterministic time after the memory controller issues the read request regardless of whether a current-force referenced read or a current-force SRR is used to read the data. Moreover, memory protocols such as the DDR protocol have very strict timings. Hence it is a challenge and less effective at reducing latency to have a mixed current-force read scheme of MRAM operate within a DDR protocol.

Figure 22:
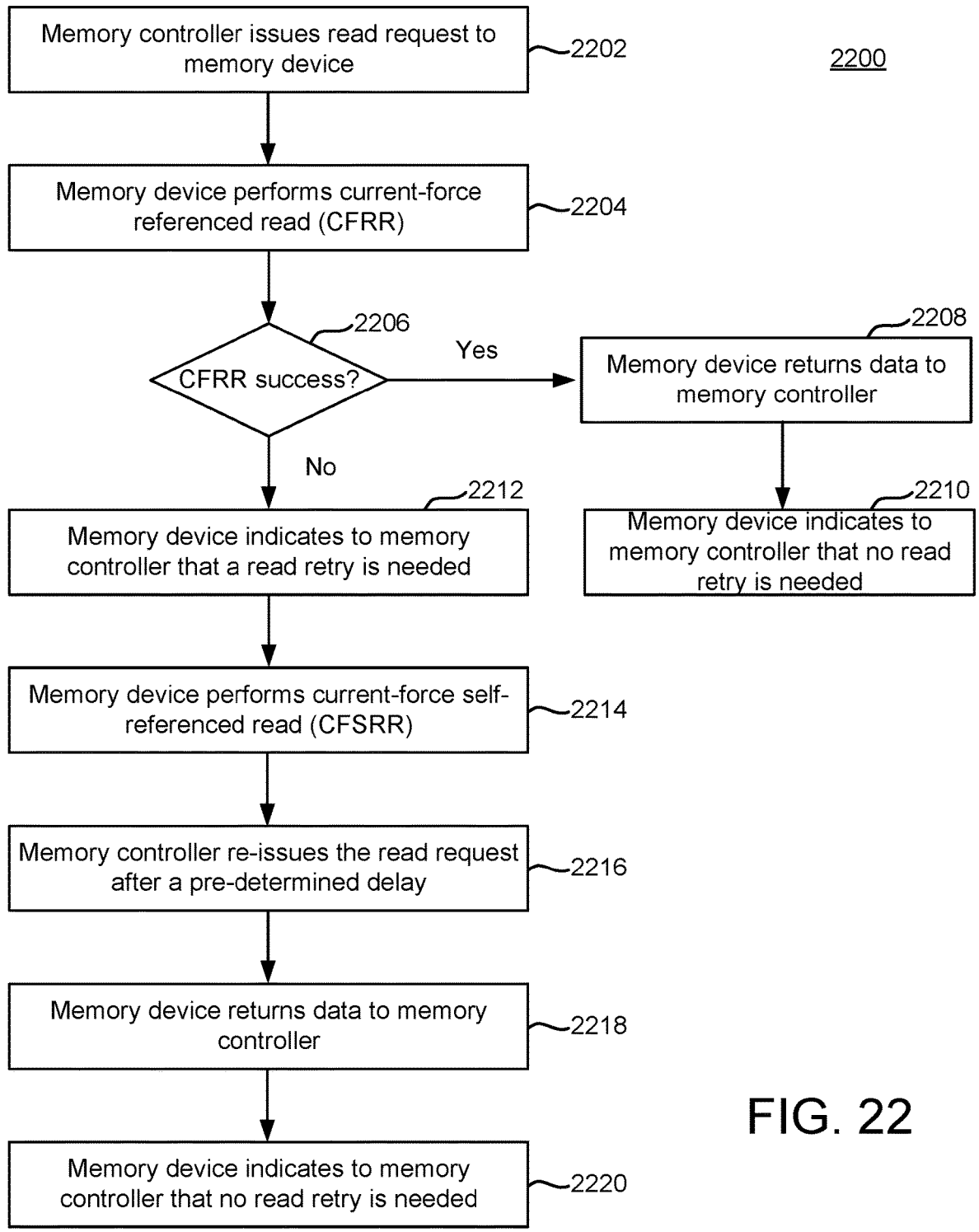
FIG. 22 is a flowchart of an embodiment of a process of a deterministic return time when using mixed current-force read scheme.

FIG. 22 is a flowchart of an embodiment of a process 2200 of a deterministic return time when using mixed current-force read scheme. Process 2200 involves a communication interface between a memory controller and a memory device. In one embodiment, the communication interface is a DDR interface. Step 2202 includes a memory controller issuing a read request to a memory device. In one embodiment, memory controller 102 issues the read request to local memory 106. In one embodiment, memory controller 102 issues the read request to a memory package 104. In one embodiment, host processor 122 issues the read request to host memory 124.

Step 2204 includes the memory device performing a current-force referenced read (CFRR). In one embodiment, process 1600 is performed. Step 2206 includes a determination of whether the CFRR was a success. In one embodiment, an ECC algorithm is performed on the data in step 2206. In one embodiment, the CFRR is a success if the data is successfully decoded and corrected. If the CFRR is a success, then the memory device returns the corrected data to the memory controller, in step 2208. In step 2210, the memory device indicates to the memory controller that there is no need retry the read command.

If the CFRR is not a success, then in step 2212 the memory device indicates to the memory controller that a read retry is needed. In one embodiment, the memory device sends a signal having a value of either 0 or 1. The signal may be sent on a communication line between the memory device and the memory controller. In one embodiment, a new communication line (or pin) is added to the interface (e.g., DDR interface). However, it is not required that a new line be added, as an existing line may be used for the retry signal. Further details are discussed in connection with FIGS. 23 and 24. In one embodiment, the memory device sends a cyclic redundancy check (CRC) that is the opposite of what the CRC should be to signal the retry. Further details are discussed in connection with FIG. 25.

In step 2214, the memory device performs a current-force SRR to read the data from the group of memory cells. In one embodiment, process 1700 is performed. In one embodiment, some steps of process 1700 (e.g., steps 1702, 1704, 1706) may be skipped due to the read performed in step 2204. In other words, the voltage from the read of step 2204 may be saved, as described in process 1900.

In step 2216, the memory controller re-issues the read request after waiting a pre-determined amount of time from receiving the indication that a read retry is needed. The pre-determined amount of time is based on how long it will take the memory device to perform the current-force SRR. In one embodiment, the memory device informs the memory controller of how long the pre-determined amount of time should be. This may be performed once, since the pre-determined amount may be fixed.

In step 2218, the memory device returns the data to the memory controller. That is, the memory device decodes the data from the current-force SRR and returns the decoded data to the memory controller.

In step 2220, the memory device indicates to the memory controller that no read retry is required.

Figure 23:
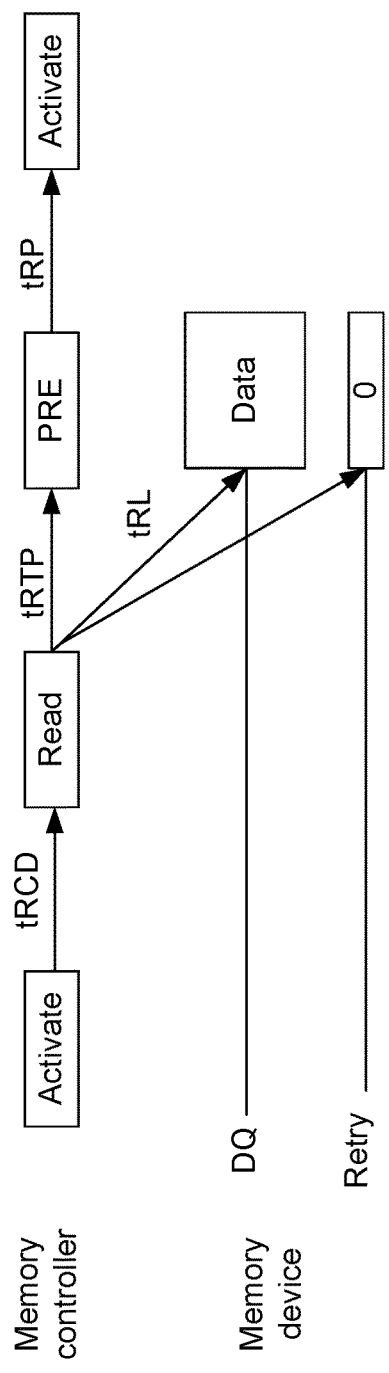
FIGS. 23 and 24 depict interface timing diagrams for an embodiment of mixed current-force read.
Figure 24:
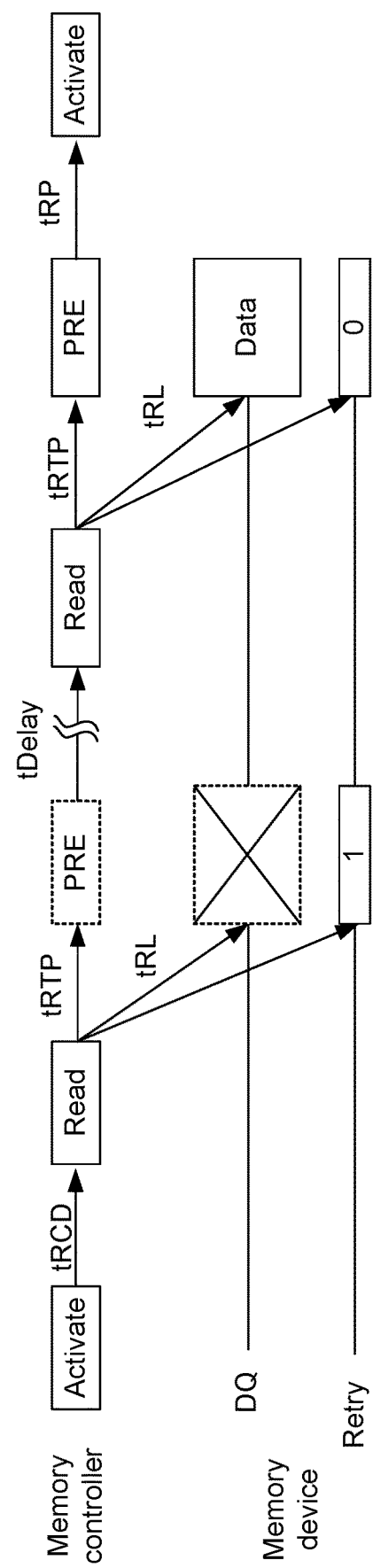

FIGS. 23 and 24 depict interface timing diagrams for an embodiment of mixed current-force read. FIG. 23 depicts a case in which only a current-force referenced read is needed. FIG. 24 depicts a case in which the memory device performs both a current-force referenced and a current-force SRR. In FIG. 23, the data is available after the first read request, while in FIG. 24, the data is only available after a second read request is issued. However, in each case the data is returned to the memory controller within tRL of the time that the memory device responds with success to a read request. Hence, the time to return the data is deterministic. The various commands (Activate, Read, PRE) may be DDR commands. Likewise, the various timings (tRCD, tRTP, tRP, tRL) may be DDR timings. The actual values for the various timings (tRCD, tRTP, tRP, tRL) will depend on the protocol in use. FIGS. 23 and 24 provide further details for an embodiment of process 2200.

Referring now to FIG. 23, the memory controller issues an Activate command to the memory device. As noted, this may be a DDR Activate command. Next, the memory controller issued a Read command to the memory device. This may be a DDR Read command. The timing tRCD (Row Column Delay) refers to the row address to column address delay. Following the read command, the memory controller issued a PRE command to the memory device. The PRE command refers to a "Precharge command", which may be used in RAM such as DDR. The timing tRTP refers to the delay between the Read Command and the PRE command. The timing tRL refers to the read command latency (or data output delay), which is widely used in RAM such as DDR. In other words, tRL is the time from the read command until the data is provided by the memory device. Significantly, in FIG. 23 the memory device provides the data to the memory controller within tRL from the time the read command is received. Also, the memory device indicates to the memory controller that there is no need to retry the read command by sending a value (e.g., 0) on a retry line. The retry line may be any communication line between the memory device and memory controller that is not presently being used. The retry signal is used in one embodiment of step 2210 of FIG. 22. In one alternative embodiment, the retry is encoded in a CRC that is appended to the data.

Referring now to FIG. 24, the memory controller issues an Activate command and a read command in a similar manner as discussed in connection with FIG. 23. However, the memory device does not return valid data in this example. This corresponds to a case when the current-force referenced read fails. The memory device sends a "1" on the retry line to indicate to the memory controller that it should retry the read command. The PRE after the first read command is represented in a dashed box to indicate that the PRE command need not be issued by the memory controller. The memory controller waits for a pre-determined time (tDelay) following the reception of the retry signal to re-issue the read command. Note that the Activate command need not be re-issued.

However, note that the memory device may begin the current-force SRR as soon as it determines that the current-force referenced read was not successful. Thus, the memory device need not wait for the memory controller to re-issue the read command. Significantly, the memory device returns the data to the memory controller within tRL from the time that the memory controller re-issued the read command. Thus, for both the read command in FIG. 23 and the re-issued read command in FIG. 24, the memory device returns the data within tRL. Therefore, the time to return valid data is deterministic, which considerably simplifies the logic for the memory controller. Hence, an embodiment of mixed current-force read of MRAM can be integrated with a DDR controller. In other words, an embodiment of mixed current-force read of MRAM can be integrated with a DDR protocol. Finally, note that after the re-issued read command, the memory controller may proceed with the next read command in a similar manner as the example of FIG. 23.

Figure 25:
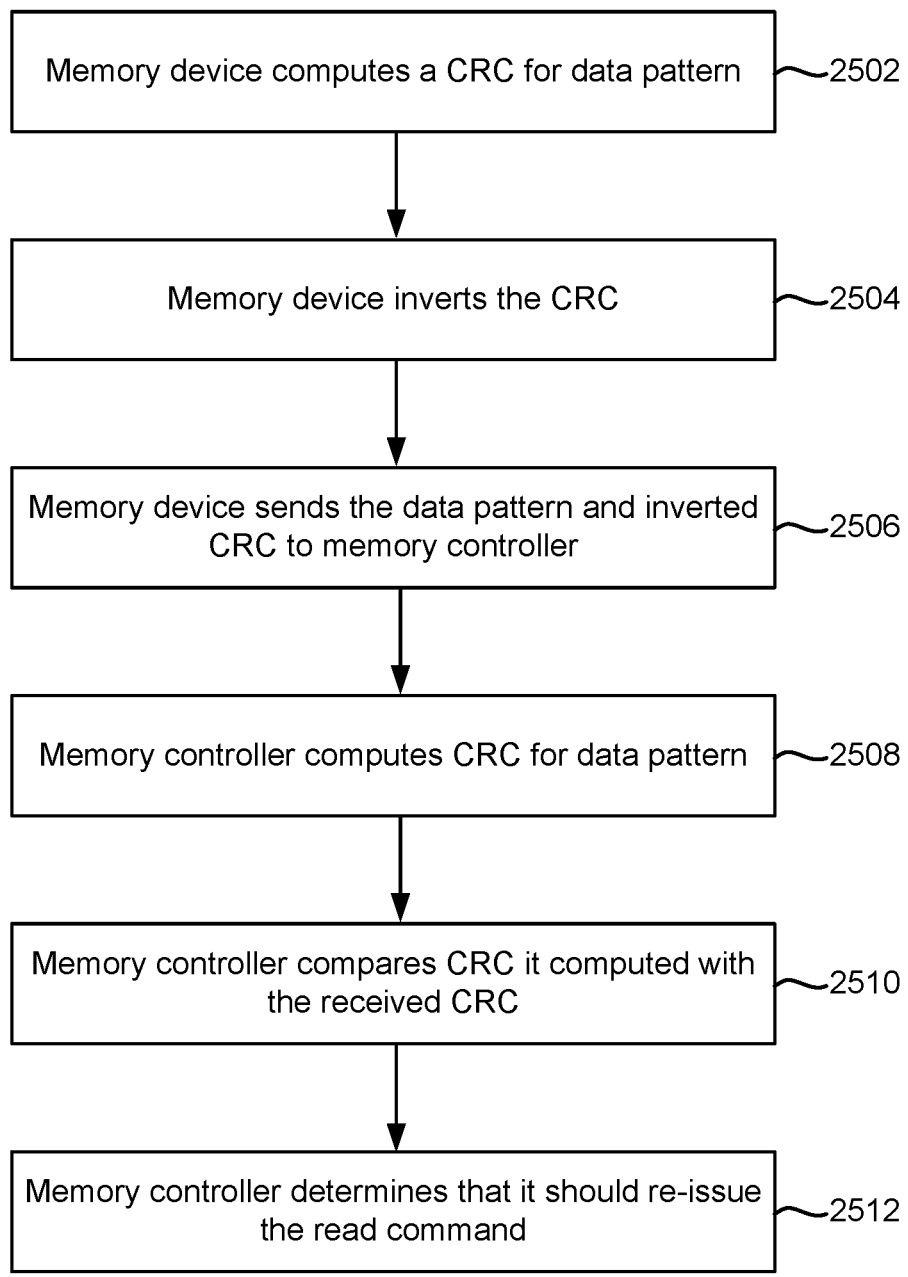
FIG. 25 is a flowchart of one embodiment of a process of communicating that a retry of a read should be performed in a mixed current-force read scheme.

FIG. 25 is a flowchart of one embodiment of a process 2500 of communicating that a retry of a read should be performed in a mixed current-force read scheme. The process is an alternative to sending a retry signal (e.g., 1 or 0), as depicted in FIGS. 23 and 24. The process 2500 is initiated in response to the memory controller determining that the current-force referenced read has failed. Step 2502 includes the memory device computing a cycle redundancy check (CRC) for a data pattern. This may be any data pattern. Step 2504 includes the memory controller inverting the CRC. Inverting the CRC means to change each 1 to a 0, and to change each 0 to a 1. Step 2506 includes the memory device sending the data pattern and the inverted CRC to the memory controller. In one embodiment, the timing diagram of FIG. 24 is modified following the first read by having the memory device send the data pattern on the DQ lines, and to send the inverted CRC instead of the retry signal of 1.

Step 2508 includes the memory controller computing the CRC for the data pattern it received. Step 2510 includes the memory controller comparing the CRC that it computed with the CRC it received from the memory device. The memory controller will determine that the CRC it computed is inverted from the CRC it received. Step 2512 thus includes the memory controller determining that it should re-issue the read command.

In view of the foregoing, it can be seen that, according to a first aspect, an apparatus, comprising a memory array comprising a plurality of non-volatile memory cells. Each memory cell comprises a resistive random access memory element and a two terminal selector element in series with the memory element. The apparatus further comprises a control circuit configured to read a group of selected memory cells using a current-force referenced read. The control circuit is configured to read the group of selected memory cells using a current-force self-referenced read in response to a condition being met for the current-force referenced read.

In a second aspect, in furtherance of the first aspect, the resistive random access memory element comprises a magnetoresistive random access memory (MRAM) element.

In a third aspect, in furtherance of the first or second aspects, the two terminal selector element comprises an Ovonic Threshold Switch (OTS).

In a fourth aspect, in furtherance of any of the first to third aspects, the memory array comprises: a plurality of first conductive lines; and a plurality of second conductive lines, each of the plurality of non-volatile memory cells are connected between one of the first conductive lines and one of the second conductive lines.

In a fifth aspect, in furtherance of any of the first to fourth aspects, the control circuit is configured to: perform a decoding algorithm on data read from the group of the selected memory cells using the current-force referenced read. The condition comprises a failure to decode data that was read from the group using the current-force referenced read.

In a sixth aspect, in furtherance of any of the first to fifth aspects, the control circuit comprises: an error correction code (ECC) engine on the same semiconductor die as the memory array. The ECC engine configured to perform the decoding algorithm on the data read from the group of the selected memory cells using the current-force referenced read.

In a seventh aspect, in furtherance of any of the first to sixth aspects, the control circuit is configured to estimate a number of bits that are in error in a codeword read from the group using the current-force referenced read without fully decoding the codeword. The condition comprises the number of bits estimated to be error being greater than a threshold.

In an eighth aspect, in furtherance of any of the first to seventh aspects, the condition is based on how many of the memory cells in the group have a resistance that falls into an uncertainty zone based on the current-force referenced read. A memory cell is in the uncertainty zone if the resistance is between a first resistance and a second resistance.

In a ninth aspect, in furtherance of the eighth aspect, the control circuit is further configured to perform a decoding algorithm on data read from the group of the selected memory cells using the current-force referenced read in response to less than the pre-determined number of memory cells being in the uncertainty zone. The control circuit returns a result from the current-force referenced read of the group in response to successfully decoding and correcting the data.

In a tenth aspect, in furtherance of either of the eighth or ninth aspects, the control circuit is further configured to return a result from the current-force referenced read of the group in response to less than the pre-determined number of memory cells being in the uncertainty zone.

In an eleventh aspect, in furtherance of any of the first to tenth aspects, the control circuit is configured to: store results from reading the group using the current-force referenced read; and use the stored results to avoid a first read of the current-force self-referenced read of the group.

In a twelfth aspect, in furtherance of any of the first to eleventh aspects, the control circuit is further configured to send, in response to the condition being met for the current-force referenced read, a retry signal to a memory controller that issued a read command for data stored in the group.

In a thirteenth aspect, in furtherance of any of the first to twelfth aspects the control circuit further includes the memory controller. The memory controller configured to re-issue the read command for the data stored in the group after waiting a pre-determined time from receiving the retry signal.

A further aspect includes a method of operating memory. The method comprises forcing a read current separately through each memory cell of a group of magnetoresistive random access memory (MRAM) cells, including forcing the read current through an MRAM element and a threshold switching selector in series. The method comprises comparing, for each respective memory cell in the group, a reference voltage to a voltage that results across the memory cell from forcing the read current through the memory cell. The method comprises determining whether a condition is met with respect to the comparisons. The method comprises in response to the condition not being met returning a read result based on the comparisons. The method comprises in response to the condition being met: performing a self-referenced read of each of the MRAM cells, including forcing a read current through the MRAM element and the threshold switching selector in series; and returning a read result based on the self-referenced read of each of the MRAM cells.

A further aspect includes a volatile or non-volatile memory system, the system comprising a cross-point memory array comprising a plurality of first conductive lines, a plurality of second conductive lines, and a plurality of non-volatile memory cells. Each respective memory cell is connected between one of the first conductive lines and one of the second conductive lines. Each memory cell comprises a magnetoresistive random access memory (MRAM) element and a threshold switching selector connected in series with the MRAM element. The system comprises a control circuit that reads a group of the memory cells using a current-force referenced read in which the control circuit forces a read current through each respective memory cell and samples a voltage that appears across each respective memory cell. The control circuit runs an error correction code (ECC) algorithm on data read from the group using the current-force referenced read. The control circuit returns decoded data in response to the ECC algorithm successfully decoding the data read from the group using the current-force referenced read. The control circuit performs a self-referenced read of each memory cells in the group in response to the ECC algorithm failing to decode the data read from the group using the current-force referenced read, including forcing a read current through each memory cell in the group. The control circuit runs an ECC algorithm on data read from the group using the self-referenced read. The control circuit returns decoded data in response to successfully decoding the data read from the group using the self-referenced read.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a memory array comprising a plurality of memory cells, each memory cell comprising a resistive random access memory element and a two terminal threshold selector element in series with the memory element; and
   a control circuit configured to:
      read a group of selected memory cells using a current-force referenced read; and
      read the group of selected memory cells using a current-force self-referenced read in response to a condition being met for the current-force referenced read.

2. The apparatus of claim 1, wherein the resistive random access memory element comprises a magnetoresistive random access memory (MRAM) element.

3. The apparatus of claim 1, wherein the two terminal threshold selector element comprises an Ovonic Threshold Switch (OTS).

4. The apparatus of claim 1, wherein the memory array comprises:
   a plurality of first conductive lines; and
   a plurality of second conductive lines, each of the plurality of memory cells are connected between one of the first conductive lines and one of the second conductive lines.

5. The apparatus of claim 1, wherein the control circuit is configured to:
   perform a decoding algorithm on data read from the group of the selected memory cells using the current-force referenced read, wherein the condition comprises a failure to decode data that was read from the group using the current-force referenced read.

6. The apparatus of claim 5, wherein the control circuit comprises:
   an error correction code (ECC) engine on the same semiconductor die as the memory array, the ECC engine configured to perform the decoding algorithm on the data read from the group of the selected memory cells using the current-force referenced read.

7. The apparatus of claim 1, wherein the control circuit is configured to:
   estimate a number of bits that are in error in a codeword read from the group using the current-force referenced read based on a syndrome of the codeword, wherein the condition comprises the number of bits estimated to be in error being greater than a threshold.

8. The apparatus of claim 1, wherein the condition is based on how many of the memory cells in the group have a resistance that falls into an uncertainty zone between a first resistance distribution and a second resistance distribution.

9. The apparatus of claim 8, wherein the control circuit is further configured to:
   return a result from the current-force self-referenced read of the group in response to a pre-determined number or more of the memory cells being in the uncertainty zone.

10. The apparatus of claim 9, wherein the control circuit is further configured to:
    perform a decoding algorithm on data read from the group of the selected memory cells using the current-force referenced read in response to less than the pre-determined number of memory cells being in the uncertainty zone; and
    return a result from the current-force referenced read of the group in response to successfully decoding and correcting the data.

11. The apparatus of claim 1, wherein the control circuit is configured to:
    store results from reading the group using the current-force referenced read;
    write the selected memory cells to a known state in the current-force self-referenced read;
    force a read current through each respective selected memory cell in the current-force self-referenced read after writing the selected memory cells to the known state; and
    compare the stored results with results of forcing the read current through the respective selected memory cells.

12. The apparatus of claim 1, wherein the control circuit is further configured to:
    send, in response to the condition being met for the current-force referenced read, a retry signal to a memory controller that issued a read command for data stored in the group.

13. The apparatus of claim 12, wherein the control circuit further includes the memory controller, the memory controller configured to re-issue the read command for the data stored in the group after waiting a pre-determined time from receiving the retry signal, the pre-determined time based on how long it will take the control circuit to perform the current-force self-referenced read; and
    the control circuit is configured to return data from reading the group using the current-force self-referenced read to the memory controller in response to the re-issued read command.

14. A method, comprising:
    forcing a first read current separately through each memory cell of a group of magnetoresistive random access memory (MRAM) cells, including forcing the first read current through an MRAM element and a threshold switching selector of each respective MRAM cell in series;
    comparing, for each respective MRAM cell in the group, a first reference voltage and a second reference voltage to a sense voltage that results across the MRAM cell from forcing the first read current through the MRAM;
    determining a number of the MRAM cells in the group that have a sense voltage between the first reference voltage and the second reference voltage;
    in response to the number being no more than allowed, returning a read result based on comparing, for each respective MRAM cell in the group, a third reference voltage to the sense voltage that results across the MRAM cell from forcing the first read current through the MRAM cell; and in response to the number being more than allowed:
performing a self-referenced read of each of the MRAM cells in the group, including forcing a second read current through the MRAM element and the threshold switching selector of each respective MRAM cell in series; and returning a read result based on the self-referenced read of each of the MRAM cells.

15. The method of claim 14, wherein returning the read result based on comparing, for each respective MRAM cell in the group, the third reference voltage to the sense voltage that results across the MRAM cell from forcing the first read current through the MRAM cells comprises:

performing a decoding algorithm on data read based on the comparing, for each respective MRAM cell in the group, the third reference voltage to the sense voltage that results across the MRAM cell from forcing the first read current through the MRAM cells.

16. A memory system, the system comprising:

a cross-point memory array comprising a plurality of first conductive lines, a plurality of second conductive lines, and a plurality of memory cells, each respective memory cell connected between one of the first conductive lines and one of the second conductive lines, wherein each memory cell comprises a magnetoresistive random access memory (MRAM) element and a threshold switching selector connected in series with the MRAM element; and a control circuit that:
reads a group of the memory cells using a current-force referenced read in which the control circuit forces a read current through each respective memory cell and samples a voltage that appears across each respective memory cell;

runs an error correction code (ECC) algorithm on data read from the group using the current-force referenced read;

returns first decoded data in response to the ECC algorithm successfully decoding the data read from the group using the current-force referenced read;

performs a self-referenced read of each memory cell in the group in response to the ECC algorithm failing to decode the data read from the group using the current-force referenced read, including forcing a read current through each memory cell in the group;

runs an ECC algorithm on data read from the group using the self-referenced read; and returns second decoded data in response to successfully decoding the data read from the group using the self-referenced read.

17. The memory system of claim 16, wherein the control circuit comprises an ECC engine that resides on the same semiconductor die as the cross-point memory array.

18. The memory system of claim 16, wherein the threshold switching selector comprises an Ovonic Threshold Switch (OTS).

* * * * *